(12) United States Patent
Tatsuoka et al.

(10) Patent No.: US 10,618,115 B2
(45) Date of Patent: Apr. 14, 2020

(54) SURFACE-COATED CUTTING TOOL AND MANUFACTURING METHOD OF THE SAME

(71) Applicant: MITSUBISHI MATERIALS CORPORATION, Tokyo (JP)

(72) Inventors: Sho Tatsuoka, Naka (JP); Kenichi Sato, Naka (JP); Kousuke Yanagisawa, Naka (JP); Shin Nishida, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 163 days.

(21) Appl. No.: 15/771,337

(22) PCT Filed: Oct. 31, 2016

(86) PCT No.: PCT/JP2016/082357
§ 371 (c)(1),
(2) Date: May 25, 2018

(87) PCT Pub. No.: WO2017/073792
PCT Pub. Date: May 4, 2017

(65) Prior Publication Data
US 2018/0311745 A1 Nov. 1, 2018

(30) Foreign Application Priority Data

Oct. 30, 2015 (JP) .................................. 2015-214521
Oct. 30, 2015 (JP) .................................. 2015-214525
Oct. 28, 2016 (JP) .................................. 2016-211413

(51) Int. Cl.
*B23B 27/14* (2006.01)
*C23C 16/36* (2006.01)
(Continued)

(52) U.S. Cl.
CPC ............ *B23B 27/148* (2013.01); *C23C 16/34* (2013.01); *C23C 16/36* (2013.01); *C23C 28/044* (2013.01);
(Continued)

(58) Field of Classification Search
USPC ........... 407/119; 51/307, 309; 428/216, 336, 428/697, 698, 699, 701, 702
See application file for complete search history.

(56) References Cited

U.S. PATENT DOCUMENTS

2010/0323176 A1 12/2010 Van Den Berg et al.
2011/0003126 A1 1/2011 Van Den Berg et al.
(Continued)

FOREIGN PATENT DOCUMENTS

CN 103212728 A 7/2013
CN 103447600 A 12/2013
(Continued)

OTHER PUBLICATIONS

European Search Report dated Mar. 18, 2019 for the corresponding European Patent Application No. 16860020.3.
(Continued)

*Primary Examiner* — Archene A Turner
(74) *Attorney, Agent, or Firm* — Leason Ellis LLP

(57) ABSTRACT

In this surface-coated cutting tool, a hard coating layer includes at least a layer of a complex nitride or complex carbonitride expressed by a composition formula: $(Cr_{1-x}Al_x)(C_yN_{1-y})$ or a layer of a complex nitride or complex carbonitride expressed by a composition formula: $(Ti_{1-\alpha-\beta}Al_\alpha Me_\beta)(C_\gamma N_{1-\gamma})$, crystal grains configuring the layer of a complex nitride or complex carbonitride having an NaCl type face-centered cubic structure are present, and predetermined average crystal grain misorientation and inclined angle frequency distribution are present in the
(Continued)

crystal grains having an NaCl type face-centered cubic structure.

8 Claims, 5 Drawing Sheets

(51) Int. Cl.
  *C23C 28/04* (2006.01)
  *C23C 30/00* (2006.01)
  *C23C 16/34* (2006.01)
(52) U.S. Cl.
  CPC ........ *C23C 30/005* (2013.01); *B23B 2228/10* (2013.01)

(56) References Cited

U.S. PATENT DOCUMENTS

| | | | |
|---|---|---|---|
| 2016/0040285 A1* | 2/2016 | Tatsuoka | C23C 16/36 407/119 |
| 2017/0165758 A1 | 6/2017 | Tatsuoka et al. | |
| 2017/0198400 A1* | 7/2017 | Tatsuoka | B23B 27/14 |

FOREIGN PATENT DOCUMENTS

| | | |
|---|---|---|
| CN | 103567735 A | 2/2014 |
| CN | 103572250 A | 2/2014 |
| CN | 104789938 A | 7/2015 |
| JP | 11-222665 A | 8/1999 |
| JP | 2006-082207 A | 3/2006 |
| JP | 2009-056539 A | 3/2009 |
| JP | 2009-090395 A | 4/2009 |
| JP | 2011-513594 A | 4/2011 |
| JP | 2011-516722 A | 5/2011 |
| JP | 2013-248674 A | 12/2013 |
| JP | 2013-248675 A | 12/2013 |
| JP | 2014-024130 A | 2/2014 |
| JP | 2014-133267 A | 7/2014 |
| JP | 2014-198362 A | 10/2014 |
| JP | 2014-208394 A | 11/2014 |
| JP | 2015-157351 A | 9/2015 |
| WO | WO-2015/163391 A1 | 10/2015 |

OTHER PUBLICATIONS

Office Action dated Mar. 5, 2019 for the corresponding Chinese Application No. 201680062771.0.

Kimura et al., "Misorientation Analysis of Plastic Deformation of Austenitic Stainless Steel by EBSD and X-Ray Diffraction Methods", *Journal of the Japan Society of Mechanical Engineers (Part A)*, (Dec. 2005), Article No. 05-0367, 2005, pp. 1722-1728 vol. 71, No. 712.

International Search Report dated Jan. 17, 2017 for the corresponding PCT International Patent Application No. PCT/JP2016/082357.

\* cited by examiner

MEASUREMENT POINT (PIXEL)(P)  BOUNDARY(B)

SURFACE-COATED CUTTING TOOL AND MANUFACTURING METHOD OF THE SAME

CROSS-REFERENCE TO RELATED PATENT APPLICATIONS

This application is a U.S. National Phase Application under 35 U.S.C. § 371 of International Patent Application No. PCT/JP2016/082357 filed on Oct. 31, 2016 and claims the benefit of Japanese Patent Applications No. 2015-214521, filed Oct. 30, 2015, No. 2015-214525, filed Oct. 30, 2015, and No. 2016-211413, filed Oct. 28, 2016, all of which are incorporated herein by reference in their entireties. The International Application was published in Japanese on May 4, 2017 as International Publication No. WO/2017/073792 under PCT Article 21(2).

FIELD OF THE INVENTION

The present invention relates to a surface-coated cutting tool (hereinafter, referred to as coated tool) in which a hard coating layer exhibits excellent chipping resistance during high-speed intermittent cutting of carbon steel, alloy steel, cast iron, or the like during which high-temperature heat is generated and impact loads are exerted on a cutting edge, and excellent wear resistance is exhibited for long-term usage.

BACKGROUND OF THE INVENTION

Hitherto, in general, coated tools in which the surfaces of tool bodies made of tungsten carbide (hereinafter, referred to as WC)-based cemented carbide, titanium carbonitride (hereinafter, referred to as TiCN)-based cermet, or a cubic boron nitride (hereinafter, referred to as cBN)-based ultra-high pressure sintered body (hereinafter, collectively referred to as a tool body) are coated with a Cr—Al-based or Ti—Al-based complex nitride layer as a hard coating layer through a physical vapor deposition method are known, and it is known that these coated tools exhibit excellent wear resistance.

However, although the coated tool coated with the Cr—Al-based or Ti—Al-based complex nitride layer in the related art has relatively excellent wear resistance, in a case of using the coated tool under high-speed intermittent cutting conditions, abnormal wear such as chipping easily occurs. Therefore, various suggestions for an improvement in the hard coating layer have been made.

For example, Japanese Unexamined Publication No. 2014-208394 discloses that, in order to improve chipping resistance and wear resistance during high-speed intermittent cutting of stainless steel or a Ti alloy, a hard coating layer formed of a lower layer, an intermediate layer, and an upper layer is provided on a surface of a tool body, the lower layer has a predetermined average layer thickness and is configured with a TiAl compound having a cubic structure formed of one layer or more layers of a $Ti_{1-X}Al_XN$ layer, a $Ti_{1-X}Al_XC$ layer, and a $Ti_{1-X}Al_XCN$ layer (X is a content ratio (atomic ratio) of Al and satisfies $0.65 \leq X \leq 0.95$), the intermediate layer has a predetermined average layer thickness and is configured with a CrAl compound having a cubic structure formed of one layer or more layers of a $Cr_{1-Y}Al_YN$ layer, a $Cr_{1-Y}Al_YC$ layer, and a $Cr_{1-Y}Al_YCN$ layer (Y is a content ratio (atomic ratio) of Al and satisfies $0.60 \leq Y \leq 0.90$), and the upper layer is configured with $Al_2O_3$ having a predetermined average layer thickness, thereby improving adhesion strength between the lower layer and the upper layer and improving chipping resistance and wear resistance.

Japanese Unexamined Publication No. 2014-198362 discloses that, in order to improve chipping resistance and wear resistance during high-speed intermittent cutting of precipitation hardening stainless steel or a heat-resistant alloy such as Inconel, a hard coating layer formed of a lower layer, an intermediate layer, and an upper layer is provided on a surface of a tool body, the lower layer is configured with a Ti compound having a cubic crystal structure formed of one layer or more layers of a $Ti_{1-X}Al_XN$ layer, a $Ti_{1-X}Al_XC$ layer, and a $Ti_{1-X}Al_XCN$ layer (X is a content ratio of Al and an atomic ratio and satisfies $0.65 \leq X \leq 0.95$) having a predetermined average layer thickness, the intermediate layer is configured with a Cr compound having a cubic structure formed of one layer or more layers of a $Cr_{1-Y}Al_YN$ layer, a $Cr_{1-Y}Al_YC$ layer, and a $Cr_{1-Y}Al_YCN$ layer (Y is a content ratio of Al and an atomic ratio and satisfies $0.60 \leq Y \leq 0.90$) having a predetermined average layer thickness, and the upper layer is configured with $Al_2O_3$ having fine holes having predetermined hole diameter and hole density and an average layer thickness, thereby improving adhesion strength between the lower layer and the upper layer, setting the upper layer as an $Al_2O_3$ layer including fine holes having predetermined hole diameter and hole density, relieving mechanical and thermal shock, and improving chipping resistance and wear resistance.

Japanese Unexamined Publication No. 2009-56539 discloses that, in order to increase fracture resistance of a hard coating layer during heavy cutting of steel or cast iron during which high loads are exerted on a cutting edge, a hard coating layer formed of a $(Al_{1-X}Cr_X)N$ (here, X is an atomic ratio and is 0.3 to 0.6) layer on a surface of a tool body, crystal orientation and a constituent atom-sharing lattice point distribution type are formed in which, in an inclined angle frequency distribution graph drawn by measuring an inclined angle formed by a normal line of a {100} plane with respect to a normal line of a polished surface as a surface of the tool body, a highest peak is present in an inclined angle section of 30 to 40 degrees, a sum of frequencies thereof is equal to or greater than 60% over all frequency, and in a constituent atom-sharing lattice point distribution graph drawn by measuring an inclined angle formed by a normal line of a {112} plane with respect to a normal line of a polished surface as a surface, a highest peak is present in Σ3, and a sum of frequencies thereof is equal to or greater than 50% over all frequency, thereby improving high-temperature strength of the $(Al_{1-X}Cr_X)N$ layer and improving fracture resistance of the hard coating layer during the heavy cutting.

Japanese Unexamined Publication No. 2006-82207 discloses a surface-coated cutting tool including a tool body and a hard coating layer formed on the body, in which the hard coating layer includes a compound configured with any one or both elements of Al and Cr, at least one kind of element selected from the group consisting of 4a, 5a, and 6a group elements of the periodic table and Si, and at least one kind of element selected from the group consisting of carbon, nitrogen, oxygen, and boron, and chlorine, thereby rapidly improving wear resistance and oxidation resistance of the hard coating layer.

Japanese Unexamined Publication No. 2011-516722, for example, discloses that by performing chemical vapor deposition in a mixed reaction gas of $TiCl_4$, $AlCl_3$, and $NH_3$ in a temperature range of 650° C. to 900° C., a $(Ti_{1-x}Al_x)N$ layer in which a value of a content ratio x of Al is 0.65 to 0.95 can be deposited. However, this literature is aimed at further coating the $(Ti_{1-x}Al_x)N$ layer with an $Al_2O_3$ layer and thus improving a heat insulation effect. Therefore, effects regarding the formation of the $(Ti_{1-x}Al_x)N$ layer in which the value of x is increased to 0.65 to 0.95 on cutting performance are not disclosed.

Japanese Unexamined Publication No. 2011-513594 suggests that the heat resistance and fatigue strength of a coated tool are improved by coating a TiCN layer and an $Al_2O_3$ layer as inner layers with a $(Ti_{1-x}Al_x)N$ layer (here, x is 0.65 to 0.9) having a cubic crystal structure or a cubic crystal structure including a hexagonal crystal structure as an outer layer by a chemical vapor deposition method, and applying a compressive stress of 100 to 1,100 MPa to the outer layer.

Technical Problem

There has been a strong demand for power saving and energy saving during cutting in recent years. In accordance with this, there is a trend toward a further high speed and efficiency during cutting. Therefore, abnormal damage resistance such as chipping resistance, fracture resistance, and peeling resistance is further required for a coated tool, and excellent wear resistance is required for long-term usage.

However, in the coated tools described in Japanese Unexamined Publications No. 2014-208394 and No. 2014-198362, although improvement of adhesion strength between the lower layer and the upper layer and improvement of chipping resistance are realized by forming a CrAl compound and a Cr compound as the intermediate layer of the hard coating layer, strength and hardness of the CrAl compound and the Cr compound are not sufficient. Accordingly, in a case where the coated tool is provided for high-speed intermittent cutting, sufficient chipping resistance and wear resistance are not obtained.

In the coated tool described in Japanese Unexamined Publication No. 2009-56539, the strength of the hard coating layer can be improved by adjusting a Cr content ratio of the hard coating layer formed of the $(Al_{1-X}Cr_X)N$ and controlling crystal orientation and a constituent atom-sharing lattice point distribution type, and as a result, chipping resistance and fracture resistance can be increased. However, the strength and hardness of the $(Al_{1-X}Cr_X)N$ layer are not sufficient. Accordingly, excellent chipping resistance and wear resistance cannot be exhibited for long-term usage, and the service life is shortened during high-speed intermittent cutting of alloy steel.

The coated tool described in Japanese Unexamined Publication No. 2006-82207 aims to improve wear resistance and oxidation resistance. However, chipping resistance is not sufficient under cutting conditions in which impacts such as high-speed intermittent cutting are exerted.

In the $(Ti_{1-x}Al_x)N$ layer deposited through the chemical vapor deposition method described in Japanese Unexamined Publication No. 2011-516722, the content ratio x of Al can be increased and a cubic structure can be formed, thereby obtaining a hard coating layer having a predetermined hardness and excellent wear resistance, but toughness thereof is deteriorated.

In the coated tool described in Japanese Unexamined Publication No. 2011-513594, although the coated tool has a predetermined hardness and excellent wear resistance, the toughness thereof is deteriorated. Therefore, in a case where the coated tool is provided for high-speed intermittent cutting of alloy steel or the like, abnormal damage such as chipping, fracture, and peeling easily occurs and satisfactory cutting performance is not exhibited.

Here, a coated tool is required in which a hard coating layer has excellent chipping resistance and excellent wear resistance during high-speed intermittent cutting of carbon steel, alloy steel, cast iron, or the like during which high-temperature heat is generated and impact loads are exerted on a cutting edge.

SUMMARY OF THE INVENTION

Means for Solving the Problems

Therefore, from the viewpoints described above, the inventors intensively studied to improve chipping resistance and wear resistance of a coated tool in which a hard coating layer containing at least a complex nitride or complex carbonitride of Cr and Al (hereinafter, sometimes referred to as "(Cr, Al)(C,N)" or "$(Cr_{1-x}Al_x)(C_yN_{1-y})$") is deposited, or a coated tool in which a hard coating layer containing at least a complex nitride or complex carbonitride of Ti and Al (hereinafter, sometimes referred to as "(Ti, Al)(C,N)" or "$(Ti_{1-\alpha}Al_\alpha)(C_\gamma N_{1-\gamma})$") is formed. As a result, the following knowledge was obtained.

That is, in a case where a $(Cr_{1-x}Al_x)(C_yN_{1-y})$ layer or a $(Ti_{1-\alpha}Al_\alpha)(C_\gamma N_{1-\gamma})$ layer is formed to have a columnar shape in a direction perpendicular to a tool body, the hard coating layer including at least one layer of a $(Cr_{1-x}Al_x)(C_yN_{1-y})$ layer and a $(Ti_{1-\alpha}Al_\alpha)(C_\gamma N_{1-\gamma})$ layer of the related art and having a predetermined average layer thickness has high wear resistance. However, as anisotropy of the $(Cr_{1-x}Al_x)(C_yN_{1-y})$ layer or the $(Ti_{1-\alpha}Al_\alpha)(C_\gamma N_{1-\gamma})$ layer increases, toughness of the $(Cr_{1-x}Al_x)(C_yN_{1-y})$ layer or the $(Ti_{1-\alpha}Al_\alpha)(C_\gamma N_{1-\gamma})$ layer is deteriorated. As a result, chipping resistance and fracture resistance are deteriorated, sufficient wear resistance cannot be exhibited for long-term usage, and satisfactory service life is not obtained.

Therefore, the inventors intensively studied regarding the $(Cr_{1-x}Al_x)(C_yN_{1-y})$ layer and the $(Ti_{1-\alpha}Al_\alpha)(C_\gamma N_{1-\gamma})$ layer configuring the hard coating layer. With a new idea whereby a $(Ti_{1-\alpha-\beta}Al_\alpha Me_\beta)(C_\gamma N_{1-\gamma})$ layer in which one kind of element selected from Si, Zr, B, V, and Cr (hereinafter, shown as "Me") is included in the $(Cr_{1-x}Al_x)(C_yN_{1-y})$ layer and the $(Ti_{1-\alpha}Al_\alpha)(C_\gamma N_{1-\gamma})$ layer, includes crystal grains having an NaCl type face-centered cubic structure (hereinafter, may be simply referred to as a "cubic structure"), and average crystal grain misorientation of the crystal grains having the cubic structure is equal to or greater than 2 degrees, the inventors have succeeded in increasing both hardness and toughness by generating strain in the crystal grains having the cubic structure, and as a result, the inventors have found new knowledge in that chipping resistance and fracture resistance of the hard coating layer can be improved.

In addition, regarding the columnar crystal grain, the inventors have found new knowledge in that wear resistance is further improved while maintaining toughness, by increasing a ratio of {100} orientation on a film surface side, compared to that on a tool body surface side.

Specifically, (1) in a case where the hard coating layer includes at least a layer of a complex nitride or complex carbonitride of Cr and Al and the layer is expressed by a composition formula: $(Cr_{1-x}Al_x)(C_yN_{1-y})$, particularly, an average content ratio $x_{avg}$ of Al in the total amount of Cr and Al and an average content ratio $y_{avg}$ of C in the total amount of C and N (here, $x_{avg}$ and $y_{avg}$ are atomic ratios) respectively satisfy $0.70 \leq x_{avg} \leq 0.95$ and $0 \leq y_{avg} \leq 0.005$. In a case where crystal grains having a cubic structure are present in the crystal grains configuring the layer of a complex nitride or complex carbonitride, crystal orientation of each crystal grain is analyzed in a vertical cross-sectional direction by using an electron beam backward scattering diffraction device, and an average crystal grain misorientation of the individual crystal grains is acquired, 20% or more crystal grain having the average crystal grain misorientation equal to or greater than 2 degrees is present with respect to the entire area of the layer of a complex nitride or complex carbonitride at an area ratio, and accordingly, a strain can be generated in the crystal grain having the cubic structure. In addition, a ratio of {100} orientation of the crystal grain on a film surface side is increased, compared to that on a tool body surface side, thereby improving wear resistance. As a result, it is found that, in a cutting tool in which such a hard coating layer is formed, wear resistance and chipping resistance are improved and excellent wear resistance is exhibited for long-term usage.

In addition, (2) in a case where the hard coating layer includes at least a layer of a complex nitride or complex carbonitride of Ti, Al, and Me (here, Me is one kind of element selected from Si, Zr, B, V, and Cr) and the layer is expressed by a composition formula: $(Ti_{1-\alpha-\beta}Al_\alpha Me_\beta)(C_\gamma N_{1-\gamma})$ layer, particularly, an average content ratio $\alpha_{avg}$ of Al in the total amount of Ti, Al, and Me, an average content ratio $\beta_{avg}$ of Me in the total amount of Ti, Al, and Me, and an average content ratio $\gamma_{avg}$ of C in the total amount of C and N (here, all of $\alpha_{avg}$, $\beta_{avg}$, and $\gamma_{avg}$ are atomic ratios) respectively satisfy $0.60 \leq \alpha_{avg}$, $0.005 \leq \beta_{avg} \leq 0.10$, $0 \leq \gamma_{avg} \leq 0.005$, and $0.605 \leq \alpha_{avg} + \beta_{avg} \leq 0.95$. In a case where crystal grains having a cubic structure are present in the crystal grains configuring the layer of a complex nitride or complex carbonitride, crystal orientation of each crystal grain is analyzed in a vertical cross-sectional direction by using an electron beam backward scattering diffraction device, and an average crystal grain misorientation of the individual crystal grains is acquired, 20% or more crystal grain having the average crystal grain misorientation equal to or greater than 2 degrees is present with respect to the entire area of the layer of a complex nitride or complex carbonitride at an area ratio, and accordingly, a strain can be generated in the crystal grain having the cubic structure. In addition, a ratio of {100} orientation of the crystal grain on a film surface side is increased, compared to that on a tool body surface side, thereby improving wear resistance while maintaining toughness. As a result, it is found that, in a cutting tool in which such a hard coating layer is formed, chipping resistance and fracture resistance are improved and excellent wear resistance is exhibited for long-term usage.

The $(Cr_{1-x}Al_x)(C_y N_{1-y})$ layer and the $(Ti_{1-\alpha-\beta}Al_\alpha Me_\beta)(C_\gamma N_{1-\gamma})$ layer having the configuration described above can be deposited by, for example, the following chemical vapor deposition method, with which a composition of a reaction gas varies periodically on the surface of the tool body.

$(Cr_{1-x}Al_x)(C_y N_{1-y})$ Layer (1)

In a chemical vapor deposition reaction apparatus used, a gas group A of $NH_3$ and $H_2$ and a gas group B of $CrCl_3$, $AlCl_3$, $Al(CH_3)_3$, $N_2$, and $H_2$ are supplied into the reaction apparatus from separate gas supply tubes, the supplying of the gas group A and the gas group B into the reaction apparatus is, for example, performed so that the gases are allowed to flow at time intervals of a predetermined cycle only for a shorter time than the cycle, the supplying of the gases of the gas group A and the gas group B has a phase difference of a time shorter than the time for which the gases are supplied, and the composition of the reaction gas on the surface of the tool body can be changed over time between the gas group A (first reaction gas), mixed gas of the gas group A and the gas group B (second reaction gas), and the gas group B (third reaction gas). In addition, in the present invention, there is no need to introduce a long-term exhaust process intended for strict gas substitution. Therefore, as a gas supply method, for example, it is possible to realize the composition of the reaction gas on the surface of the tool body being able to be changed over time between mixed gas primarily containing the gas group A (first reaction gas), mixed gas of the gas group A and the gas group B (second reaction gas), and mixed gas primarily containing the gas group B (third reaction gas), by rotating gas supply ports, rotating the tool body, or reciprocating the tool body.

The $(Cr_{1-x}Al_x)(C_y N_{1-y})$ layer having a predetermined target layer thickness is deposited on the surface of the tool body by performing a thermal CVD method for a predetermined time, for example, using the composition of the reaction gas (% by volume with respect to the total amount of the gas group A and the gas group B), as the gas group A of $NH_3$: 4.5% to 5.5% and $H_2$: 65% to 75%, and the gas group B of $AlCl_3$: 0.6% to 0.9%, $CrCl_3$: 0.2% to 0.3%, $Al(CH_3)_3$: 0% to 0.5%, $N_2$: 12.5% to 15.0%, and $H_2$: the remainder, under a reaction atmosphere pressure of 4.5 to 5.0 kPa, at a reaction atmosphere temperature of 750° C. to 900° C., and with a supply cycle of 1 to 5 seconds, a gas supply time of 0.15 to 0.25 seconds per one cycle, and a phase difference between gas supply A and gas supply B of 0.10 to 0.20 seconds.

As described above, the gas group A and the gas group B are supplied so that a difference is generated in time when the gas groups arrive at the surface of the tool body, $NH_3$: 4.5% to 5.5% is set as a nitrogen raw material gas of the gas group A, and $AlCl_3$: 0.6% to 0.9%, $CrCl_3$: 0.2% to 0.3%, and $Al(CH_3)_3$: 0% to 0.5% are set as a metal chloride raw material or a carbon raw material of the gas group B. Accordingly, unevenness of a local composition or a local strain of a crystal lattice due to introduction of dislocation or point defect is formed in the crystal grain, and it is possible to change a degree of {100} orientation of the crystal grain on the tool body surface side and the film surface side. As a result, it is found that toughness is rapidly improved while maintaining wear resistance. As a result, it is found that, particularly, fracture resistance and chipping resistance are improved, and even in a case of being used for high-speed intermittent cutting of alloy steel or the like during which intermittent and impact loads are exerted on a cutting edge, the hard coating layer can exhibit excellent cutting performance for long-term usage.

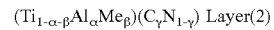

$(Ti_{1-\alpha-\beta}Al_\alpha Me_\beta)(C_\gamma N_{1-\gamma})$ Layer(2)

In a chemical vapor deposition reaction apparatus used, a gas group A of $NH_3$ and $H_2$ and a gas group B of $TiCl_4$, $Al(CH_3)_3$, $AlCl_3$, $MeCl_n$ (chloride of Me), $N_2$, and $H_2$ are supplied into the reaction apparatus from separate gas supply tubes, the supplying of the gas group A and the gas group B into the reaction apparatus is, for example, performed so that the gases are allowed to flow at time intervals of a predetermined cycle only for a shorter time than the cycle, the supplying of the gases of the gas group A and the gas group B has a phase difference of a time shorter than the time for which the gases are supplied, and the composition of the reaction gas on the surface of the tool body can be changed over time between the gas group A (first reaction gas), mixed gas of the gas group A and the gas group B (second reaction gas), and the gas group B (third reaction gas). In addition, in the present invention, there is no need to introduce a long-term exhaust process intended for strict gas substitution. Therefore, as a gas supply method, for example, it is possible to realize the composition of the reaction gas on the surface of the tool body being able to be changed over time between mixed gas primarily containing the gas group A (first reaction gas), mixed gas of the gas group A and the gas group B (second reaction gas), and mixed gas primarily containing the gas group B (third reaction gas), by rotating gas supply ports, rotating the tool body, or reciprocating the tool body.

The $(Ti_{1-\alpha-\beta}Al_\alpha Me_\beta)(C_\gamma N_{1-\gamma})$ layer having a predetermined target layer thickness is deposited on the surface of the tool body by performing a thermal CVD method for a predetermined time, for example, using the composition of the reaction gas (% by volume with respect to the total amount of the gas group A and the gas group B), as the gas group A of $NH_3$: 4.0% to 6.0% and $H_2$: 65% to 75%, and the gas group B of $AlCl_3$: 0.6% to 0.9%, $TiCl_4$: 0.2% to 0.3%, $MeCl_n$ (chloride of Me): 0.1% to 0.2%, $Al(CH_3)_3$: 0% to 0.5%, $N_2$: 12.5% to 15.0%, and $H_2$: the remainder, under a reaction atmosphere pressure of 4.5 to 5.0 kPa, at a reaction atmosphere temperature of 700° C. to 900° C., and with a supply cycle of 1 to 5 seconds, a gas supply time of 0.15 to 0.25 seconds per one cycle, and a phase difference between gas supply A and gas supply B of 0.10 to 0.20 seconds.

As described above, the gas group A and the gas group B are supplied so that a difference is generated in time when the gas groups arrive at the surface of the tool body, $NH_3$: 4.0% to 6.0% is set as a nitrogen raw material gas of the gas group A, and $AlCl_3$: 0.6% to 0.9%, $TiCl_4$: 0.2% to 0.3%, $MeCl_n$ (chloride of Me): 0.1% to 0.2%, and $Al(CH_3)_3$: 0% to 0.5% are set as a metal chloride raw material or a carbon raw material of the gas group B. Accordingly, unevenness of a local composition or a local strain of a crystal lattice due to introduction of dislocation or point defect is formed in the crystal grain, and it is possible to change a degree of {100} orientation of the crystal grain on the tool body surface side and the film surface side. As a result, it is found that toughness is rapidly improved while maintaining wear resistance. As a result, it is found that, particularly, fracture resistance and chipping resistance are improved, and even in a case of being used for high-speed intermittent cutting of alloy steel or the like during which intermittent and impact loads are exerted on a cutting edge, the hard coating layer can exhibit excellent cutting performance for long-term usage.

The present invention is made based on the above-described knowledge and has aspects shown below.

(1) A surface-coated cutting tool in which a hard coating layer is formed on a surface of a tool body made of any of tungsten carbide-based cemented carbide, titanium carbonitride-based cermet, and a cubic boron nitride-based ultrahigh pressure sintered body, in which (a) the hard coating layer includes at least a layer of a complex nitride or complex carbonitride of Cr and Al, or a layer of a complex nitride or complex carbonitride of Ti, Al, and Me (here, Me is one kind of element selected from Si, Zr, B, V, and Cr), having an average layer thickness of 2 to 20 μm, (b) the layer of a complex nitride or complex carbonitride includes at least a phase of a complex nitride or complex carbonitride having an NaCl type face-centered cubic structure, and (c) in a case where crystal orientation of each crystal grain having an NaCl type face-centered cubic structure among crystal grains configuring the layer of a complex nitride or complex carbonitride is analyzed in a vertical cross-sectional direction by using an electron beam backward scattering diffraction device, and an average crystal grain mis-orientation of the individual crystal grains is acquired, 20% or more crystal grain having the average crystal grain misorientation equal to or greater than 2 degrees is present with respect to the entire area of the layer of a complex nitride or complex carbonitride at an area ratio, (d) in a case where inclined angles formed by a normal line of a {100} plane as a crystal plane with respect to a normal line direction of the surface of the tool body of the crystal grain are respectively measured in a region on the tool body side and a region on the surface side which are obtained by dividing the layer of a complex nitride or complex carbonitride in half in a layer thickness direction, the measured inclined angles in a range of 0 to 45 degrees with respect to the normal line direction among the measured inclined angles are sectioned at a pitch of 0.25 degrees, and frequencies present in each section are added up, in a case where a ratio of the sum of frequencies present in a range of 0 to 12 degrees in the region on the tool body side with respect to over all frequency in the inclined angle frequency distribution is set as $M_{deg}$, $M_{deg}$ is 10% to 40%, and in a case where the highest peak is present in the inclined angle section in a range of 0 to 12 degrees in the region on the surface side, and a ratio of the sum of frequencies present in the range of 0 to 12 degrees with respect to over all frequency in the inclined angle frequency distribution is set as $N_{deg}$, $N_{deg}$ is $M_{deg}$+10% to $M_{deg}$+30%.

(2) The surface-coated cutting tool according to (1), in which, in a case where the layer of a complex nitride or complex carbonitride is a layer of a complex nitride or complex carbonitride of Cr and Al, and a composition of the layer is expressed by a composition formula: $(Cr_{1-x}Al_x)(C_y N_{1-y})$, an average content ratio $x_{avg}$ of Al of the layer of a complex nitride or complex carbonitride in the total amount of Cr and Al and an average content ratio $y_{avg}$ of C in the total amount of C and N (both $x_{avg}$ and $y_{avg}$ are atomic ratios) respectively satisfy $0.70 \leq x_{avg} \leq 0.95$ and $0 \leq y_{avg} \leq 0.005$.

(3) The surface-coated cutting tool according to (1), in which, in a case where the layer of a complex nitride or complex carbonitride is a layer of a complex nitride or complex carbonitride of Ti, Al, and Me (here, Me is one kind of element selected from Si, Zr, B, V, and Cr), and a composition of the layer is expressed by a composition formula: $(Ti_{1-\alpha-\beta}Al_\alpha Me_\beta)(C_\gamma N_{1-\gamma})$, an average content ratio $x_{avg}$ of Al of the layer of a complex nitride or complex carbonitride in the total amount of Ti, Al, and Me, an average content ratio $\beta_{avg}$ of Me in the total amount of Ti, Al, and Me, and an average content ratio $\gamma_{avg}$ of C in the total amount of C and N ($\alpha_{avg}$, $\beta_{avg}$, and $\gamma_{avg}$ are all atomic ratios) respectively satisfy $0.60 \leq \alpha_{avg}$, $0.005 \leq \beta_{avg} \leq 0.10$, $0 \leq \gamma_{avg} \leq 0.005$, and $0.605 \leq \alpha_{avg} + \beta_{avg} \leq 0.95$.

(4) The surface-coated cutting tool according to any one of (1) to (3), in which the layer of a complex nitride or complex carbonitride includes at least 70 area % or more of a phase of a complex nitride or complex carbonitride having an NaCl type face-centered cubic structure.

(5) The surface-coated cutting tool according to any one of (1) to (4), in which, in a case where the layer of a complex nitride or complex carbonitride is observed in a vertical cross-sectional direction of the layer, the layer has a columnar structure in which an average crystal grain width W of each crystal grain having an NaCl type face-centered cubic structure in the layer of a complex nitride or complex carbonitride is 0.1 to 2 μm, and an average aspect ratio A is 2 to 10.

(6) The surface-coated cutting tool according to any one of (1) to (5), in which, between the tool body and the layer of a complex nitride or complex carbonitride, a lower layer which is formed of a Ti compound layer that includes one layer or more layers of a Ti carbide layer, a Ti nitride layer, a Ti carbonitride layer, a Ti oxycarbides layer, and a Ti oxycarbonitride layer, and has an average total layer thickness of 0.1 to 20 μm is present.

(7) The surface-coated cutting tool according to any one of (1) to (6), in which an upper layer which includes at least an aluminum oxide layer and has an average total layer thickness of 1 to 25 μm is formed on an upper portion of the layer of a complex nitride or complex carbonitride.

(8) A manufacturing method of the surface-coated cutting tool according to any one of (1) to (7), in which the layer of a complex nitride or complex carbonitride is deposited by a chemical vapor deposition method including at least trimethylaluminum as a reaction gas component.

The "average crystal grain misorientation" means a grain orientation spread (GOS) value which will be described later.

Effects of the Invention

In the surface-coated cutting tool according to the aspect of the present invention (hereinafter, referred to as the "surface-coated cutting tool of the invention" or the "cutting tool of the invention") in which the hard coating layer is provided on the surface of the tool body, in a case where the hard coating layer includes at least the layer of a complex nitride or complex carbonitride of Cr and Al having an average layer thickness of 2 to 20 μm, and the layer is expressed by a composition formula: $(Cr_{1-x}Al_x)(C_yN_{1-y})$, by particularly allowing the average content ratio $x_{avg}$ of Al in the total amount of Cr and Al and the average content ratio $y_{avg}$ of C in the total amount of C and N (both $x_{avg}$ and $y_{avg}$ are atomic ratios) to respectively satisfy $0.70 \leq x_{avg} \leq 0.95$ and $0 \leq y_{avg} \leq 0.005$, in a case where crystal grains having a cubic structure are present in the crystal grains configuring the layer of a complex nitride or complex carbonitride, crystal orientation of each crystal grain is analyzed in a vertical cross-sectional direction by using an electron beam backward scattering diffraction device, and an average crystal grain misorientation of the individual crystal grains is acquired, by allowing 20% or more crystal grain having the average crystal grain misorientation equal to or greater than 2 degrees to be present with respect to the entire layer of a complex nitride or complex carbonitride at an area ratio, in a case where inclined angles formed by a normal line of a {100} plane as a crystal plane with respect to a normal line direction of the surface of the tool body of the crystal grain are respectively measured in a region on the tool body side and a region on the surface side which are obtained by dividing the layer of a complex nitride or complex carbonitride in half in a layer thickness direction, the measured inclined angles in a range of 0 to 45 degrees with respect to the normal line direction among the measured inclined angles are sectioned at a pitch of 0.25 degrees, and frequencies present in each section are added up, a) in a case where a ratio of the sum of frequencies present in a range of 0 to 12 degrees in the region on the tool body side with respect to over all frequency in the inclined angle frequency distribution is set as $M_{deg}$, by setting $M_{deg}$ to be 10% to 40%, b) in a case where the highest peak is present in the inclined angle section in a range of 0 to 12 degrees in the region on the surface side, and a ratio of the sum of frequencies present in the range of 0 to 12 degrees with respect to over all frequency in the inclined angle frequency distribution is set as $N_{deg}$, by setting $N_{deg}$ to be $M_{deg}$+10% to $M_{deg}$+30%, and in a case where the layer of a complex nitride or complex carbonitride is observed from a film section direction, by allowing the layer to have a columnar structure in which an average crystal grain width W of each crystal grain having a cubic structure in the layer of a complex nitride or complex carbonitride to be 0.1 to 2 μm and an average aspect ratio A to be 2 to 10, a strain is generated in the crystal grains having the cubic structure, and thus, hardness and toughness of the crystal grains are improved. As a result, an effect of improving chipping resistance without damaging wear resistance is exhibited, and excellent cutting performance is exhibited for long-term usage and long service life of the coated tool is achieved, compared to a case where a hard coating layer of the related art is used.

In addition, in the surface-coated cutting tool in which the hard coating layer is provided on the surface of the tool body, in a case where the hard coating layer includes at least the layer of a complex nitride or complex carbonitride of Ti, Al, and Me having an average layer thickness of 1 to 20 μm, preferably 2 to 20 μm, and the layer is expressed by a composition formula: $(Ti_{1-\alpha-\beta}Al_{\alpha}Me_{\beta})(C_{\gamma}N_{1-\gamma})$, by particularly allowing the average content ratio $\alpha_{avg}$ of Al of the layer of a complex nitride or complex carbonitride in the total amount of Ti, Al, and Me, an average content ratio $\beta_{avg}$ of Me in the total amount of Ti, Al, and Me, and an average content ratio $\gamma_{avg}$ of C in the total amount of C and N ($\alpha_{avg}$, $\beta_{avg}$, and $\gamma_{avg}$ are all atomic ratios) to respectively satisfy $0.60 \leq \alpha_{avg}$, $0.005 \leq \beta_{avg} \leq 0.10$, $0 \leq \gamma_{avg} \leq 0.005$, and $0.605 \leq \alpha_{avg}+\beta_{avg} \leq 0.95$, in a case where crystal grains having a cubic structure are present in the crystal grains configuring the layer of a complex nitride or complex carbonitride, crystal orientation of each crystal grain is analyzed in a vertical cross-sectional direction by using an electron beam backward scattering diffraction device, and an average crystal grain misorientation of the individual crystal grains is acquired, by allowing 20% or more crystal grain having the average crystal grain misorientation equal to or greater than 2 degrees to be present with respect to the entire layer of a complex nitride or complex carbonitride at an area ratio, in a case where inclined angles formed by a normal line of a {100} plane as a crystal plane with respect to a normal line direction of the surface of the tool body of the crystal grain are respectively measured in a region on the tool body side and a region on the surface side which are obtained by dividing the layer of a complex nitride or complex carbonitride in half in a layer thickness direction, the measured inclined angles in a range of 0 to 45 degrees with respect to the normal line direction among the measured inclined angles are sectioned at a pitch of 0.25 degrees, and frequencies present in each section are added up, a) in a case where a ratio of the sum of frequencies present in a range of 0 to 12 degrees in the region on the tool body side with respect to over all frequency in the inclined angle frequency distribution is set as $M_{deg}$, by setting $M_{deg}$ to be 10% to 40%, b) in a case where the highest peak is present in the inclined angle section in a range of 0 to 12 degrees in the region on the surface side, and a ratio of the sum of frequencies present in the range of 0 to 12 degrees with respect to over all frequency in the inclined angle frequency distribution is set as $N_{deg}$, by setting $N_{deg}$ to be $M_{deg}$+10% to $M_{deg}$+30%, and in a case where the layer of a complex nitride or complex carbonitride is observed from a film section direction, by allowing the layer to have a columnar structure in which an average crystal grain width W of each crystal grain having a cubic structure in the layer of a complex nitride or complex carbonitride to be 0.1 to 2 μm and an average aspect ratio A to be 2 to 10, a strain is generated in the crystal grains having the cubic structure, and thus, hardness and toughness of the crystal grains are improved. As a result, an effect of improving chipping resistance without damaging wear resistance is exhibited, and excellent cutting performance is exhibited for long-term usage and long service life of the coated tool is achieved, compared to a case where a hard coating layer of the related art is used.

DETAILED DESCRIPTION OF THE INVENTION

Figure 1:
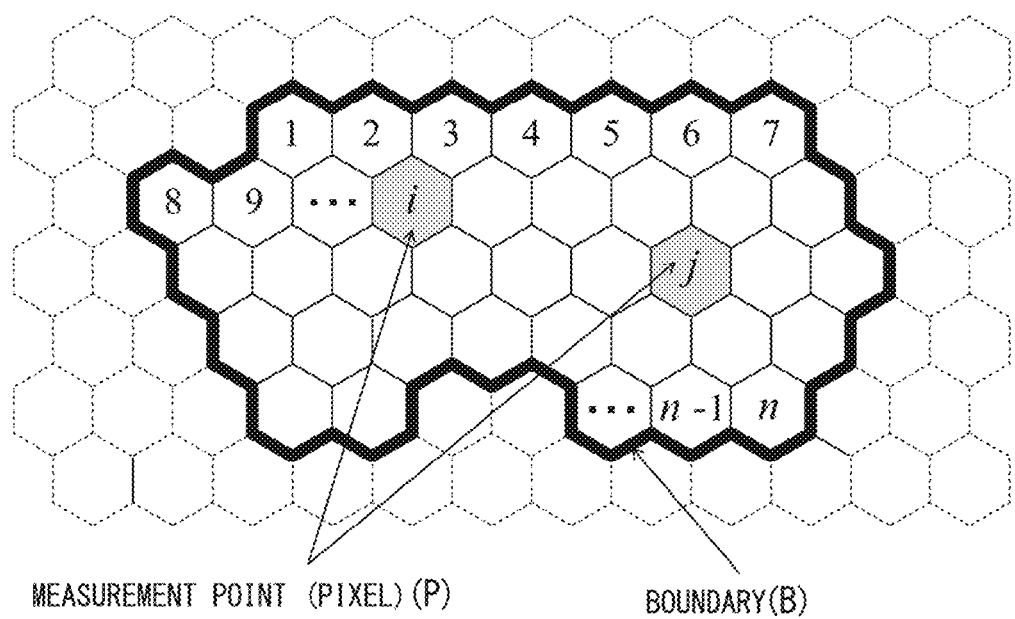
FIG. 1 shows a schematic explanatory diagram of a measurement method of average crystal grain misorientation of a crystal grain of a layer of a complex nitride or complex carbonitride of Cr and Al or a layer of a complex nitride or complex carbonitride of Ti, Al, and Me of a present invention coated tool, having a NaCl type face-centered cubic structure (cubic).

Aspects for realizing the present invention will be described below.

Average Layer Thickness of Layer of Complex Nitride or Complex Carbonitride Configuring Hard Coating Layer:

The hard coating layer included in the surface-coated cutting tool of the present invention includes at least the layer of a complex nitride or complex carbonitride of Cr and Al, which is formed through chemical vapor deposition and is expressed by a composition formula: $(Cr_{1-x}Al_x)(C_yN_{1-y})$, or the layer of a complex nitride or complex carbonitride of Ti, Al, and Me, which is formed through chemical vapor deposition and is expressed by a composition formula: $(Ti_{1-\alpha-\beta}Al_\alpha Me_\gamma)(C_\gamma N_{1-\gamma})$.

The layer of a complex nitride or complex carbonitride of Cr and Al and layer of a complex nitride or complex carbonitride of Ti, Al, and Me have high-temperature hardness and excellent wear resistance, and the effect thereof is significantly exhibited particularly in a case where the average layer thickness thereof is 2 to 20 μm. The reason for this is that, in a case where the average layer thickness of the layer of a complex nitride or complex carbonitride of Cr and Al is smaller than 2 μm and the average layer thickness of the layer of a complex nitride or complex carbonitride of Ti, Al, and Me is smaller than 1 μm, the layer thickness thereof is too small to sufficiently ensure wear resistance for long-term usage, and in a case where the average layer thickness thereof is greater than 20 μm, the crystal grains of the layer of a complex nitride or complex carbonitride of Cr and Al are likely to coarsen and chipping easily occurs. Therefore, the average layer thickness thereof was selected to be 2 to 20 μm.

Composition of Layer of Complex Nitride or Complex Carbonitride Configuring Hard Coating Layer:

(1) In a case where the layer of a complex nitride or complex carbonitride of Cr and Al of the present invention is expressed by a composition formula: $(Cr_{1-x}Al_x)(C_yN_{1-y})$, it is preferable that an average content ratio $x_{avg}$ of Al in the total amount of Cr and Al and an average content ratio $y_{avg}$ of C in the total amount of C and N (both $x_{avg}$ and $y_{avg}$ are atomic ratios) be controlled to respectively satisfy $0.70 \le x_{avg} \le 0.95$ and $0 \le y_{avg} \le 0.005$.

The reason for this is that, in a case where the average content ratio $x_{avg}$ of Al is smaller than 0.70, the high-temperature hardness and the oxidation resistance of the layer of a complex nitride or complex carbonitride of Cr and Al deteriorates. Therefore, in a case where the layer is provided for high-speed intermittent cutting of alloy steel or the like, the wear resistance thereof is insufficient. On the other hand, in a case where the average content ratio $x_{avg}$ of Al is greater than 0.95, the content ratio of Cr is relatively reduced, resulting in embrittlement and a reduction in chipping resistance. Therefore, the average content ratio $x_{avg}$ of Al was selected to be $0.70 \leq x_{avg} \leq 0.95$.

In a case where the content ratio (atomic ratio) $y_{avg}$ of the component C included in the layer of a complex nitride or complex carbonitride is a small amount in a range of $0 \leq y_{avg} \leq 0.005$, adhesiveness between the layer of a complex nitride or complex carbonitride and the tool body or a lower layer is improved and lubricity thereof is improved. Thus, an impact during cutting is relieved, resulting in an improvement in the fracture resistance and chipping resistance of the layer of a complex nitride or complex carbonitride. On the other hand, in a case where the average content ratio $y_{avg}$ of the component C is beyond the range of $0 \leq y_{avg} \leq 0.005$, toughness of the layer of a complex nitride or complex carbonitride decreases. Accordingly, fracture resistance and chipping resistance in contrast decrease, which is not preferable. Therefore, the average content ratio $y_{avg}$ of the component C was selected to be $0 \leq y_{avg} \leq 0.005$.

(2) In a case where the layer of a complex nitride or complex carbonitride of Ti, Al, and Me of the present invention is expressed by a composition formula: $(Ti_{1-\alpha-\beta}Al_{\alpha}Me_{\beta})(C_{\gamma}N_{1-\gamma})$ (here, Me is one kind of element selected from Si, Zr, B, V, and Cr), it is preferable that an average content ratio $\alpha_{avg}$ of Al in the total amount of Ti, Al, and Me, an average content ratio $\beta_{avg}$ of Me in the total amount of Ti, Al, and Me, and an average content ratio $\gamma_{avg}$ of C in the total amount of C and N (here, all of $\alpha_{avg}$, $\beta_{avg}$, and $\gamma_{avg}$ are atomic ratios) be controlled to respectively satisfy $0.60 \leq \alpha_{avg}$, $0.005 \beta \leq \beta_{avg} \leq 0.10$, $0 \leq \gamma_{avg} \leq 0.005$, and $0.605 \leq \alpha_{avg} + \beta_{avg} \leq 0.95$.

The reason for this is that, in a case where the average content ratio $\alpha_{avg}$ of Al is smaller than 0.60, hardness of the layer of a complex nitride or complex carbonitride of Ti, Al, and Me deteriorates. Therefore, in a case where the layer is provided for high-speed intermittent cutting of alloy steel or the like, the wear resistance thereof is insufficient.

In a case where the average content ratio $\beta_{avg}$ of Me is smaller than 0.005, the hardness of the layer of a complex nitride or complex carbonitride of Ti, Al, and Me deteriorates. Therefore, in a case where the layer is provided for high-speed intermittent cutting of alloy steel or the like, the wear resistance thereof is insufficient. On the other hand, in a case where the average content ratio $\beta_{avg}$ is greater than 0.10, toughness of the layer of a complex nitride or complex carbonitride of Ti, Al, and Me deteriorates due to segregation of Me to a boundary. Therefore, in a case where the layer is provided for high-speed intermittent cutting of alloy steel or the like, the chipping resistance thereof is insufficient. Thus, the average content ratio $\beta_{avg}$ of Me was selected to be $0.005 \leq \beta_{avg} \leq 0.10$.

In a case where the sum $\alpha_{avg} + \beta_{avg}$ of the average content ratio $\alpha_{avg}$ of Al and the average content ratio $\beta_{avg}$ of Me is smaller than 0.605, hardness of the layer of a complex nitride or complex carbonitride of Cr and Al deteriorates. Therefore, in a case where the layer is provided for high-speed intermittent cutting of alloy steel or the like, the wear resistance thereof is insufficient. In a case where the sum thereof is greater than 0.95, the content ratio of Ti is relatively reduced, resulting in embrittlement and a reduction in chipping resistance. Therefore, the sum $\alpha_{avg} + \beta_{avg}$ of the average content ratio $\alpha_{avg}$ of Al and the average content ratio $\beta_{avg}$ of Me was selected to be $0.605 \leq \alpha_{avg} + \beta_{avg} \leq 0.95$.

Here, as a specific component of Me, one kind of element selected from Si, Zr, B, V, and Cr is used.

In a case where a Si component or a B component is used as Me so that the $\beta_{avg}$ becomes equal to or greater than 0.005, the hardness of the layer of a complex nitride or complex carbonitride is improved, thereby improving the wear resistance. A Z component has an action of reinforcing a crystal boundary or a V component improves toughness, thereby further improving the chipping resistance. A Cr component improves oxidation resistance, thereby expecting a longer life service than the life service of the tool. However, regarding any component, in a case where the average content ratio $\beta_{avg}$ is greater than 0.10, the average content ratios of the Al component and the Ti component are relatively decreased, thereby tending to reduction of the wear resistance or the chipping resistance. Therefore, it is necessary to avoid the average content ratio $\beta_{avg}$ exceeding 0.10.

In addition, in a case where the average content ratio (atomic ratio) $\gamma_{avg}$ of C included in the layer of a complex nitride or complex carbonitride is a small amount in a range of $0 \leq \gamma_{avg} \leq 0.005$, adhesiveness between the layer of a complex nitride or complex carbonitride and the tool body or the lower layer is improved and lubricity thereof is improved. Thus, an impact during cutting is relieved, resulting in an improvement in the fracture resistance and chipping resistance of the layer of a complex nitride or complex carbonitride. On the other hand, in a case where the average content ratio $y_{avg}$ of C is beyond the range of $0 \leq \gamma_{avg} \leq 0.005$, toughness of the layer of a complex nitride or complex carbonitride decreases. Accordingly, fracture resistance and chipping resistance in contrast decrease, which is not preferable. Therefore, the average content ratio $\gamma_{avg}$ of C was selected to be $0 \leq \gamma_{avg} \leq 0.005$.

Average Crystal Grain Misorientation (GOS value) of Individual Crystal Grains Having NaCl type Face-Centered Cubic Structure Configuring Layer of Complex Nitride or Complex Carbonitride:

In the present invention, the average crystal grain misorientation of the cubic crystal grains of a complex nitride or complex carbonitride of Cr and Al, and average crystal grain misorientation of the cubic crystal grains of a complex nitride or complex carbonitride of Ti, Al, and Me are obtained by using an electron beam backward scattering diffraction device.

Specifically, in a case where a polished surface as a surface in a direction perpendicular to the surface of the layer of a complex nitride or complex carbonitride is analyzed at an interval of 0.1 μm, as shown in FIG. 1, and misorientation equal to or greater than 5 degrees is present between adjacent measurement points P (hereinafter, also referred to as "pixels"), this point is defined as a boundary B. A region surrounded by the boundary B is defined as one crystal grain. Here, a pixel P individually present and having misorientation equal to or greater than 5 degrees with all of the adjacent pixels P is not set as a crystal grain, and two or more pixels connected to each other are set as a crystal grain.

The misorientation between the pixel P in the crystal grain having a cubic structure and all of the other pixels in the same crystal grain is calculated, this is acquired as the average crystal grain misorientation, and the averaged misorientation is defined as a crystal grain orientation spread (GOS) value. FIG. 1 shows a schematic view. The GOS value is, for example, described in "Transactions of The Japan Society of Mechanical Engines (Series A) vol. 71, No. 712 (December 2005) Report No. 05-0367 pp. 1722-1728".

The "average crystal grain misorientation" of the present invention means the GOS value. In a case where the GOS value is expressed by a numerical formula, the pixel number in the same crystal grain is set as n, the numbers for each of different pixels P in the same crystal grain are set as i and j (here, 1≤i, j≤n), and crystal misorientation acquired from crystal orientation in the pixel i and crystal orientation in the pixel j is set as $\alpha_{ij}$ (i≠j), the GOS value can be expressed by the following expression.

The average crystal grain misorientation which is the GOS value can be referred to as an averaged numerical value of a value obtained by acquiring misorientation between the pixel in the crystal grain and all of the other pixels in the same crystal grain, and this value becomes a great numerical value, in a case where a continuous orientation change is great in the crystal grain.

$$GOS = \frac{\sum_{i,j=1}^{n} \alpha_{ij(i \neq j)}}{n(n-1)}$$ [Expression 1]

The average crystal grain misorientation (GOS value) can be acquired by performing measurement regarding the polished surface as a surface in a direction perpendicular to the surface of the layer of a complex nitride or complex carbonitride of Cr and Al or the layer of a complex nitride or complex carbonitride of Ti, Al, and Me in a measurement range of 25×25 μm at an interval of 0.1 μm/step in 5 visual fields, by using an electron beam backward scattering diffraction device, acquiring the number of all pixels belonging to the crystal grain having a cubic structure configuring the layer of a complex nitride or complex carbonitride, dividing the average crystal grain misorientation at an interval of 1 degree, adding up the number of pixels P of the crystal grain having the average crystal grain misorientation in the range of this value, dividing the number thereof by the number of all pixels, and creating a histogram showing the area ratio of the average crystal grain misorientation.

FIGS. 3 to 6 show examples of the histogram created as described above.

Figure 3:
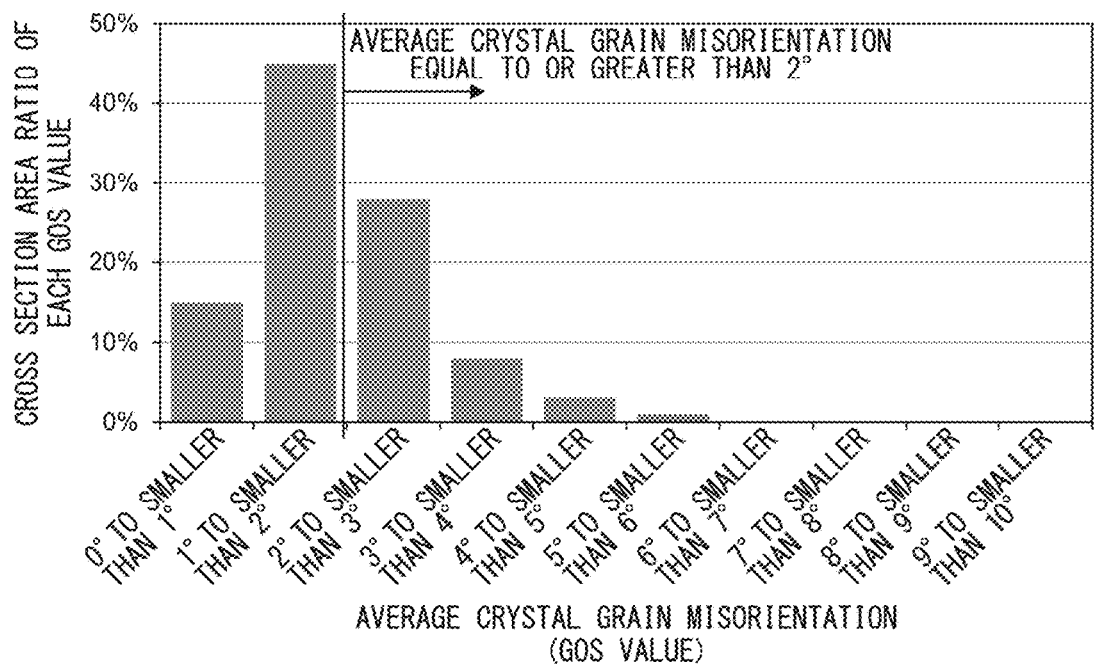
FIG. 3 shows an example of a histogram of an area ratio of average crystal grain misorientation (GOS value) of the individual crystal grains having a NaCl type cubic structure, in a cross section of the layer of a complex nitride or complex carbonitride of Cr and Al configuring the hard coating layer of the present invention coated tool. A dotted line in a vertical direction in the histogram shows a boundary line of the average crystal grain misorientation of 2°, and a bar on the right side of the drawing with respect to this dotted line in the vertical direction shows the average crystal grain misorientation equal to or greater than 2°. Hereinafter, the same applies to FIGS. 4 to 6.

FIG. 3 is an example of a histogram of the average crystal grain misorientation obtained regarding the crystal grain having a cubic structure of the layer of a complex nitride or complex carbonitride of Cr and Al of the cutting tool of the present invention, and as shown in FIG. 3, it is found that the area ratio of the crystal grain having a value of the average crystal grain misorientation (GOS) equal to or greater than 2 degrees occupying a total area of the layer of a complex nitride or complex carbonitride of Cr and Al is equal to or greater than 20%.

Figure 4:
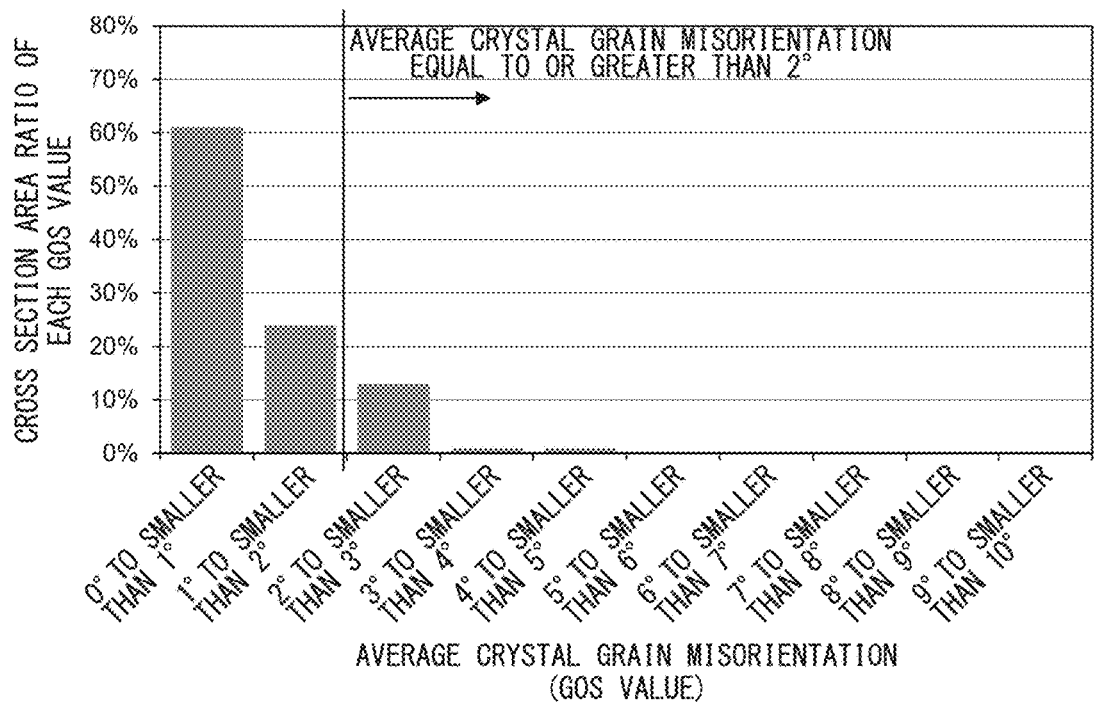
FIG. 4 shows an example of a histogram of an area ratio of average crystal grain misorientation (GOS value) of the individual crystal grains having a NaCl type cubic structure, in a cross section of the layer of a complex nitride or complex carbonitride of Cr and Al configuring the hard coating layer of a comparative example coated tool.

With respect to this, FIG. 4 is an example of a histogram of the average crystal grain misorientation obtained regarding the crystal grain having a cubic structure of the layer of a complex nitride or complex carbonitride of Cr and Al of the comparative tool, and in FIG. 4, it is found that the area ratio of the crystal grain having a value of the average crystal grain misorientation (GOS) equal to or greater than 2 degrees occupying a total area of the layer of a complex nitride or complex carbonitride of Cr and Al is smaller than 20%.

Figure 5:
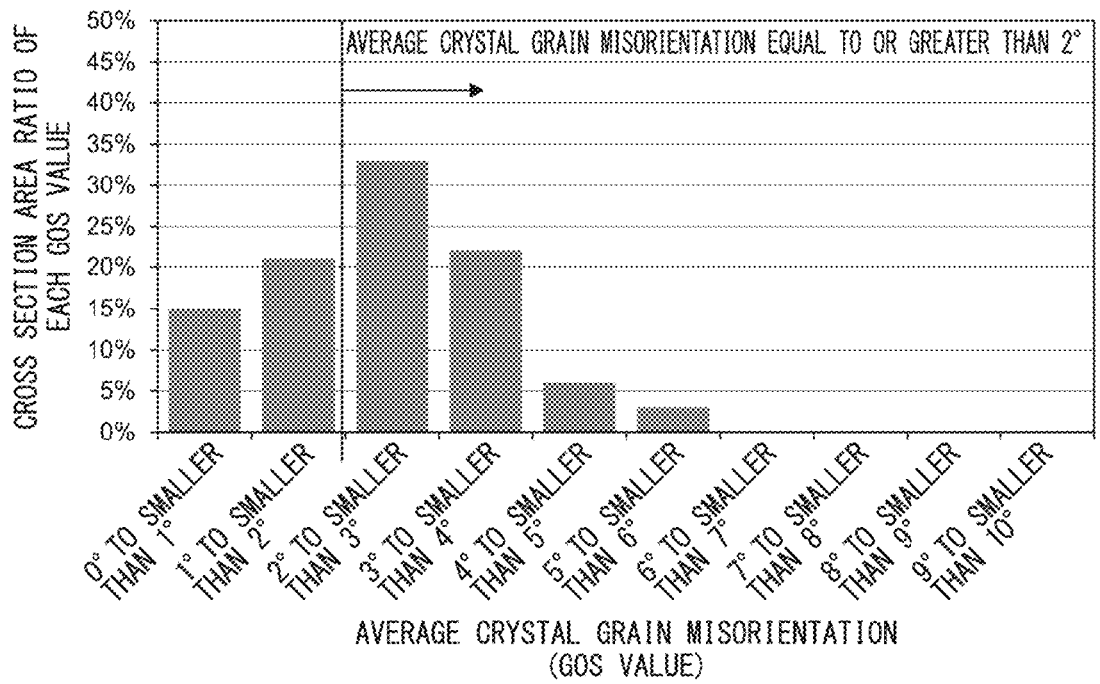
FIG. 5 shows an example of a histogram of an area ratio of average crystal grain misorientation (GOS value) of the individual crystal grains having a NaCl type cubic structure, in a cross section of the layer of a complex nitride or complex carbonitride of Ti, Al, and Me configuring the hard coating layer of the present invention coated tool.

In addition, FIG. 5 is an example of a histogram of the average crystal grain misorientation obtained regarding the crystal grain having a cubic structure of the layer of a complex nitride or complex carbonitride of Ti, Al, and Me of the cutting tool of the present invention, and as shown in FIG. 5, it is found that the area ratio of the crystal grain having a value of the average crystal grain misorientation (GOS) equal to or greater than 2 degrees occupying a total area of the layer of a complex nitride or complex carbonitride of Ti, Al, and Me is equal to or greater than 20%.

Figure 6:
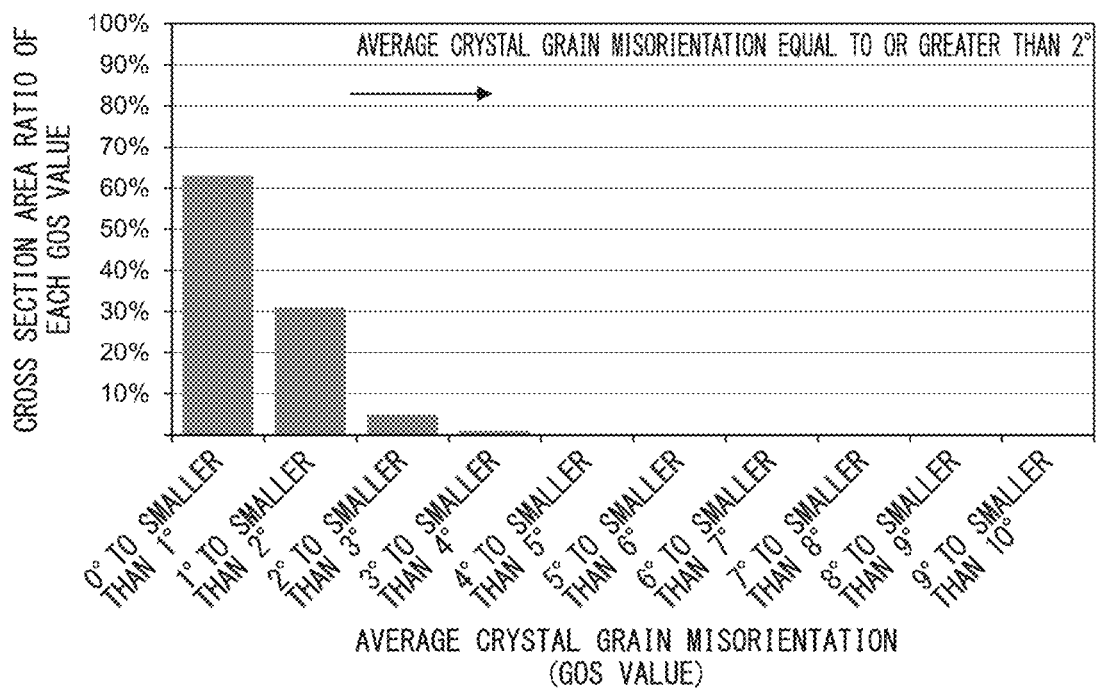
FIG. 6 shows an example of a histogram of an area ratio of average crystal grain misorientation (GOS value) of the individual crystal grains having a NaCl type cubic structure, in a cross section of the layer of a complex nitride or complex carbonitride of Ti, Al, and Me configuring the hard coating layer of the comparative example coated tool.

With respect to this, FIG. 6 is an example of a histogram of the average crystal grain misorientation obtained regarding the crystal grain having a cubic structure of the layer of a complex nitride or complex carbonitride of Ti, Al, and Me of the comparative tool, and in FIG. 6, it is found that the area ratio of the crystal grain having a value of the average crystal grain misorientation (GOS) equal to or greater than 2 degrees occupying a total area of the layer of a complex nitride or complex carbonitride of Ti, Al, and Me is smaller than 20%.

As described above, the crystal grain having a cubic structure configuring the layer of a complex nitride or complex carbonitride of Cr and Al and the layer of a complex nitride or complex carbonitride of Ti, Al, and Me of the cutting tool according to the present invention has a great variation in crystal orientation in the crystal grain, compared to the crystal grain of the related art. Accordingly, an increase in stress in the crystal grain contributes to the improvement of hardness and toughness.

The coated tool in which the hard coating layer including at least the $(Cr_{1-x}Al_x)(C_yN_{1-y})$ layer or the $(Ti_{1-\alpha-\beta}Al_\alpha Me_\beta)(C_\gamma N_{1-\gamma})$ layer having the average crystal grain misorientation is coated on the surface of the tool body exhibits excellent chipping resistance and wear resistance during high-speed intermittent cutting of alloy steel or the like during which high-temperature heat is generated and impact loads are exerted on a cutting edge.

However, in a case where the area ratio of the crystal grain having the average crystal grain misorientation equal to or greater than 2 degrees occupying the total area of the layer of a complex nitride or complex carbonitride of Cr and Al or the layer of a complex nitride or complex carbonitride of Ti, Al, and Me is less than 20%, the effect of improvement of hardness and toughness due to internal strain of the crystal grain is not sufficient. Therefore, the area ratio of the crystal grain having a cubic structure having the average crystal grain misorientation equal to or greater than 2 degrees occupying the total area of the layer of a complex nitride or complex carbonitride of Ti, Al, and Me is equal to or greater than 20%.

As described above, the crystal grain configuring the layer of a complex nitride or complex carbonitride of Al, Ti, and Me included in the surface-coated cutting tool of the present invention has a great variation in crystal orientation in the crystal grain, compared to the crystal grain configuring a TiAlN layer of the related art, that is, a strain is generated. Accordingly this contributes to the improvement of hardness or toughness.

The area ratio of the crystal grain having the average crystal grain misorientation equal to or greater than 2 degrees with respect to the area of the layer of a complex nitride or complex carbonitride is preferably 30% to 60%. The area ratio of the crystal grain having the average crystal grain misorientation equal to or greater than 2 degrees with respect to the area of the layer of a complex nitride or complex carbonitride is more preferably 35% to 55%. The area ratio of the crystal grain having the average crystal grain misorientation equal to or greater than 2 degrees with respect to the area of the layer of a complex nitride or complex carbonitride is even more preferably 40% to 50%.

Crystal Orientation in Region on Tool Body Side and Region on Surface Side Obtained by Dividing Layer of Complex Nitride or Complex Carbonitride in Half in Layer Thickness Direction:

The crystal grains configuring the layer of a complex nitride or complex carbonitride on the surface side are oriented in the normal line direction of the surface of the tool body, that is, the {100} plane, compared to those on the tool body surface (tool body) side, and thus, a special effect of improvement of the wear resistance while maintaining toughness is exhibited.

However, in a case where a rate of increase of a {100} plane orientation degree on the surface side is less than 10% with respect to that on the tool body side, the rate of increase of the {100} plane orientation degree is small, and thus, the effect of improvement of the wear resistance while maintaining toughness, which is expected in the present invention, is not sufficiently exhibited. On the other hand, in a case where the rate thereof is greater than 30%, epitaxial growth of the crystal is disturbed due to a rapid change of the orientation, and toughness deteriorates. In addition, it is found that, in a case where the {100} plane orientation degree on the tool body side is less than 10%, the rate of increase of the {100} plane orientation degree on the surface side is greater than 30%, and in a case where the {100} plane orientation degree on the tool body side is greater than 40%, the rate of increase of the {100} plane orientation degree on the surface side is less than 10%. Accordingly, in a case where inclined angles formed by a normal line of a {100} plane as a crystal plane with respect to a normal line direction of the surface of the tool body of the crystal grain are respectively measured in a region on the tool body side and a region on the surface side which are obtained by dividing the layer of a complex nitride or complex carbonitride in half in a layer thickness direction, the measured inclined angles in a range of 0 to 45 degrees with respect to the normal line direction among the measured inclined angles are sectioned at a pitch of 0.25 degrees, and frequencies present in each section are added up, a) in a case where a ratio of the sum of frequencies present in a range of 0 to 12 degrees in the region on the tool body side with respect to over all frequency in the inclined angle frequency distribution is set as $M_{deg}$, $M_{deg}$ is 10% to 40%, and b) in a case where the highest peak is present in the inclined angle section in a range of 0 to 12 degrees in the region on the surface side, and a ratio of the sum of frequencies present in the range of 0 to 12 degrees with respect to over all frequency in the inclined angle frequency distribution is set as $N_{deg}$, $N_{deg}$ is $M_{deg}+10\%$ to $M_{deg}+30\%$.

Crystal Structure of Hard Coating Layer:

In a case where the hard coating layer has a cubic structure single phase, particularly excellent wear resistance is exhibited. In addition, even in a case where the coating layer does not have a cubic structure single phase, the hard coating layer is analyzed in a vertical cross-sectional direction at an interval of 0.1 μm by using an electron beam backward scattering diffraction device, the measurement in a measurement range of a width of 10 μm and a height of a film thickness in the vertical cross-sectional direction is performed in 5 visual fields, the number of all pixels belonging to the crystal grain having a cubic structure configuring the layer of a complex nitride or complex carbonitride is acquired, the area ratio of the crystal grain having a cubic structure configuring the layer of a complex nitride or complex carbonitride is obtained by the ratio with respect to the number of all pixels in the measurement with respect to the hard coating layer in the 5 visual fields, and the area ratio of the crystal grains having a cubic structure is less than 70%, a tendency of a deterioration of wear resistance is observed. On the other hand, in a case where this area ratio is equal to or greater than 70%, excellent chipping resistance and wear resistance are exhibited. Therefore, it is desirable that the amount of phases of the layer of a complex nitride or complex carbonitride of Ti, Al, and Me having a cubic structure be equal to or greater than 70 area %.

Average Crystal Grain Width W and Average Aspect Ratio A of Individual Crystal Grains Having Cubic Structure in Layer of Complex Nitride or Complex Carbonitride:

By configuring a columnar structure in which the an average crystal grain width W of each crystal grain having a cubic structure in the layer of a complex nitride or complex carbonitride of Cr and Al or the layer of a complex nitride or complex carbonitride of Ti, Al, and Me is 0.1 to 2 μm and an average aspect ratio A thereof is 2 to 10, the above-described effect of the improvement of toughness and wear resistance can be further exhibited.

That is, the average crystal grain width W is set to be 0.1 to 2 μm, because, in a case where the average crystal grain width W is smaller than 0.1 μm, a percentage of atoms belonging to a CrAlCN crystal boundary or a TiAlMeCN crystal boundary occupying atoms exposed to the surface of the coating layer relatively increases, thereby increasing reactivity of a work material, and as a result, the wear resistance cannot be sufficiently exhibited. In a case where the average crystal grain width W is greater than 2 μm, a percentage of atoms belonging to a CrAlCN crystal boundary or a TiAlMeCN crystal boundary occupying the entire coating layer relatively decreases, thereby deteriorating toughness, and the chipping resistance cannot be sufficiently exhibited. Therefore, the average crystal grain width W is preferably 0.1 to 2 μm.

In addition, in a case where the average aspect ratio A is less than 2, a sufficient columnar structure is not obtained, thereby causing a drop of the equi-axed crystal having a small aspect ratio, and as a result, sufficient wear resistance cannot be exhibited. On the other hand, in a case where the average aspect ratio A is greater than 10, it is difficult to maintain strength of the crystal grains, and the chipping resistance deteriorates. Thus, it is not preferable. Accordingly, the average aspect ratio A is preferably 2 to 10.

In the present invention, regarding the average aspect ratio A, the observation was performed from the film cross section side perpendicular to the surface of the tool body, in a case where the vertical cross-sectional observation of the hard coating layer was performed in a range of a width of 100 μm and a height of the entire hard coating layer, by using a scanning electron microscope, a crystal grain width w in a direction parallel to the surface of the body and a crystal grain length l in a direction perpendicular to the surface of the body were measured, an aspect ratio a (=l/w) of each crystal grain was calculated, an average value of the aspect ratios a obtained regarding individual crystal grains was calculated as the average aspect ratio A, and an average value of the crystal grain widths w obtained regarding individual crystal grains was calculated as the average crystal grain width W.

Lower Layer and Upper Layer:

The layer of a complex nitride or complex carbonitride of Cr and Al or the layer of a complex nitride or complex carbonitride of Ti, Al, and Me included in the surface-coated cutting tool of the present invention exhibits sufficient effects in itself. However, in a case where a lower layer which is formed of a Ti compound layer that includes one layer or more layers of a Ti carbide layer, a Ti nitride layer, a Ti carbonitride layer, a Ti oxycarbide layer, and a Ti oxycarbonitride layer, and has an average total layer thickness of 0.1 to 20 μm is provided, or in a case where an upper layer including at least an aluminum oxide layer is provided to have an average total layer thickness of 1 to 25 μm, better characteristics can be exhibited, together with the effects of these layers. In a case where the lower layer which is formed of a Ti compound layer that includes one layer or more layers of a Ti carbide layer, a Ti nitride layer, a Ti carbonitride layer, a Ti oxycarbide layer, and a Ti oxycarbonitride layer is provided, and the average total layer thickness of the lower layer is smaller than 0.1 μm, the effect of the lower layer is insufficiently exhibited. On the other hand, in a case where the average total layer thickness thereof is greater than 20 μm, the crystal grains easily coarsen and chipping easily occurs. In addition, in a case where the average total layer thickness of the upper layer including an aluminum oxide layer is smaller than 1 μm, the effect of the upper layer is insufficiently exhibited. On the other hand, in a case where the average total layer thickness thereof is greater than 25 μm, the crystal grains easily coarsen and chipping easily occurs.

Figure 2:
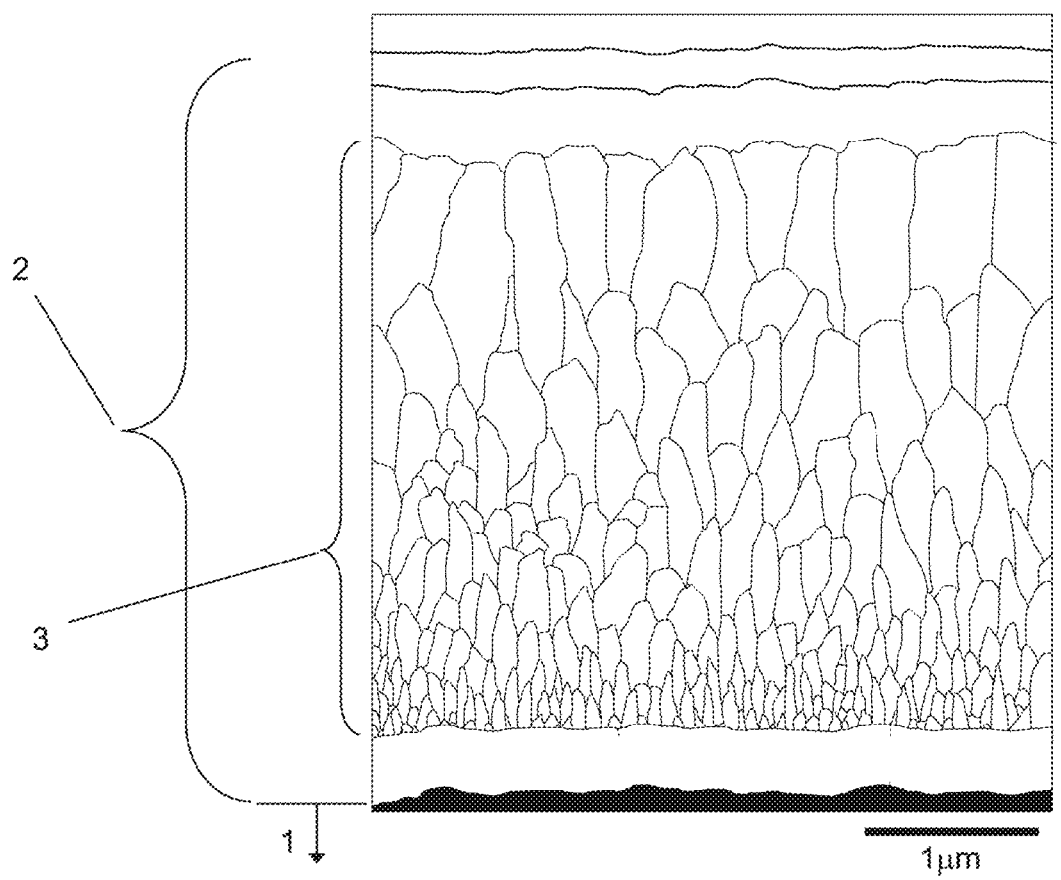
FIG. 2 shows a film constituent schematic view which schematically shows a cross section of the layer of a complex nitride or complex carbonitride of Cr and Al or the layer of a complex nitride or complex carbonitride of Ti, Al, and Me, configuring a hard coating layer included in the surface-coated cutting tool of the present invention.

FIG. 2 shows a view schematically showing a cross section of the layer of a complex nitride or complex carbonitride of Cr and Al or the layer of a complex nitride or complex carbonitride of Ti, Al, and Me configuring the hard coating layer included in the surface-coated cutting tool of the present invention.

Next, examples of the coated tool of the present invention will be described in more detail.

As the examples, although a coated tool including a of WC-based cemented carbide or TiCN-based cermet as a tool body is described, the same applies to a case where a cubic boron nitride-based ultra-high pressure sintered material is used as a tool body.

EXAMPLE 1

As raw material powders, a WC powder, a TiC powder, a TaC powder, an NbC powder, a $Cr_3C_2$ powder, and a Co powder, all of which had an average grain size of 1 to 3 μm, were prepared, and the raw material powders were mixed in mixing compositions shown in Table 1. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies A to C made of WC-based cemented carbide with insert shapes according to ISO standard SEEN1203AFSN were produced.

In addition, as raw material powders, a TiCN (TiC/TiN=50/50 in terms of mass ratio) powder, an $Mo_2C$ powder, a ZrC powder, an NbC powder, a WC powder, a Co powder, and an Ni powder, all of which had an average grain size of 0.5 to 2 μm, were prepared, and the raw material powders were mixed in mixing compositions shown in Table 2, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a tool body D made of TiCN-based cermet with insert shapes according to ISO standard SEEN1203AFSN was produced.

Next, present invention coated tools 1 to 15 were produced by forming a hard coating layer formed of a $(Cr_{1-x}Al_x)(C_yN_{1-y})$ layer, which has a target layer thickness shown in Table 7 and in which crystal grains having a cubic structure having the average crystal grain misorientation equal to or greater than 2 degrees shown in Table 7 are present at area ratios shown in Table 7, on surfaces of the tool bodies A to D through a thermal CVD method for a predetermined time using a chemical vapor deposition apparatus, under forming conditions A to J shown in Tables 3, 4, and 5, in which a gas group A of $NH_3$ and $N_2$, and a gas group B of $CrCl_3$, $AlCl_3$, $Al(CH_3)_3$, $N_2$, and $H_2$ were used and in each gas supply method a reaction gas composition (% by volume with respect to the total amount of the gas group A and the gas group B) included a gas group A of $NH_3$: 4.5% to 5.5%, $H_2$: 65% to 75%, and a gas group B of $AlCl_3$: 0.6% to 0.9%, $CrCl_3$: 0.2% to 0.3%, $Al(CH_3)_3$: 0% to 0.5%, $N_2$: 12.5% to 15.0%, $H_2$: the remainder, a reaction atmosphere pressure was 4.5 kPa to 5.0 kPa, a reaction atmosphere temperature was 750° C. to 900° C., a supply cycle was 1 second to 5 seconds, a gas supply time per one cycle was 0.15 to 0.25 seconds, and a phase difference between gas supply A and gas supply B was 0.10 to 0.20 seconds.

In addition, a lower layer shown in Table 6 and/or an upper layer shown in Table 7 were formed on the present invention coated tools 6 to 13 under forming conditions shown in Table 3.

In addition, for the purpose of comparison, hard coating layers including at least a layer of a complex nitride or complex carbonitride of Cr and Al were deposited on the surfaces of the tool bodies A to D to have a target layer thickness (μm) shown in Table 8 under the conditions shown in Tables 3, 4 and 5, in the same manner as in the present invention coated tools 1 to 15. At this time, comparative coated tools 1 to 13 were produced by forming the hard coating layers so that the composition of the reaction gas on the surface of the tool body was not changed over time during a process of forming a $(Cr_{1-x}Al_x)(C_yN_{1-y})$ layer.

In addition, in the same manner as in the present invention coated tools 6 to 13, a lower layer shown in Table 6 and/or an upper layer shown in Table 8 were formed on the comparative coated tools 6 to 13 under forming conditions shown in Table 3.

For reference, reference coated tools 14 and 15 shown in Table 8 were produced by depositing $(Cr_{1-x}Al_x)(C_yN_{1-y})$ layers of a reference example on the surfaces of the tool body B and the tool body C to have target layer thicknesses through arc ion plating using a physical vapor deposition apparatus in the related art.

In addition, conditions of the arc ion plating using the deposition of the reference example are as follows.

(a) The tool bodies B and C were subjected to ultrasonic cleaning in acetone and were dried. In this state, the tool bodies B and C were mounted along outer circumferential portions on a rotation table in an arc ion plating apparatus at positions distant from the center axis thereof by predetermined distances in a radial direction thereof, and a Al—Cr alloy having a predetermined composition was disposed as a cathode electrode (evaporation source).

(b) First, while the inside of the apparatus was evacuated and maintained in a vacuum at $10^{-2}$ Pa or lower, the inside of the apparatus was heated to 500° C. by a heater, and a DC bias voltage of −1000 V was thereafter applied to the tool body that was rotated while being revolved on the rotation table. In addition, arc discharge was generated by allowing a current of 200 A to flow between the cathode electrode made of the Al—Cr alloy and an anode electrode such that Al and Cr ions were generated in the apparatus and the surface of the tool body was subjected to bombard cleaning.

(c) Next, nitrogen gas as a reaction gas was introduced into the apparatus to form a reaction atmosphere at 4 Pa, and a DC bias voltage of −50 V was applied to the tool body that was rotated while being revolved on the rotation table. In addition, arc discharge was generated by allowing a current of 120 A to flow between the cathode electrode (evaporation source) made of the Al—Cr alloy and the anode electrode such that a (Al,Cr)N layer having a target composition and a target layer thickness shown in Table 8 was deposited on the surface of the tool body, thereby producing the reference coated tools 14 and 15.

The section of each of constituent layers of the present invention coated tools 1 to 15, the comparative coated tools 1 to 13, and the reference coated tools 14 and 15 in a direction perpendicular to the tool body was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 7 and 8.

In addition, regarding the average content ratio $x_{avg}$ of Al of the layer of a complex nitride or complex carbonitride, a sample of which the surface was polished using an electron probe micro-analyzer (EPMA) was irradiated with electron beams from the sample surface side, and the average content ratio $x_{avg}$ of Al was obtained by averaging 10 points of the analytic result of obtained characteristic X-rays. The average content ratio $y_{avg}$ of C was obtained by secondary ion mass spectrometry (SIMS). Ion beams were emitted toward a range of 70 μm×70 μm from the sample surface side, and the concentration of components emitted by a sputtering action was measured in a depth direction. The average content ratio $y_{avg}$ of C represents the average value in the depth direction of the layer of a complex nitride or complex carbonitride of Cr and Al. However, the content ratio of C excludes the content ratio of inevitable C which is included even though gas containing C is not intentionally used as a gas raw material. Specifically, the content ratio (atomic ratio) of the component C contained in the layer of a complex nitride or complex carbonitride in a case where the amount of supplied $Al(CH_3)_3$ was set to 0 was obtained as the content ratio of inevitable C, and a value obtained by subtracting the content ratio of inevitable C from the content ratio (atomic ratio) of the component C contained in the layer of a complex nitride or complex carbonitride obtained in a case where $Al(CH_3)_3$ was intentionally supplied was selected to be $y_{avg}$.

In a case where crystal orientation of each crystal grain having a cubic structure configuring the layer of a complex nitride or complex carbonitride of Cr and Al was analyzed in the vertical cross-sectional direction by using an electron beam backward scattering diffraction device and misorientation equal to or greater than 5 degrees was obtained between adjacent pixels, this point was set as a boundary and a region surrounded by the boundary was set as one crystal grain. The average crystal grain misorientation between the pixel in the crystal grain and all of the other pixels in the same crystal grain was acquired. Mapping was performed by partitioning the ranges of the average crystal grain misorientation which is 0 to 10 degrees by 1 degree by dividing the ranges into a range of average crystal grain misorientation equal to or greater than 0 degrees and smaller than 1 degree, equal to or greater than 1 degree and smaller than 2 degrees, equal to or greater than 2 degrees and smaller than 3 degrees, equal to or greater than 3 degrees and smaller than 4 degrees, . . . . From this mapped diagram, the area ratio of the crystal grain having the average crystal grain misorientation equal to or greater than 2 degrees occupying the total area of the layer of a complex nitride or complex carbonitride of Cr and Al was acquired.

Results thereof are shown in Tables 7 and 8.

FIG. 3 shows an example of the histogram of the average crystal grain misorientation (that is, GOS value) measured regarding the present invention coated tool 5, and FIG. 4 shows an example of the histogram of the average crystal grain misorientation measured regarding the comparative coated tool 2.

Regarding inclined angle frequency distribution of the hard coating layer, a ratio of a frequency present in a range of 0 to 12 degrees is obtained, by setting a cross section of the hard coating layer formed of a complex carbonitride layer of Cr and Al having a cubic structure in a body tube of an electron emission type scanning electron microscope in a state of a polished surface, dividing the polished surface in half in a layer thickness direction to have a region on a tool body surface (boundary) side and a region on a surface side and analyzing the regions, irradiating individual crystal grains having a cubic crystal lattice present in a measurement range of the region on the tool body side and the region of the surface side regarding the vertical direction of the tool body, and in a measurement range having a width of 10 μm in 5 visual fields at an interval of 0.1 μm/step regarding the horizontal direction of the tool body, with an electron beam having an incidence angle of 70 degrees and an accelerating voltage of 10 kV with an illumination current of 1 nA, measuring an inclined angle formed by a normal line of the {100} plane as a crystal plane of the crystal grain with respect to a normal line of the surface of the tool body (direction perpendicular to the surface of the tool body on the cross-sectional polished surface) by using an electron beam backward scattering diffraction image device, sectioning the measured inclined angle in a range of 0 to 45 degrees among the measured inclined angles at a pitch of 0.25 degrees based on the measurement result, and adding up the frequencies present in each section. The results thereof are shown in Tables 7 and 8.

Figure 7:
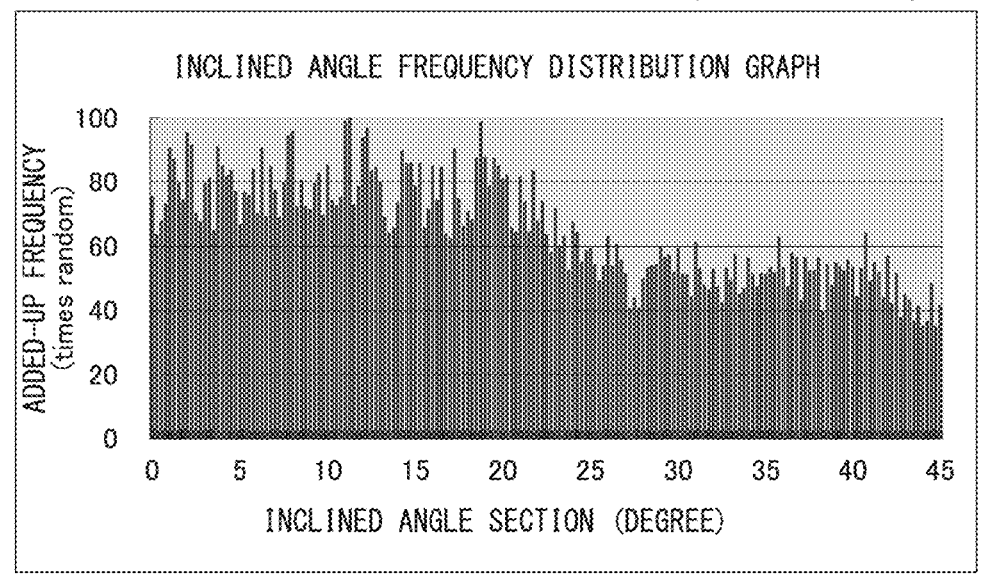
FIG. 7 is an example of a drawn inclined angle frequency distribution graph of a {100} plane in a region on the tool body side of the layer of a complex nitride or complex carbonitride of Cr and Al configuring the hard coating layer of the present invention coated tool. The added-up frequency is shown as a relative value obtained by standardizing a maximum added-up frequency as 100. Hereinafter, regarding the definition of the added-up frequency, the same applies to FIGS. 8 to 10.
Figure 8:
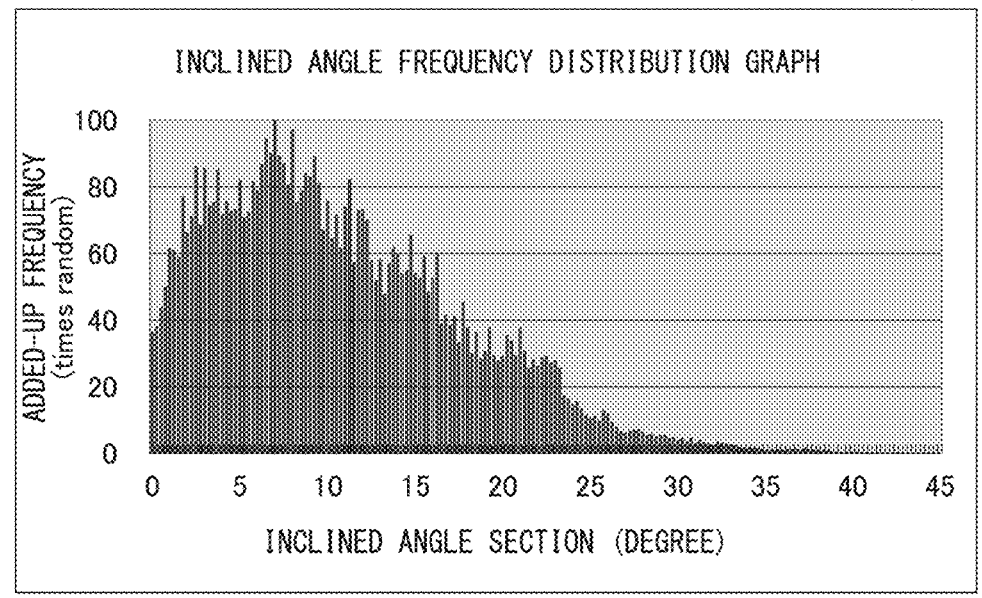
FIG. 8 is an example of a drawn inclined angle frequency distribution graph of a {001} plane in a region on the surface side of the layer of a complex nitride or complex carbonitride of Cr and Al configuring the hard coating layer of the present invention coated tool. The added-up frequency is shown as a relative value obtained by standardizing a maximum added-up frequency as 100.

FIG. 7 shows an example of the inclined angle frequency distribution measured regarding the region on the tool body side of the hard coating layer formed of the complex carbonitride layer of Cr and Al of the present invention coating tool, and FIG. 8 shows an example of the inclined angle frequency distribution measured regarding the region on the surface side of the hard coating layer formed of the complex carbonitride layer of Cr and Al of the present invention coating tool.

Analysis at an interval of 0.1 μm in a vertical cross-sectional direction was performed by using the electron beam backward scattering diffraction device, measurement in the measurement range of a width of 10 μm and a height of a film thickness in the vertical cross-sectional direction was performed in 5 visual fields, the number of all pixels belonging to the crystal grain having a cubic structure configuring the layer of a complex nitride or complex carbonitride was acquired, and an area ratio of the crystal grain having a cubic structure configuring the layer of a complex nitride or complex carbonitride was obtained by the ratio with respect to the number of all pixels in the measurement with respect to the hard coating layer in the 5 visual fields.

TABLE 1

| | Type | Mixing composition (% by mass) | | | | | |
|---|---|---|---|---|---|---|---|
| | | Co | TiC | TaC | NbC | $Cr_3C_2$ | WC |
| Tool body | A | 7.5 | 1.5 | — | 3.0 | 0.4 | Remainder |
| | B | 8.0 | — | 1.8 | 0.2 | — | Remainder |
| | C | 6.5 | — | — | — | — | Remainder |

TABLE 2

| | Type | Mixing composition (% by mass) | | | | | | |
|---|---|---|---|---|---|---|---|---|
| | | Co | Ni | ZrC | NbC | $Mo_2C$ | WC | TiCN |
| Tool body | D | 8 | 5 | 1 | 6 | 6 | 10 | Remainder |

TABLE 3

| Constituent layers of hard coating layer | | Formation symbol | Reaction gas composition (% by volume) | Reaction atmosphere | |
|---|---|---|---|---|---|
| Type | Formation | | | Pressure | Temperature |
| $(Cr_{1-x}Al_x)(C_YN_{I-Y})$ layer | CrAlCN | CrAlCN | See Table 4 | See Table 5 | See Table 5 |
| Ti compound layer | TiC | TiC | $TiCl_4$: 4.2%, $CH_4$: 8.5%, $H_2$: remainder | 7 | 900 |
| | TiN | TiN-1 | $TiCl_4$: 4.2%, $N_2$: 30%, $H_2$: remainder | 30 | 850 |
| | | TiN-2 | $TiCl_4$: 4.2%, $N_2$: 35%, $H_2$: remainder | 50 | 900 |
| | 1-TiCN | 1-TiCN | $TiCl_4$: 2%, $CH_3CN$: 0.7%, $N_2$: 10%, $H_2$: remainder | 7 | 900 |
| | TiCN | TiCN | $TiCl_4$: 2%, $CH_4$: 1%, $N_2$: 15%, $H_2$: remainder | 13 | 900 |
| | TiCO | TiCO | $TiCl_4$: 4.2%, CO: 4%, $H_2$: remainder | 7 | 900 |
| | TiCNO | TiCNO | $TiCl_4$: 2%, CO: 1%, $CH_4$: 1%, $N_2$: 5%, $H_2$: remainder | 13 | 900 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: remainder | 7 | 900 |

TABLE 4

| Formation of hard coating layer | | Forming conditions (reaction gas composition indicates proportion in total amount of gas group A and gas group B) | |
|---|---|---|---|
| Process type | Formation symbol | Reaction gas group A composition (% by volume) | Reaction gas group B composition (% by volume) |
| Present invention film-forming process | A | $NH_3$: 4.5%, $H_2$: 65%, | $AlCl_3$: 0.9%, $CrCl_3$: 0.3%, $N_2$: 14%, $Al(CH_3)_3$: 0.5%, $H_2$ as remainder |
| | B | $NH_3$: 4.5%, $H_2$: 65%, | $AlCl_3$: 0.6%, $CrCl_3$: 0.3%, $N_2$: 13.5%, $Al(CH_3)_3$: 0.4%, $H_2$ as remainder |
| | C | $NH_3$: 5.5%, $H_2$: 65%, | $AlCl_3$: 0.7%, $CrCl_3$: 0.3%, $N_2$: 14.5%, $Al(CH_3)_3$: 0.2%, $H_2$ as remainder |
| | D | $NH_3$: 5.5%, $H_2$: 75%, | $AlCl_3$: 0.7%, $CrCl_3$: 0.3%, $N_2$: 15%, $Al(CH_3)_3$: 0%, $H_2$ as remainder |
| | E | $NH_3$: 4.5%, $H_2$: 75%, | $AlCl_3$: 0.8%, $CrCl_3$: 0.3%, $N_2$: 13%, $Al(CH_3)_3$: 0%, $H_2$ as remainder |
| | F | $NH_3$: 5.5%, $H_2$: 65%, | $AlCl_3$: 0.6%, $CrCl_3$: 0.2%, $N_2$: 12.5%, $Al(CH_3)_3$: 0%, $H_2$ as remainder |
| | G | $NH_3$: 4.5%, $H_2$: 75%, | $AlCl_3$: 0.6%, $CrCl_3$: 0.3%, $N_2$: 13.5%, $Al(CH_3)_3$: 0%, $H_2$ as remainder |
| | H | $NH_3$: 5.5%, $H_2$: 75%, | $AlCl_3$: 0.9%, $CrCl_3$: 0.2%, $N_2$: 12.8%, $Al(CH_3)_3$: 0%, $H_2$ as remainder |
| | I | $NH_3$: 4.5%, $H_2$: 75%, | $AlCl_3$: 0.8%, $CrCl_3$: 0.3%, $N_2$: 14%, $Al(CH_3)_3$: 0%, $H_2$ as remainder |
| | J | $NH_3$: 5.5%, $H_2$: 65%, | $AlCl_3$: 0.7%, $CrCl_3$: 0.2%, $N_2$: 13%, $Al(CH_3)_3$: 0%, $H_2$ as remainder |
| Comparative film-forming process | A' | $NH_3$: 4.5%, $H_2$: 65%, | $AlCl_3$: 0.9%, $CrCl_3$: 0.3%, $N_2$: 14%, $Al(CH_3)_3$: 0.5%, $H_2$ as remainder |
| | B' | $NH_3$: 4.5%, $H_2$: 65%, | $AlCl_3$: 0.6%, $CrCl_3$: 0.3%, $N_2$: 13.5%, $Al(CH_3)_3$: 0.4%, $H_2$ as remainder |
| | C' | $NH_3$: 5.5%, $H_2$: 65%, | $AlCl_3$: 0.7%, $CrCl_3$: 0.3%, $N_2$: 14.5%, $Al(CH_3)_3$: 0.2%, $H_2$ as remainder |
| | D' | $NH_3$: 5.5%, $H_2$: 75%, | $AlCl_3$: 0.7%, $CrCl_3$: 0.3%, $N_2$: 15%, $Al(CH_3)_3$: 0%, $H_2$ as remainder |
| | E' | $NH_3$: 4.5%, $H_2$: 75%, | $AlCl_3$: 0.8%, $CrCl_3$: 0.3%, $N_2$: 13%, $Al(CH_3)_3$: 0%, $H_2$ as remainder |
| | F' | $NH_3$: 5.5%, $H_2$: 65%, | $AlCl_3$: 0.6%, $CrCl_3$: 0.2%, $N_2$: 12.5%, $Al(CH_3)_3$: 0%, $H_2$ as remainder |
| | G' | $NH_3$: 4.5%, $H_2$: 75%, | $AlCl_3$: 0.6%, $CrCl_3$: 0.2%, $N_2$: 13.5%, $Al(CH_3)_3$: 0%, $H_2$ as remainder |
| | H' | $NH_3$: 5.5%, $H_2$: 75%, | $AlCl_3$: 0.9%, $CrCl_3$: 0.2%, $N_2$: 12.8%, $Al(CH_3)_3$: 0%, $H_2$ as remainder |
| | I' | $NH_3$: 4.5%, $H_2$: 75%, | $AlCl_3$: 0.8%, $CrCl_3$: 0.3%, $N_2$: 14%, $Al(CH_3)_3$: 0%, $H_2$ as remainder |
| | J' | $NH_3$: 5.5%, $H_2$: 65%, | $AlCl_3$: 0.7%, $CrCl_3$: 0.2%, $N_2$: 13%, $Al(CH_3)_3$: 0%, $H_2$ as remainder |

TABLE 5

| Formation of hard coating layer | | Forming conditions (pressure of reaction atmosphere indicates kPa and temperature indicates ° C.) | | | | | | |
|---|---|---|---|---|---|---|---|---|
| | | Gas group A | | Gas group B | | Phase difference in supply between gas group A and gas group B (sec) | Reaction atmosphere | |
| Process type | Formation symbol | Supply cycle (sec) | Supply time per one cycle (sec) | Supply cycle (sec) | Supply time per one cycle (sec) | | Pressure | Temperature |
| Present invention film-forming process | A | 2 | 0.25 | 2 | 0.25 | 0.15 | 5 | 750 |
| | B | 4.5 | 0.2 | 4.5 | 0.2 | 0.1 | 4.7 | 800 |
| | C | 2.5 | 0.2 | 2.5 | 0.2 | 0.15 | 4.5 | 800 |
| | D | 3 | 0.15 | 3 | 0.15 | 0.1 | 4.5 | 800 |
| | E | 4 | 0.2 | 4 | 0.2 | 0.1 | 5 | 850 |
| | F | 5 | 0.2 | 5 | 0.2 | 0.15 | 4.7 | 800 |

TABLE 5-continued

Forming conditions (pressure of reaction atmosphere indicates kPa and temperature indicates °C.)

| Process type | Formation of hard coating layer Formation symbol | Gas group A Supply cycle (sec) | Gas group A Supply time per one cycle (sec) | Gas group B Supply cycle (sec) | Gas group B Supply time per one cycle (sec) | Phase difference in supply between gas group A and gas group B (sec) | Reaction atmosphere Pressure | Reaction atmosphere Temperature |
|---|---|---|---|---|---|---|---|---|
| | G | 1.5 | 0.15 | 1.5 | 0.15 | 0.1 | 4.7 | 750 |
| | H | 1.2 | 0.25 | 1.2 | 0.25 | 0.2 | 4.7 | 900 |
| | I | 2.5 | 0.2 | 2.5 | 0.2 | 0.15 | 4.7 | 750 |
| | J | 1 | 0.2 | 1 | 0.2 | 0.15 | 4.7 | 800 |
| Comparative film-forming process | A' | — | — | — | — | — | 5 | 750 |
| | B' | — | — | — | — | — | 4.7 | 800 |
| | C' | — | — | — | — | — | 4.5 | 800 |
| | D' | — | — | — | — | — | 4.5 | 800 |
| | E' | — | — | — | — | — | 5 | 850 |
| | F' | — | — | — | — | — | 4.7 | 800 |
| | G' | — | — | — | — | — | 4.7 | 750 |
| | H' | — | — | — | — | — | 4.7 | 900 |
| | I' | — | — | — | — | — | 4.7 | 750 |
| | J' | — | — | — | — | — | 4.7 | 800 |

TABLE 6

Hard coating layer (numerical value at the bottom indicates target average layer thickness (μm) of layer) Lower layer

| Type | Tool body symbol | First layer | Second layer | Third layer |
|---|---|---|---|---|
| Present invention coated tool, comparative coated tool, reference coated tool | 1 A | — | — | — |
| | 2 B | — | — | — |
| | 3 C | — | — | — |
| | 4 D | — | — | — |
| | 5 A | — | — | — |
| | 6 B | TiC (0.5) | — | — |
| | 7 C | TiN-1 (0.3) | — | — |
| | 8 D | TiN-1 (0.5) | 1-TiCN (4) | — |
| | 9 A | TiN-1 (0.3) | 1-TiCN (2) | TiCN (0.7) |
| | 10 B | — | — | — |
| | 11 C | TiN-1 (0.5) | — | — |
| | 12 D | TiC (1) | — | — |
| | 13 A | TiN-1 (0.1) | — | — |
| | 14 B | — | — | — |
| | 15 C | — | — | — |

TABLE 7

Hard coating layer

CrAl complex nitride layer and carbonitride layer $(Cr_{1-x}Al_x)(C_yN_{1-y})$

| Type | Tool body symbol | CrAlCN film-forming process formation symbol (see Tables 4 and 5) | Content ratio $x_{avg}$ of Al | Content ratio $y_{avg}$ of C | Area ratio of crystal grains having average crystal grain misorientation equal to or greater than 2 degrees (%) | Area ratio of cubic crystal (%) | Average crystal grain width W of crystal grains (μm) | Average aspect ratio A of crystal grains |
|---|---|---|---|---|---|---|---|---|
| Present invention coated tool | 1 | A | A | 0.95 | 0.0042 | 34 | 73 | 0.1 | 3.1 |
| | 2 | B | B | 0.89 | 0.0028 | 46 | 100 | 0.2 | 2.8 |
| | 3 | C | C | 0.83 | 0.0013 | 63 | 100 | 0.7 | 4.2 |
| | 4 | D | D | 0.70 | Equal to or smaller than 0.0001 | 38 | 100 | 0.4 | 2.0 |
| | 5 | A | E | 0.76 | Equal to or smaller than 0.0001 | 40 | 100 | 1.1 | 1.5 |
| | 6 | B | F | 0.86 | Equal to or smaller than 0.0001 | 51 | 100 | 0.6 | 3.7 |
| | 7 | C | G | 0.79 | Equal to or smaller than 0.0001 | 38 | 96 | 0.7 | 5.2 |
| | 8 | D | H | 0.94 | Equal to or smaller than 0.0001 | 34 | 66 | 0.6 | 3.1 |

TABLE 7-continued

| | | | | | | | | | |
|---|---|---|---|---|---|---|---|---|---|
| | 9 | A | I | 0.74 | Equal to or smaller than 0.0001 | 38 | 100 | 0.8 | 2.2 |
| | 10 | B | J | 0.93 | Equal to or smaller than 0.0001 | 46 | 91 | 0.7 | 5.2 |
| | 11 | C | A | 0.91 | 0.0039 | 23 | 81 | 0.7 | 2.1 |
| | 12 | D | B | 0.88 | 0.0024 | 53 | 98 | 0.2 | 3.3 |
| | 13 | A | C | 0.85 | 0.0024 | 58 | 100 | 0.3 | 3.1 |
| | 14 | B | D | 0.71 | Equal to or smaller than 0.0001 | 36 | 100 | 0.3 | 2.3 |
| | 15 | C | E | 0.77 | Equal to or smaller than 0.0001 | 42 | 100 | 1.2 | 2.1 |

| | | Hard coating layer | | | | |
|---|---|---|---|---|---|---|
| | | CrAl complex nitride layer and carbonitride layer $(Cr_{1-x}Al_x)(C_yN_{1-y})$ | | | | |
| Type | | Frequency distribution ratio $M_{deg}$ present in range of 0 to 12 degrees regarding inclined angle of a normal line on {001} plane in region on tool body side | Frequency distribution ratio $N_{deg}$ present in range of 0 to 12 degrees regarding inclined angle of a normal line on {001} plane in region on surface side | Inclined angle section showing highest peak in region on surface side (degree) | Target layer thickness (μm) | Upper layer (numerical value at the bottom indicates target average layer thickness (μm) of layer | |
| | | | | | | First layer | Second layer |
| Present invention coated tool | 1 | 40 | 62 | 7.00-7.25 | 2.5 | — | — |
| | 2 | 21 | 40 | 3.75-4.00 | 2 | — | — |
| | 3 | 29 | 58 | 0.25-0.50 | 8 | — | — |
| | 4 | 39 | 51 | 8.75-9.00 | 4 | — | — |
| | 5 | 32 | 48 | 8.50-8.75 | 6 | — | — |
| | 6 | 29 | 51 | 4.25-4.50 | 4 | — | — |
| | 7 | 11 | 39 | 8.00-8.25 | 7 | — | — |
| | 8 | 27 | 48 | 3.25-3.50 | 4.5 | — | — |
| | 9 | 20 | 41 | 11.75-12.00 | 3.5 | — | — |
| | 10 | 16 | 32 | 9.25-9.50 | 5 | Al$_2$O$_3$ (2.5) | — |
| | 11 | 1 | 56 | 4.75-5.00 | 7 | TiCN (0.5) | Al$_2$O$_3$ (3) |
| | 12 | 28 | 51 | 4.00-4.25 | 3 | TiCO (1) | Al$_2$O$_3$ (2) |
| | 13 | 32 | 55 | 2.25-2.50 | 5 | TiCNO (0.3) | Al$_2$O$_3$ (1) |
| | 14 | 40 | 54 | 10.25-10.50 | 6 | — | — |
| | 15 | 36 | 51 | 4.75-5.00 | 6 | — | — |

TABLE 8

| | | | Hard coating layer | | | | | |
|---|---|---|---|---|---|---|---|---|
| | | | CrAl complex nitride layer and carbonitride layer $(Cr_{1-x}Al_x)(C_yN_{1-y})$ | | | | | |
| Type | | Tool body symbol | CrAlCN film-forming process formation symbol (see Tables 4 and 5) | Content ratio $x_{avg}$ of Al | Content ratio $y_{avg}$ of C | Area ratio of crystal grains having average crystal grain misorientation equal to or greater than 2 degrees (%) | Area ratio of cubic crystal (%) | Average crystal grain width W of crystal grains (μm) | Average aspect ratio A of crystal grains |
| Comparative coated tool | 1 | A | A' | 0.94 | 0.0043 | 6 | 86 | 0.2 | 1.2 |
| | 2 | B | B' | 0.87 | 0.0023 | 15 | 96 | 0.2 | 2.4 |
| | 3 | C | C' | 0.84 | 0.0018 | 4 | 100 | 0.8 | 4.1 |
| | 4 | D | D' | 0.72 | Equal to or smaller than 0.0001 | 5 | 100 | 0.4 | 0.8 |
| | 5 | A | E' | 0.75 | Equal to or smaller than 0.0001 | 5 | 100 | 0.9 | 2.5 |

TABLE 8-continued

|  | | | | | | | | | |
|---|---|---|---|---|---|---|---|---|---|
|  | 6 | B | F' | 0.81 | Equal to or smaller than 0.0001 | 5 | 94 | 0.4 | 4.2 |
|  | 7 | C | G' | 0.81 | Equal to or smaller than 0.0001 | 11 | 98 | 0.4 | 4.6 |
|  | 8 | D | H' | 0.91 | Equal to or smaller than 0.0001 | 5 | 65 | 0.4 | 2.5 |
|  | 9 | A | I' | 0.73 | Equal to or smaller than 0.0001 | 5 | 100 | 0.8 | 1.5 |
|  | 10 | B | J' | 0.91 | Equal to or smaller than 0.0001 | 7 | 92 | 0.80 | 4.8 |
|  | 11 | C | A' | 0.93 | 0 | 7 | 81 | 0.2 | 2.3 |
|  | 12 | D | B' | 0.91 | 0 | 12 | 97 | 0.2 | 2.9 |
|  | 13 | A | C' | 0.82 | 0.0021 | 8 | 100 | 0.7 | 3.4 |
| Reference coated tool | 14 | B | AIP | 0.70 | Equal to or smaller than 0.0001 | 8 | 100 | 1.8 | 3.2 |
|  | 15 | C | AIP | 0.59 | Equal to or smaller than 0.0001 | 7 | 100 | 0.5 | 2.1 |

| | | Hard coating layer | | | | |
|---|---|---|---|---|---|---|
| | | CrAl complex nitride layer and carbonitride layer $(Cr_{1-x}Al_x)(C_yN_{1-y})$ | | | | |
| Type | | Frequency distribution ratio $M_{deg}$ present in range of 0 to 12 degrees regarding inclined angle of a normal line on {001} plane in region on tool body side | Frequency distribution ratio $N_{deg}$ present in range of 0 to 12 degrees regarding inclined angle of a normal line on {001} plane in region on surface side | Inclined angle section showing highest peak in region on surface side (degree) | Target layer thickness (μm) | Upper layer (numerical value at the bottom indicates target average layer thickness (μm) of layer) |
| | | | | | | First layer | Second layer |
| Comparative coated tool | 1 | 34 | 28 | 20.75-21.00 | 2.5 | — | — |
| | 2 | 27 | 31 | 32.75-33.00 | 2 | — | — |
| | 3 | 31 | 22 | 24.25-24.50 | 8 | — | — |
| | 4 | 24 | 28 | 23.25-23.50 | 4 | — | — |
| | 5 | 34 | 43 | 14.50-14.75 | 6 | — | — |
| | 6 | 33 | 37 | 16.25-16.50 | 4 | — | — |
| | 7 | 24 | 20 | 27.75-28.00 | 7 | — | — |
| | 8 | 22 | 17 | 41.50-41.75 | 4.5 | — | — |
| | 9 | 22 | 34 | 29.25-29.50 | 3.5 | — | — |
| | 10 | 19 | 25 | 31.00-31.25 | 5 | $Al_2O_3$ (2.5) | — |
| | 11 | 29 | 32 | 18.25-18.50 | 7 | TiCN (0.5) | $Al_2O_3$ (3) |
| | 12 | 26 | 28 | 34.00-34.25 | 3 | TiCO (1) | $Al_2O_3$ (2) |
| | 13 | 33 | 28 | 24.25-24.50 | 5 | TiCNO (0.3) | $Al_2O_3$ (1) |
| Reference coated tool | 14 | 25 | 1 | 28.25-28.50 | 6 | — | — |
| | 15 | 26 | 35 | 32.75-33.00 | 6 | — | — |

(Note)
"AIP" indicates a film formed through arc ion plating.

Next, in a state in which each of the various coated tools was clamped to a cutter tip end portion made of tool steel having a cutter diameter of 125 mm by a fixing tool, the present invention coated tools 1 to 15, the comparative coated tools 1 to 13, and the reference coated tools 14 and 15 were subjected to dry high-speed face milling, which is a type of high-speed intermittent cutting of carbon steel, and a center-cut cutting test, and a wear width of a flank face of a cutting edge was measured. Results thereof are shown in Table 9.

Tool body: tungsten carbide-based cemented carbide, titanium carbonitride-based cermet
Cutting test: dry high-speed face milling, center-cut cutting
Work material: a block material of JIS S55C with a width of 100 mm and a length of 400 mm
Rotational speed: 866 min$^{-1}$,
Cutting speed: 340 m/min
Depth of cut: 1.5 mm
Feed per tooth: 0.10 mm/tooth
Cutting time: 8 minutes

TABLE 9

| Type | | Wear width of a flank face (mm) | Type | | Cutting test results (min) |
|---|---|---|---|---|---|
| Present invention coated tool | 1 | 0.09 | Comparative coated tool | 1 | 3.4* |
| | 2 | 0.09 | | 2 | 4.2* |
| | 3 | 0.08 | | 3 | 4.2* |
| | 4 | 0.12 | | 4 | 2.0* |
| | 5 | 0.13 | | 5 | 3.7* |
| | 6 | 0.07 | | 6 | 4.3* |
| | 7 | 0.09 | | 7 | 4.1* |
| | 8 | 0.14 | | 8 | 1.9* |
| | 9 | 0.10 | | 9 | 2.2* |
| | 10 | 0.13 | | 10 | 3.8* |
| | 11 | 0.10 | | 11 | 2.3* |
| | 12 | 0.07 | | 12 | 4.4* |
| | 13 | 0.08 | | 13 | 4.5* |
| | 14 | 0.11 | Reference coated tool | 14 | 2.3* |
| | 15 | 0.11 | | 15 | 2.1* |

Mark * in boxes of comparative coated tools and reference coated tools indicates a cutting time (min) until the end of a service life caused by the occurrence of chipping.

EXAMPLE 2

As raw material powders, a WC powder, a TiC powder, a ZrC powder, a TaC powder, an NbC powder, a $Cr_3C_2$ powder, a TiN powder, and a Co powder, all of which had an average grain size of 1 to 3 μm, were prepared, and the raw material powders were mixed in mixing compositions shown in Table 10. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, a cutting edge portion was subjected to honing to have a radius R of 0.07 mm, thereby forming tool bodies α to γ made of WC-based cemented carbide with insert shapes according to ISO standard CNMG120412.

In addition, as raw material powders, a TiCN (TiC/TiN=50/50 in terms of mass ratio) powder, an NbC powder, a WC powder, a Co powder, and an Ni powder, all of which had an average grain size of 0.5 to 2 μm, were prepared, and the raw material powders were mixed in mixing compositions shown in Table 11, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a cutting edge portion was subjected to honing to have a radius R of 0.09 mm, thereby forming a tool body δ made of TiCN-based cermet with an insert shape according to ISO standard CNMG120412.

Subsequently, present invention coated tools 16 to 30 shown in Table 13 were produced by depositing hard coating layers including at least a $(Cr_{1-x}Al_x)(C_yN_{1-y})$ layer on the surfaces of the tool bodies α to γ and the tool body δ to have target layer thicknesses using a chemical vapor deposition apparatus under the conditions shown in Tables 3, 4, and 5 by the same method as that in Example 1.

In addition, a lower layer shown in Table 12 and/or an upper layer shown in Table 13 were formed on the present invention coated tools 19 to 28 under the forming conditions shown in Table 3.

In addition, for the purpose of comparison, in the same manner as in the present invention coated tools, comparative coated tools 16 to 28 shown in Table 14 were produced by depositing hard coating layers on the surfaces of the same tool bodies α to γ and the tool body δ to have target layer thicknesses shown in Table 14 under the conditions shown in Tables 3, 4, and 5 using a typical chemical vapor deposition apparatus.

In addition, in the same manner as in the present invention coated tools 19 to 28, a lower layer shown in Table 12 and/or an upper layer shown in Table 14 were formed on the comparative coated tools 19 to 28 under the forming conditions shown in Table 3.

For reference, reference coated tools 29 and 30 shown in Table 14 were produced by depositing $(Cr_{1-x}Al_x)(C_yN_{1-y})$ layers of the reference example on the surfaces of the tool body β and the tool body γ to have target layer thicknesses through arc ion plating using a physical vapor deposition apparatus in the related art.

The same conditions as those described in Example 1 were used as the conditions of the arc ion plating.

The section of each of constituent layers of the present invention coated tools 16 to 30, the comparative coated tools 16 to 28, and the reference coated tools 29 and 30 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 13 and 14.

In addition, crystal orientation of each crystal grain having a cubic structure configuring the layer of a complex nitride or complex carbonitride of Cr and Al was analyzed in the vertical cross-sectional direction by using an electron beam backward scattering diffraction device, and mapping was performed by partitioning the ranges of the crystal grain misorientation which is 0 to 10 degrees by 1 degree, by partitioning the ranges into a range of crystal grain misorientation equal to or greater than 0 degrees and smaller than 1 degree, equal to or greater than 1 degree and smaller than 2 degrees, equal to or greater than 2 degrees and smaller than 3 degrees, equal to or greater than 3 degrees and smaller than 4 degrees, . . . . From this mapped diagram, the average crystal grain misorientation and the area ratio of the crystal grain having the crystal grain misorientation equal to or greater than 2 degrees occupying the total area of the layer of a complex nitride or complex carbonitride of Cr and Al were acquired. Results thereof are shown in Tables 13 and 14.

Regarding inclined angle frequency distribution of the hard coating layer, a ratio of a frequency present in a range of 0 to 12 degrees is obtained by setting a cross section of the hard coating layer formed of a complex carbonitride layer of Cr and Al having a cubic structure in a body tube of an electron emission type scanning electron microscope in a state of a polished surface, dividing the polished surface in half in a layer thickness direction to have a region on a tool body surface (boundary) side and a region on a surface side and analyzing the regions, irradiating individual crystal grains having a cubic crystal lattice present in a measurement range of the region on the tool body side and the region of the surface side with an electron beam having an incidence angle of 70 degrees and an accelerating voltage of 10 kV with an illumination current of 1 nA, measuring an inclined angle formed by a normal line of the {100} plane as a crystal plane of the crystal grain with respect to a normal line of the surface of the tool body (direction perpendicular to the surface of the tool body on the polished section) at a width of 10 μm in direction parallel to the tool body in 5 visual fields at an interval of 0.1 μm/step by using an electron beam backward scattering diffraction image device, sectioning the measured inclined angle in a range of 0 to 45 degrees among the measured inclined angles at a pitch of 0.25 degrees based on the measurement result, and adding up the frequencies present in each section. The results thereof are shown in Tables 13 and 14.

TABLE 10

| | Mixing composition (% by mass) | | | | | | |
|---|---|---|---|---|---|---|---|
| Type | Co | TiC | ZrC | TaC | NbC | Cr$_3$C$_2$ | TiN | WC |
| Tool body α | 6.0 | — | 1.5 | — | 2.9 | 0.1 | 1.5 | Remainder |
| Tool body β | 7.1 | 2.6 | — | 4.0 | 0.5 | — | 1.1 | Remainder |
| Tool body γ | 5.5 | — | — | — | — | — | — | Remainder |

TABLE 11

| | Mixing composition (% by mass) | | | | |
|---|---|---|---|---|---|
| Type | Co | Ni | NbC | WC | TiCN |
| Tool body δ | 11 | 4 | 6 | 15 | Remainder |

TABLE 12

| | | Hard coating layer (numerical value at the bottom indicates target average layer thickness (μm) of layer) | | | |
|---|---|---|---|---|---|
| | | Lower layer | | | |
| Type | Tool body symbol | First layer | Second layer | Third layer | Fourth layer |
| Present invention coated tool, comparative coated tool, reference coated tool | 16 α | — | — | — | — |
| | 17 β | — | — | — | — |
| | 18 γ | — | — | — | — |
| | 19 δ | TiC (0.5) | — | — | — |
| | 20 α | TiN-1 (0.1) | — | — | — |
| | 21 β | TiN-1 (0.5) | 1-TiCN (7) | — | — |
| | 22 γ | TiN-1 (0.3) | 1-TiCN (10) | TiN-2 (0.7) | — |
| | 23 δ | TiN-1 (0.3) | 1-TiCN (4) | TiCN (0.4) | TiN-2 (0.3) |
| | 24 α | — | — | — | — |
| | 25 β | TiN-1 (0.5) | — | — | — |
| | 26 γ | TiC (1) | — | — | — |
| | 27 δ | TiN-1 (0.1) | — | — | — |
| | 28 α | TiN-1 (0.1) | — | — | — |
| | 29 β | — | — | — | — |
| | 30 γ | — | — | — | — |

TABLE 13

| | | Hard coating layer | | | | | | |
|---|---|---|---|---|---|---|---|---|
| | | CrAl complex nitride layer and carbonitride layer (Cr$_{1-x}$Al$_x$)(C$_y$N$_{1-y}$) | | | | | | |
| Type | Tool body symbol | CrAlCN film-forming process formation symbol (see Tables 4 and 5) | Content ratio x$_{avg}$ of Al | Content ratio y$_{avg}$ of C | Area ratio of crystal grains having average crystal grain misorientation equal to or greater than 2 degrees (%) | Area ratio of cubic crystal (%) | Average crystal grain width W of crystal grains (μm) | Average aspect ratio A of crystal grains |
| Present invention coated tool | 16 α | A | 0.94 | 0.0039 | 20 | 70 | 0.6 | 4.8 |
| | 17 β | B | 0.90 | 0.0031 | 51 | 95 | 0.6 | 1.6 |
| | 18 γ | C | 0.86 | 0.0014 | 58 | 100 | 0.9 | 5.6 |
| | 19 δ | D | 0.72 | Equal to or smaller than 0.0001 | 31 | 100 | 0.6 | 2.0 |
| | 20 α | E | 0.74 | Equal to or smaller than 0.0001 | 48 | 100 | 0.7 | 2.6 |
| | 21 β | F | 0.83 | Equal to or smaller than 0.0001 | 56 | 91 | 0.8 | 7.6 |
| | 22 γ | G | 0.77 | Equal to or smaller than 0.0001 | 48 | 98 | 2.0 | 8.5 |
| | 23 δ | H | 0.92 | Equal to or smaller than 0.0001 | 39 | 68 | 0.8 | 6.8 |
| | 24 α | I | 0.72 | Equal to or smaller than 0.0001 | 40 | 100 | 0.9 | 3.2 |
| | 25 β | J | 0.94 | Equal to or smaller than 0.0001 | 45 | 92 | 0.7 | 3.2 |
| | 26 γ | A | 0.93 | 0.0033 | 26 | 76 | 0.5 | 5.2 |
| | 27 δ | B | 0.88 | 0.0030 | 48 | 96 | 0.7 | 3.5 |
| | 28 α | C | 0.84 | 0.0016 | 62 | 100 | 1.3 | 10.0 |
| | 29 β | D | 0.73 | Equal to or smaller than 0.0001 | 32 | 100 | 0.8 | 2.0 |

TABLE 13-continued

| | | | | | | | | | |
|---|---|---|---|---|---|---|---|---|---|
| | 30 | γ | E | 0.78 | Equal to or smaller than 0.0001 | 45 | 100 | 0.7 | 2.8 |

| | | Hard coating layer | | | | | | | |
|---|---|---|---|---|---|---|---|---|---|
| | | CrAl complex nitride layer and carbonitride layer $(Cr_{1-x}Al_x)(C_yN_{1-y})$ | | | | | | | |
| | | Frequency distribution ratio $M_{deg}$ present in range of 0 to 12 degrees regarding inclined angle of a normal line on {001} plane in region on tool body side | Frequency distribution ratio $N_{deg}$ present in range of 0 to 12 degrees regarding inclined angle of normal line on {001} plane in region on surface side | Inclined angle section showing highest peak in region on surface side (degree) | Target layer thickness (μm) | Upper layer (numerical value at the bottom indicates target average layer thickness (μm) of layer) | | | |
| Type | | | | | | First layer | Second layer | Third layer | Fourth layer |
| Present invention coated tool | 16 | 39 | 51 | 9.25-9.50 | 7 | — | — | — | — |
| | 17 | 29 | 58 | 2.75-3.00 | 3 | — | — | — | — |
| | 18 | 34 | 64 | 0.50-0.75 | 8 | — | — | — | — |
| | 19 | 29 | 42 | 4.75-5.00 | 4 | — | — | — | — |
| | 20 | 36 | 52 | 6.25-6.50 | 16 | — | — | — | — |
| | 21 | 24 | 43 | 7.25-7.50 | 12 | — | — | — | — |
| | 22 | 35 | 53 | 5.25-5.50 | 20 | TiN-2 (0.7) | — | — | — |
| | 23 | 16 | 39 | 11.00-11.25 | 15 | TiCN (0.4) | TiN-2 (0.3) | — | — |
| | 24 | 29 | 47 | 9.50-9.75 | 7 | $Al_2O_3$ (2) | — | — | — |
| | 25 | 19 | 40 | 6.00-6.25 | 6 | TiCN (0.5) | $Al_2O_3$ (2.5) | — | — |
| | 26 | 37 | 55 | 7.00-7.25 | 9 | TiCO (1) | $Al_2O_3$ (2) | — | — |
| | 27 | 30 | 59 | 6.00-6.25 | 5 | TiCNO (0.3) | $Al_2O_3$ (1) | — | — |
| | 28 | 32 | 61 | 1.50-1.75 | 16 | TiN-2 (0.3) | TiCN (0.8) | TiCNO (0.3) | $Al_2O_3$ (3) |
| | 29 | 31 | 48 | 6.75-7.00 | 4 | — | — | — | — |
| | 30 | 26 | 48 | 9.50-9.75 | 11 | — | — | — | — |

TABLE 14

| | | Hard coating layer | | | | | | |
|---|---|---|---|---|---|---|---|---|
| | | CrAl complex nitride layer and carbonitride layer $(Cr_{1-x}Al_x)(C_yN_{1-y})$ | | | | | | |
| Type | Tool body symbol | CrAlCN film-forming process formation symbol (see Tables 4 and 5) | Content ratio $x_{avg}$ of Al | Content ratio $y_{avg}$ of C | Area ratio of crystal grains having average crystal grain misorientation equal to or greater than 2 degrees (%) | Area ratio of cubic crystal (%) | Average crystal grain width W of crystal grains (μm) | Average aspect ratio A of crystal grains |
| Comparative coated tool | 16 α | A' | 0.93 | 0.0039 | 5 | 81 | 1.0 | 2.3 |
| | 17 β | B' | 0.87 | 0.0028 | 11 | 98 | 0.4 | 1.8 |
| | 18 γ | C' | 0.83 | 0.0022 | 7 | 100 | 1.0 | 4.6 |
| | 19 δ | D' | 0.69 | Equal to or smaller than 0.0001 | 6 | 100 | 0.7 | 3.2 |
| | 20 α | E' | 0.74 | Equal to or smaller than 0.0001 | 4 | 100 | 0.9 | 3.4 |
| | 21 β | F' | 0.80 | Equal to or smaller than 0.0001 | 5 | 99 | 0.6 | 5.7 |
| | 22 γ | G' | 0.79 | Equal to or smaller than 0.0001 | 5 | 95 | 0.4 | 7.5 |
| | 23 δ | H' | 0.92 | Equal to or smaller than 0.0001 | 4 | 66 | 0.2 | 5.9 |
| | 24 α | I' | 0.71 | Equal to or smaller than 0.0001 | 4 | 100 | 0.4 | 0.8 |
| | 25 β | J' | 0.93 | Equal to or smaller than 0.0001 | 6 | 89 | 0.9 | 2.7 |

TABLE 14-continued

|  |  |  |  |  |  |  |  |  |
|---|---|---|---|---|---|---|---|---|
|  | 26 | γ | A' | 0.94 | 0.0043 | 8 | 78 | 0.9 | 2.6 |
|  | 27 | δ | B' | 0.89 | 0.0019 | 10 | 94 | 0.5 | 2.7 |
|  | 28 | α | C' | 0.87 | 0.0019 | 5 | 100 | 1.00 | 8.5 |
| Reference coated tool | 29 | β | AIP | 0.68 | Equal to or smaller than 0.0001 | 5 | 100 | 1.4 | 3.6 |
|  | 30 | γ | AIP | 0.60 | Equal to or smaller than 0.0001 | 7 | 100 | 0.8 | 4.1 |

| | Hard coating layer | | | | | | | |
|---|---|---|---|---|---|---|---|---|
| | CrAl complex nitride layer and carbonitride layer ($Cr_{1-x}Al_x$)($C_yN_{1-y}$) | | | | | | | |
| | Frequency distribution ratio $M_{deg}$ present in range of 0 to 12 degrees regarding inclined angle of normal line on {001} plane in region on tool body side | Frequency distribution ratio $N_{deg}$ present in range of 0 to 12 degrees regarding inclined angle of normal line on {001} plane in region on surface side | Inclined angle section showing highest peak in region on surface side (degree) | Target layer thickness (μm) | Upper layer (numerical value at the bottom indicates target average layer thickness (μm) of layer | | | |
| Type | | | | | First layer | Second layer | Third layer | Fourth layer |
| Comparative coated tool | 16 | 33 | 26 | 15.25-15.50 | 7 | — | — | — | — |
| | 17 | 24 | 21 | 27.25-27.50 | 3 | — | — | — | — |
| | 18 | 34 | 21 | 34.25-34.50 | 8 | — | — | — | — |
| | 19 | 26 | 32 | 31.00-31.25 | 4 | — | — | — | — |
| | 20 | 28 | 26 | 29.25-29.50 | 16 | — | — | — | — |
| | 21 | 29 | 34 | 35.75-36.00 | 12 | — | — | — | — |
| | 22 | 22 | 18 | 40.50-40.75 | 20 | TiN-2 (0.7) | — | — | — |
| | 23 | 34 | 28 | 37.25-37.50 | 15 | TiCN (0.4) | TiN-2 (0.3) | — | — |
| | 24 | 25 | 28 | 23.25-23.50 | 7 | $Al_2O_3$ (2) | — | — | — |
| | 25 | 34 | 41 | 16.50-16.75 | 6 | TiCN (0.5) | $Al_2O_3$ (2.5) | — | — |
| | 26 | 31 | 23 | 16.50-16.75 | 9 | TiCO (1) | $Al_2O_3$ (2) | — | — |
| | 27 | 31 | 27 | 34.75-35.00 | 5 | TiCNO (0.3) | $Al_2O_3$ (1) | — | — |
| | 28 | 36 | 19 | 34.25-34.50 | 16 | TiN-2 (0.3) | TiCN (0.8) | TiCNO (0.3) | $Al_2O_3$ (3) |
| Reference coated tool | 29 | 32 | 41 | 32.25-32.50 | 4 | — | — | — | — |
| | 30 | 29 | 24 | 33.00-33.25 | 11 | — | — | — | — |

(Note)
"AIP" indicates a film formed through arc ion plating.

Next, in a state in which each of the various coated tools was screwed to a tip end portion of an insert holder of tool steel by a fixing tool, the present invention coated tools 16 to 30, the comparative coated tools 16 to 28, and the reference coated tools 29 and 30 were subjected to a dry high-speed intermittent cutting test for carbon steel and a wet high-speed intermittent cutting test for ductile cast iron, which are described below, and a wear width of a flank face of a cutting edge was measured.

Cutting conditions 1:
Work material: a round bar of JIS S15C with four longitudinal grooves formed at equal intervals in the longitudinal direction
Cutting speed: 430 m/min
Depth of cut: 1.5 mm
Feed rate: 0.22 mm/rev
Cutting time: 5 minutes
(a typical cutting speed is 220 m/min)

Cutting conditions 2:
Work material: a round bar of JIS FCD450 with four longitudinal grooves formed at equal intervals in the longitudinal direction
Cutting speed: 410 m/min
Depth of cut: 1.0 mm
Feed rate: 0.22 mm/rev
Cutting time: 5 minutes
(a typical cutting speed is 200 m/min)

The results of the cutting test are shown in Table 15.

TABLE 15

| | | Wear width of flank face (mm) | | | | Cutting test results (min) | |
|---|---|---|---|---|---|---|---|
| Type | | Cutting conditions 1 | Cutting conditions 2 | Type | | Cutting conditions 1 | Cutting conditions 2 |
| Present invention coated tool | 16 | 0.15 | 0.19 | Comparative coated tool | 16 | 3.9* | 4.1* |
| | 17 | 0.22 | 0.23 | | 17 | 4.2* | 2.7* |
| | 18 | 0.20 | 0.10 | | 18 | 4.5* | 3.9* |
| | 19 | 0.22 | 0.21 | | 19 | 2.3* | 2.5* |

TABLE 15-continued

| | Wear width of flank face (mm) | | | Cutting test results (min) | |
|---|---|---|---|---|---|
| Type | Cutting conditions 1 | Cutting conditions 2 | Type | Cutting conditions 1 | Cutting conditions 2 |
| 20 | 0.22 | 0.22 | 20 | 3.4* | 1.9* |
| 21 | 0.13 | 0.17 | 21 | 4.8* | 1.8* |
| 22 | 0.17 | 0.14 | 22 | 4.3* | 3.8* |
| 23 | 0.23 | 0.23 | 23 | 2.4* | 4.4* |
| 24 | 0.18 | 0.20 | 24 | 3.2* | 2.4* |
| 25 | 0.21 | 0.22 | 25 | 4.0* | 2.4* |
| 26 | 0.20 | 0.12 | 26 | 3.6* | 4.3* |
| 27 | 0.10 | 0.13 | 27 | 4.4* | 3.6* |
| 28 | 0.12 | 0.11 | 28 | 4.7* | 2.3* |
| 29 | 0.19 | 0.21 | Reference 29 | 2.9* | 2.8* |
| 30 | 0.21 | 0.16 | coated tool 30 | 2.5* | 4.2* |

Mark * in boxes of comparative coated tools and reference coated tools indicates a cutting time (min) until the end of a service life caused by the occurrence of chipping.

From the results shown in Tables 9 and 15, regarding the coated tools of the invention, the predetermined average crystal grain misorientation is present in the crystal grains having a cubic structure configuring the layer of a complex nitride or complex carbonitride of Al and Cr configuring the hard coating layer, and an inclined angle formed by a normal line of the {100} plane in the region on the tool body side and the region on the surface side of the crystal grain has a predetermined inclined angle frequency distribution. Accordingly, hardness is improved due to the strain of the crystal grain, and toughness is improved while maintaining high wear resistance. In addition, it is clear that, even in a case of being used for high-speed intermittent cutting during which intermittent and impact loads are exerted on a cutting edge, excellent chipping resistance and fracture resistance are exhibited, resulting in exhibiting excellent wear resistance for long-term usage.

Contrary to this, it is apparent that, regarding the comparative coated tools 1 to 13, and 16 to 28, and the reference coated tools 14, 15, 29, and 30 in which the predetermined average crystal grain misorientation is not present in the crystal grains having a cubic structure configuring the layer of a complex nitride or complex carbonitride of Al and Or configuring the hard coating layer, or the inclined angle formed by a normal line of the {100} plane in the region on the tool body side and the region on the surface side of the crystal grain does not have a predetermined inclined angle frequency distribution, in a case of being used for high-speed intermittent cutting during which high-temperature heat is generated and intermittent and impact loads are exerted on a cutting edge, end of the service life occurs within a short cycle of time due to occurrence of chipping, fracture, and the like.

EXAMPLE 3

As raw material powders, a WC powder, a TiC powder, a TaC powder, an NbC powder, a $Cr_3C_2$ powder, and a Co powder, all of which had an average grain size of 1 to 3 μm, were prepared, and the raw material powders were mixed in mixing compositions shown in Table 16. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies E to G made of WC-based cemented carbide with insert shapes according to ISO standard SEEN1203AFSN were produced.

In addition, as raw material powders, a TiCN (TiC/TiN=50/50 in terms of mass ratio) powder, an $Mo_2C$ powder, a ZrC powder, an NbC powder, a WC powder, a Co powder, and an Ni powder, all of which had an average grain size of 0.5 to 2 μm, were prepared, and the raw material powders were mixed in mixing compositions shown in Table 17, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a tool body H made of TiCN-based cermet with insert shapes according to ISO standard SEEN1203AFSN was produced.

Next, present invention coated tools 31 to 45 were produced by forming a hard coating layer formed of a $(Ti_{1-\alpha-\beta}Al_\alpha Me_\beta)(Cr_\gamma N_{1-\gamma})$ layer which has a target layer thickness shown in Table 22 and in which crystal grains having a cubic structure having average crystal grain misorientation equal to or greater than 2 degrees shown in Table 22 are present at an area ratio shown in Table 22 on surfaces of the tool bodies E to H through a thermal CVD method for a predetermined time using a chemical vapor deposition apparatus, under forming conditions shown in Tables 19 and 20, in which a group A of $NH_3$ and $H_2$, and a gas group B of $TiCl_4$, $Al(CH_3)_3$, $AlCl_3$, MeCln (here, any of $SiCl_4$, $ZrCl_4$, $BCl_3$, $VCl_4$, and $CrCl_2$), $N_2$, and $H_2$ were used and in each gas supply method, a reaction gas composition (% by volume with respect to the total amount of the gas group A and the gas group B) included a gas group A of $NH_3$: 4.0% to 6.0%, $H_2$: 65% to 75%, and a gas group B of $AlCl_3$: 0.6% to 0.9%, $TiCl_4$: 0.2% to 0.3%, $Al(CH_3)_3$: 0% to 0.5%, MeCln (here, any of $SiCl_4$, $ZrCl_4$, $BCl_3$, $VCl_4$, and $CrCl_2$): 0.1% to 0.2%, $N_2$: 12.5% to 15.0%, $H_2$: the remainder, a reaction atmosphere pressure was 4.5 kPa to 5.0 kPa, a reaction atmosphere temperature was 700° C. to 900° C., a supply cycle was 1 second to 5 seconds, a gas supply time per one cycle was 0.15 to 0.25 seconds, and a phase difference between gas supply A and gas supply B was 0.10 to 0.20 seconds.

In addition, a lower layer shown in Table 21 and/or an upper layer shown in Table 22 were formed on the present invention coated tools 36 to 43 under forming conditions shown in Table 18.

In addition, for the purpose of comparison, hard coating layers including at least a layer of a complex nitride or complex carbonitride of Ti, Al, and Me were deposited on the surfaces of the tool bodies E to H to have a target layer thickness (μm) shown in Table 23, under the conditions shown in Tables 19 and 20, in the same manner as in the present invention coated tools 31 to 45. At this time, comparative coated tools 31 to 45 were produced by forming the hard coating layers so that the composition of the reaction gas on the surface of the tool body was not changed over time during a process of forming a $(Ti_{1-\alpha-\beta}Al_\alpha Me_\beta)(C_\gamma N_{1-\gamma})$ layer.

In addition, in the same manner as in the present invention coated tools 36 to 43, a lower layer shown in Table 21 and/or an upper layer shown in Table 23 were formed on the comparative coated tools 36 to 43 under forming conditions shown in Table 18.

The section of each of constituent layers of the present invention coated tools 31 to 45 and the comparative coated tools 31 to 45 in a direction perpendicular to the tool body was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 21 to 23.

In addition, regarding the average content ratio of Al and the average content ratio of Me of the layer of a complex nitride or complex carbonitride, a sample of which the surface was polished was irradiated with electron beams from the sample surface side by using an electron probe micro-analyzer (EPMA), and the average content ratio $\alpha_{avg}$ of Al and the average content ratio $\beta_{avg}$ of Me were obtained by averaging 10 points of the analytic result of obtained characteristic X-rays. The average content ratio $\gamma_{avg}$ of C was obtained by secondary ion mass spectrometry (SIMS). Ion beams were emitted toward a range of 70 μm×70 μm from the sample surface side, and the concentration in a depth direction of components emitted by a sputtering action was measured. The average content ratio $\gamma_{avg}$ of C represents the average value in the depth direction of the layer of a complex nitride or complex carbonitride of Ti, Al, and Me. However, the content ratio of C excludes a content ratio of inevitable C which is included even though gas containing C is not intentionally used as a gas raw material. Specifically, the content ratio (atomic ratio) of the component C contained in the layer of a complex nitride or complex carbonitride in a case where the amount of supplied $Al(CH_3)_3$ was set to 0 was obtained as the content ratio of inevitable C, and a value obtained by subtracting the content ratio of inevitable C from the content ratio (atomic ratio) of the component C contained in the layer of a complex nitride or complex carbonitride obtained in a case where $Al(CH_3)_3$ was intentionally supplied was selected to be $\gamma_{avg}$. The results thereof are shown in Tables 22 and 23.

In a case where crystal orientation of each crystal grain having a cubic structure configuring the layer of a complex nitride or complex carbonitride of Ti, Al, and Me was analyzed in the vertical cross-sectional direction by using an electron beam backward scattering diffraction device and misorientation equal to or greater than 5 degrees was obtained between adjacent pixels, this point was set as a boundary and a region surrounded by the boundary was set as one crystal grain. The average crystal grain misorientation between the pixel in the crystal grain and all of the other pixels in the same crystal grain was acquired. Mapping was performed by partitioning the ranges of the average crystal grain misorientation which is 0 to 10 degrees by 1 degree by dividing the ranges into a range of average crystal grain misorientation equal to or greater than 0 degrees and smaller than 1 degree, equal to or greater than 1 degree and smaller than 2 degrees, equal to or greater than 2 degrees and smaller than 3 degrees, equal to or greater than 3 degrees and smaller than 4 degrees, . . . . From this mapped diagram, the area ratio of the crystal grain having the average crystal grain misorientation equal to or greater than 2 degrees occupying the total area of the layer of a complex nitride or complex carbonitride of Ti, Al, and Me was acquired. The results thereof are shown in Tables 22 and 23.

FIG. 5 shows an example of the histogram of the average crystal grain misorientation measured regarding the present invention coated tool, and FIG. 6 shows an example of the histogram of the average crystal grain misorientation measured regarding the comparative coated tool.

Regarding inclined angle frequency distribution of the hard coating layer, ratios $M_{deg}$ and $N_{deg}$ of frequencies present in a range of angles where the highest peak is present and the range of 0 to 12 degrees in the inclined angle section in the region on the surface side were obtained by setting a cross section of the hard coating layer formed of a complex carbonitride layer of Ti, Al, and Me having a cubic structure in a body tube of an electron emission type scanning electron microscope in a state of a polished surface, dividing the polished surface in half in a layer thickness direction to have a region on a tool body surface (tool body) side and a region on a surface side and analyzing the regions, irradiating individual crystal grains having a cubic crystal lattice present in a measurement range of the region on the boundary side and the region of the surface side regarding the vertical direction of the tool body, and in a measurement range having a width of 10 μm in 5 visual fields at an interval of 0.1 μm/step regarding the horizontal direction of the tool body, with an electron beam having an incidence angle of 70 degrees and an accelerating voltage of 10 kV with an illumination current of 1 nA, measuring an inclined angle formed by a normal line of the {100} plane as a crystal plane of the crystal grain with respect to a normal line of the surface of the tool body (direction perpendicular to the surface of the tool body on the polished section) by using an electron beam backward scattering diffraction image device, sectioning the measured inclined angle in a range of 0 to 45 degrees among the measured inclined angles at a pitch of 0.25 degrees based on the measurement result, and adding up the frequencies present in each section. The results thereof are shown in Tables 22 and 23.

Figure 9:
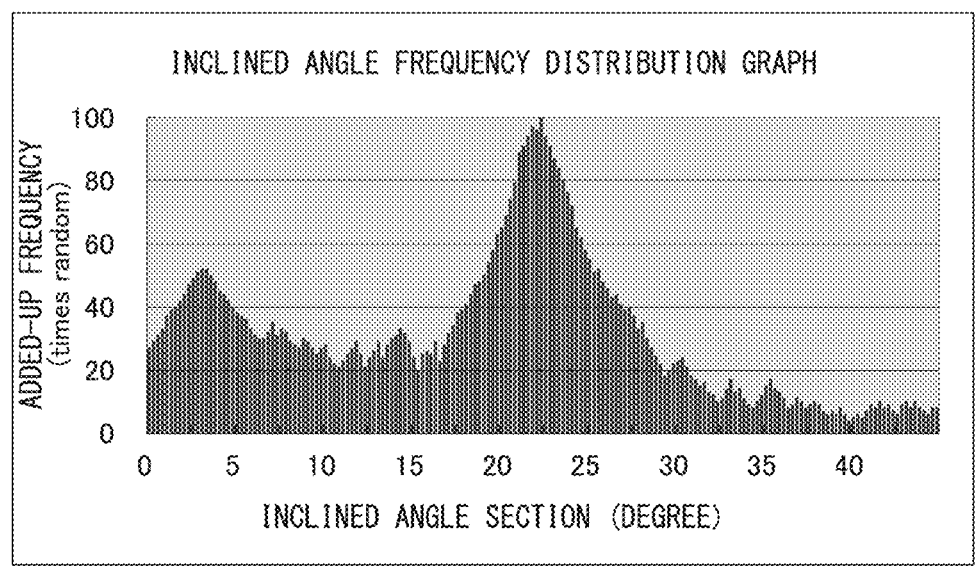
FIG. 9 is an example of a drawn inclined angle frequency distribution graph of a {100} plane in a region on the tool body side of the layer of a complex nitride or complex carbonitride of Ti, Al, and Me configuring the hard coating layer of the present invention coated tool.
Figure 10:
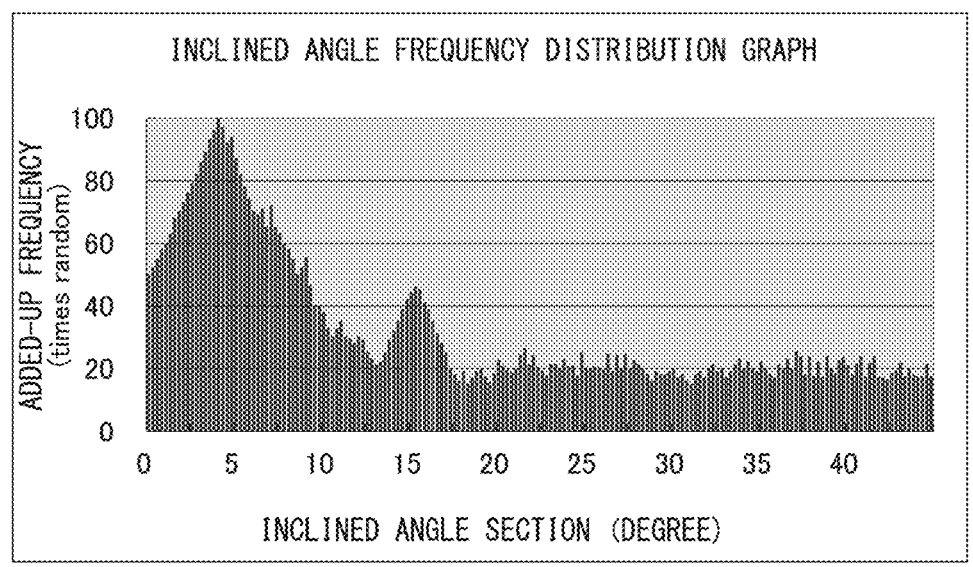
FIG. 10 is an example of a drawn inclined angle frequency distribution graph of a {100} plane in a region on the surface side of the layer of a complex nitride or complex carbonitride of Ti, Al, and Me configuring the hard coating layer of the present invention coated tool.

FIG. 9 shows an example of the inclined angle frequency distribution measured regarding the region on the tool body side of the hard coating layer formed of the layer of a complex nitride or complex carbonitride of Ti, Al, and Me of the present invention coating tool, and FIG. 10 shows an example of the inclined angle frequency distribution measured regarding the region on the surface side of the hard coating layer formed of the layer formed of the layer of a complex nitride or complex carbonitride of Ti, Al, and Me of the present invention coating tool.

Analysis at an interval of 0.1 μm in a vertical cross-sectional direction was performed by using the electron beam backward scattering diffraction device, measurement in the measurement range of a width of 10 μm and a height of a film thickness in the vertical cross-sectional direction was performed in 5 visual fields, the number of all pixels belonging to the crystal grain having a cubic structure configuring the layer of a complex nitride or complex carbonitride was acquired, and an area ratio of the crystal grain having a cubic structure configuring the layer of a complex nitride or complex carbonitride was obtained by the ratio with respect to the number of all pixels in the measurement with respect to the hard coating layer in the 5 visual fields. The results thereof are shown in Tables 22 and 23.

In addition, regarding the present invention coated tools 31 to 45 and the comparative coated tools 31 to 45, individual crystal grains in the $(Ti_{1-\alpha-\beta}Al_\alpha Me_\beta)(Cr_\gamma N_{1-\gamma})$ layer configuring the layer of a complex nitride or complex carbonitride of Ti, Al, and Me present in a range of a length of 10 μm in a direction parallel to the surface of the tool body were observed from the film cross section side perpendicular to the surface of the tool body by using a scanning electron microscope (at a magnification of 5000× or 20000×) in a cross-sectional direction of a direction perpendicular to the tool body, the crystal grain width w in a direction parallel to the surface of the body and a crystal grain length l in a direction perpendicular to the surface of the body were measured, an aspect ratio a (=l/w) of each crystal grain was calculated, an average value of the aspect ratios a obtained regarding individual crystal grains was calculated as the average aspect ratio A, and an average value of the crystal grain width w obtained regarding the individual crystal grains was calculated as the average crystal grain width W. The results thereof are shown in Tables 22 and 23.

TABLE 16

| | Type | \multicolumn{6}{c}{Mixing composition (% by mass)} |
| --- | --- | --- | --- | --- | --- | --- | --- |
| | | Co | TiC | TaC | NbC | $Cr_3C_2$ | WC |
| Tool body | E | 8.0 | 1.5 | — | 3.0 | 0.4 | Remainder |
| | F | 8.5 | — | 1.8 | 0.2 | — | Remainder |
| | G | 7.0 | — | — | — | — | Remainder |

TABLE 17

| | Type | \multicolumn{7}{c}{Mixing composition (% by mass)} |
| --- | --- | --- | --- | --- | --- | --- | --- | --- |
| | | Co | Ni | ZrC | NbC | $Mo_2C$ | WC | TiCN |
| Tool body | H | 8 | 5 | 1 | 6 | 6 | 10 | Remainder |

TABLE 18

| Constituent layers of hard coating layer | | | Forming conditions (pressure of reaction atmosphere indicates kPa and temperature indicates °C.) | | |
| --- | --- | --- | --- | --- | --- |
| | | Formation | Reaction gas composition | Reaction atmosphere | |
| Type | | symbol | (% by volume) | Pressure | Temperature |
| $(Ti_{1-a-\beta}Al_\alpha Me_\beta)(C_\gamma N_{1-\gamma})$ layer | | | See Tables 19 and 20 | | |
| Ti compound layer | TiC | TiC | $TiCl_4$: 2%, $CH_4$: 10%, $H_2$: remainder | 7 | 850 |
| | TiN | TiN | $TiCl_4$: 4.2%, $N_2$: 30%, $H_2$: remainder | 30 | 780 |
| | TiCN | TiCN | $TiCl_4$: 2%, $CH_3CN$: 0.7%, $N_2$: 10%, $H_2$: remainder | 7 | 780 |
| | TiCO | TiCO | $TiCl_4$: 4.2%, CO: 4%, $H_2$: remainder | 7 | 850 |
| | TiCNO | TiCNO | $TiCl_4$: 2%, $CH_3CN$: O. 7%, $N_2$: 10%, $CO_2$: 0.3% $H_2$: remainder | 13 | 780 |
| $Al_2O_3$ layer | $Al_2O_3$ | $Al_2O_3$ | $AlCl_3$: 2.2%, $CO_2$: 5.5%, HCl: 2.2%, $H_2S$: 0.8%, $H_2$: remainder | 7 | 800 |

TABLE 19

| Formation of hard coating layer | | Forming conditions (reaction gas composition indicates proportion in total amount of gas group A and gas group B) | |
| --- | --- | --- | --- |
| Process type | Formation symbol | Reaction gas group A composition (% by volume) | Reaction gas group B composition (% by volume) |
| Present invention film-forming process | Si-A | $NH_3$: 4.5%, $H_2$: 70%, | $AlCl_3$: 0.6%, $TiCl_4$: 0.2%, $SiCl_4$: 0.1%, $N_2$: 13.0%, $Al(CH_3)_3$: 0%, $H_2$ as remainder |
| | Si-B | $NH_3$: 5.5%, $H_2$: 66%, | $AlCl_3$: 0.8%, $TiCl_4$: 0.2%, $SiCl_4$: 0.1%, $N_2$: 14.0%, $Al(CH_3)_3$: 0.2%, $H_2$ as remainder |
| | Si-C | $NH_3$: 4.0%, $H_2$: 67%, | $AlCl_3$: 0.9%, $TiCl_4$: 0.3%, $SiCl_4$: 0.2%, $N_2$: 13.5%, $Al(CH_3)_3$: 0%, $H_2$ as remainder |
| | Zr-A | $NH_3$: 6.0%, $H_2$: 73%, | $AlCl_3$: 0.6%, $TiCl_4$: 0.3%, $ZrCl_4$: 0.1%, $N_2$: 15.0%, $Al(CH_3)_3$: 0%, $H_2$ as remainder |
| | Zr-B | $NH_3$: 5.0%, $H_2$: 69%, | $AlCl_3$: 0.7%, $TiCl_4$: 0.2%, $ZrCl_4$: 0.2%, $N_2$: 12.5%, $Al(CH_3)_3$: 0%, $H_2$ as remainder |
| | Zr-C | $NH_3$: 4.5%, $H_2$: 65%, | $AlCl_3$: 0.7%, $TiCl_4$: 0.3%, $ZrCl_4$: 0.1%, $N_2$: 14.0%, $Al(CH_3)_3$: 0%, $H_2$ as remainder |
| | B-A | $NH_3$: 5.0%, $H_2$: 72%, | $AlCl_3$: 0.8%, $TiCl_4$: 0.3%, $BCl_3$: 0.2%, $N_2$: 13.5%, $Al(CH_3)_3$: 0.5%, $H_2$ as remainder |
| | B-B | $NH_3$: 4.5%, $H_2$: 75%, | $AlCl_3$: 0.9%, $TiCl_4$: 0.2%, $BCl_3$: 0.1%, $N_2$: 13.0%, $Al(CH_3)_3$: 0%, $H_2$ as remainder |
| | B-C | $NH_3$: 5.5%, $H_2$: 68%, | $AlCl_3$: 0.6%, $TiCl_4$: 0.2%, $BCl_3$: 0.1%, $N_2$: 14.5%, $Al(CH_3)_3$: 0%, $H_2$ as remainder |
| | V-A | $NH_3$: 6.0%, $H_2$: 70%, | $AlCl_3$: 0.6%, $TiCl_4$: 0.3%, $VCl_4$: 0.2%, $N_2$: 13.0%, $Al(CH_3)_3$: 0%, $H_2$ as remainder |
| | V-B | $NH_3$: 4.0%, $H_2$: 74%, | $AlCl_3$: 0.8%, $TiCl_4$: 0.3%, $VCl_4$: 0.2%, $N_2$: 14.0%, $Al(CH_3)_3$: 0.2%, $H_2$ as remainder |
| | V-C | $NH_3$: 5.0%, $H_2$: 69%, | $AlCl_3$: 0.7%, $TiCl_4$: 0.2%, $VCl_4$: 0.1%, $N_2$: 13.5%, $Al(CH_3)_3$: 0%, $H_2$ as remainder |
| | Cr-A | $NH_3$: 4.5%, $H_2$: 67%, | $AlCl_3$: 0.8%, $TiCl_4$: 0.2%, $CrCl_2$: 0.1%, $N_2$: 13.0%, $Al(CH_3)_3$: 0%, $H_2$ as remainder |
| | Cr-B | $NH_3$: 5.0%, $H_2$: 72%, | $AlCl_3$: 0.6%, $TiCl_4$: 0.3%, $CrCl_2$: 0.2%, $N_2$: 14.5%, $Al(CH_3)_3$: 0.5%, $H_2$ as remainder |
| | Cr-C | $NH_3$: 5.5%, $H_2$: 68%, | $AlCl_3$: 0.9%, $TiCl_4$: 0.2%, $CrCl_2$: 0.1%, $N_2$: 13.0%, $Al(CH_3)_3$: 0%, $H_2$ as remainder |
| Comparative film-forming process | Si-a | $NH_3$: 4.5%, $H_2$: 70%, | $AlCl_3$: 0.7%, $TiCl_4$: 0.1%, $SiCl_4$: 0.1%, $N_2$: 10.0%, $Al(CH_3)_3$: 0%, $H_2$ as remainder |
| | Si-b | $NH_3$: 3.0%, $H_2$: 66%, | $AlCl_3$: 0.6%, $TiCl_4$: 0.3%, $SiCl_4$: 0.2%, $N_2$: 12.5%, $Al(CH_3)_3$: 0.8%, $H_2$ as remainder |
| | Si-c | $NH_3$: 5.5%, $H_2$: 62%, | $AlCl_3$: 0.8%, $TiCl_4$: 0.2%, $SiCl_4$: 0.4%, $N_2$: 13.0%, $Al(CH_3)_3$: 0%, $H_2$ as remainder |
| | Zr-a | $NH_3$: 5.0%, $H_2$: 73%, | $AlCl_3$: 1.2%, $TiCl_4$: 0.2%, $ZrCl_4$: 0.2%, $N_2$: 15.0%, $Al(CH_3)_3$: 0%, $H_2$ as remainder |
| | Zr-b | $NH_3$: 6.0%, $H_2$: 77%, | $AlCl_3$: 0.8%, $TiCl_4$: 0.6%, $ZrCl_4$: 0.2%, $N_2$: 14.0%, $Al(CH_3)_3$: 0%, $H_2$ as remainder |
| | Zr-c | $NH_3$: 7.0%, $H_2$: 69%, | $AlCl_3$: 0.6%, $TiCl_4$: 0.2%, $ZrCl_4$: 0.1%, $N_2$: 17.5%, $Al(CH_3)_3$: 0.2%, $H_2$ as remainder |

TABLE 19-continued

| | | Formation of hard coating layer | Forming conditions (reaction gas composition indicates proportion in total amount of gas group A and gas group B) |
|---|---|---|---|
| Process type | Formation symbol | Reaction gas group A composition (% by volume) | Reaction gas group B composition (% by volume) |
| | B-a | $NH_3$: 4.0%, $H_2$: 75%, | $AlCl_3$: 0.4%, $TiCl_4$: 0.3%, $BCl_3$: 0.1%, $N_2$: 12.5%, $Al(CH_3)_3$: 0%, $H_2$ as remainder |
| | B-b | $NH_3$: 5.0%, Hz: 71%, | $AlCl_3$: 0.7%, $TiCl_4$: 0.2%, $BCl_3$: 0.3%, $N_2$: 13.0%, $Al(CH_3)_3$: 0%, $H_2$ as remainder |
| | B-c | $NH_3$: 4.5%, $H_2$: 80%, | $AlCl_3$: 0.8%, $TiCl_4$: 0.3%, $BCl_3$: 0.2%, $N_2$: 12.5%, $Al(CH_3)_3$: 0%, $H_2$ as remainder |
| | V-a | $NH_3$: 3.5%, $H_2$: 72%, | $AlCl_3$: 0.5%, $TiCl_4$: 0.4%, $VCl_4$: 0.1%, $N_2$: 13.5%, $Al(CH_3)_3$: 0%, $H_2$ as remainder |
| | V-b | $NH_3$: 5.5%, $H_2$: 68%, | $AlCl_3$: 0.9%, $TiCl_4$: 0.3%, $VCl_4$: 0.05%, $N_2$,: 14.0%, $Al(CH_3)_3$: 0%, $H_2$ as remainder |
| | V-c | $NH_3$: 5.0%, $H_2$: 65%, | $AlCl_3$: 0.7%, $TiCl_4$: 0.2%, $VCl_4$: 0.1%, $N_2$: 16.0%, $Al(CH_3)_3$: 1.0%, $H_2$ as remainder |
| | Cr-a | $NH_3$: 4.0%, $H_2$: 60%, | $AlCl_3$: 0.8%, $TiCl_4$: 0.1%, $CrCl_2$: 0.2%, $N_2$: 13.0%, $Al(CH_3)_3$: 0%, $H_2$ as remainder |
| | Cr-b | $NH_3$: 6.5%, $H_2$: 67%, | $AlCl_3$: 0.6%, $TiCl_4$: 0.3%, $CrCl_2$: 0.05%, $N_2$: 14.5%, $Al(CH_3)_3$: 0%, $H_2$ as remainder |
| | Cr-c | $NH_3$: 4.5%, $H_2$: 70%, | $AlCl_3$: 1.1% $TiCl_4$: 0.2%, $CrCl_2$: 0.2%, $N_2$: 9.0%, $Al(CH_3)_3$: 0.5%, $H_2$ as remainder |

TABLE 20

| | | Forming conditions (pressure of reaction atmosphere indicates kPa and temperature indicates ° C.) | | | | | | |
|---|---|---|---|---|---|---|---|---|
| Formation of hard coating layer | | Gas group A | | Gas group B | | Phase difference in supply between gas group A and gas group B | Reaction atmosphere | |
| Process type | Formation symbol | Supply cycle (sec) | Supply time per one cycle (sec) | Supply cycle (sec) | Supply time per one cycle (sec) | (sec) | Pressure | Temperature |
| Present invention film-forming process | Si-A | 2 | 0.15 | 2 | 0.15 | 0.10 | 4.5 | 750 |
| | Si-B | 5 | 0.25 | 5 | 0.25 | 0.20 | 5.0 | 850 |
| | Si-C | 4 | 0.25 | 4 | 0.25 | 0.20 | 4.7 | 800 |
| | Zr-A | 1 | 0.15 | 1 | 0.15 | 0.10 | 4.7 | 800 |
| | Zr-B | 2 | 0.2 | 2 | 0.2 | 0.15 | 5.0 | 900 |
| | Zr-C | 3 | 0.2 | 3 | 0.2 | 0.15 | 4.7 | 700 |
| | B-A | 4 | 0.25 | 4 | 0.25 | 0.20 | 4.5 | 850 |
| | B-B | 3 | 0.2 | 3 | 0.2 | 0.15 | 5.0 | 750 |
| | B-C | 3 | 0.2 | 3 | 0.2 | 0.15 | 4.7 | 850 |
| | V-A | 2 | 0.15 | 2 | 0.15 | 0.10 | 5.0 | 800 |
| | V-B | 1 | 0.15 | 1 | 0.15 | 0.10 | 4.5 | 900 |
| | V-C | 2 | 0.15 | 2 | 0.15 | 0.10 | 4.7 | 700 |
| | Cr-A | 4 | 0.2 | 4 | 0.2 | 0.15 | 4.7 | 800 |
| | Cr-B | 2 | 0.15 | 2 | 0.15 | 0.10 | 5.0 | 850 |
| | Cr-C | 3 | 0.2 | 3 | 0.2 | 0.15 | 4.5 | 800 |
| Comparative film-forming process | Si-a | — | — | — | — | — | 4.7 | 800 |
| | Si-b | — | — | — | — | — | 4.0 | 900 |
| | Si-c | — | — | — | — | — | 4.7 | 750 |
| | Zr-a | — | — | — | — | — | 5.0 | 650 |
| | Zr-b | — | — | — | — | — | 4.5 | 800 |
| | Zr-c | — | — | — | — | — | 6.0 | 950 |
| | B-a | — | — | — | — | — | 5.0 | 750 |
| | B-b | — | — | — | — | — | 4.5 | 700 |
| | B-c | — | — | — | — | — | 4.7 | 950 |
| | V-a | — | — | — | — | — | 4.7 | 850 |
| | V-b | — | — | — | — | — | 5.5 | 800 |
| | V-c | — | — | — | — | — | 4.7 | 850 |
| | Cr-a | — | — | — | — | — | 4.5 | 600 |
| | Cr-b | — | — | — | — | — | 3.0 | 750 |
| | Cr-c | — | — | — | — | — | 4.7 | 900 |

TABLE 21

| | | Hard coating layer (numerical value at the bottom indicates target average layer thickness (μm) of layer) | | |
|---|---|---|---|---|
| | | Lower layer | | |
| Type | | First layer | Second layer | Third layer |
| Present invention coated tool, comparative coated tool | 31 | — | — | |
| | 32 | — | — | |
| | 33 | — | — | |
| | 34 | — | — | |
| | 35 | — | — | |
| | 36 | TiC (0.5) | — | — |
| | 37 | TiN (0.3) | — | |
| | 38 | TiN (0.5) | TiCN (1) | — |
| | 39 | TiN (0.3) | TiCN (3) | |
| | 40 | TiN (0.1) | — | |
| | 41 | TiN (0.5) | TiCN (2) | — |

TABLE 21-continued

Hard coating layer (numerical value at the bottom indicates target average layer thickness (μm) of layer)

Lower layer

| Type | First layer | Second layer | Third layer |
|---|---|---|---|
| 42 | TiN (0.1) | TiCN (1) | — |
| 43 | TiN (0.3) | — | — |
| 44 | — | — | — |
| 45 | — | — | — |

TABLE 22

Hard coating layer

TiAlMe complex nitride layer $(Ti_{1-\alpha-\beta}Al_\alpha Me_\beta)(C_\gamma N_{1-\gamma})$

| Type | | Tool body symbol | TiAlMeCN film-forming process formation symbol (see Tables 19 and 20) | Average content ratio $\alpha_{avg}$ of Al | Average content ratio $\beta_{avg}$ of Me | Sum of average content ratios of Al and Me $\alpha_{avg} + \beta_{avg}$ | Average content ratio $\gamma_{avg}$ of C | Area ratio of crystal grain having average crystal grain misorientation equal to or greater than 2 degrees (%) |
|---|---|---|---|---|---|---|---|---|
| Present invention coated tool | 31 | E | Si-A | 0.78 | 0.044 | 0.824 | Equal to or smaller than 0.0001 | 28 |
| | 32 | F | Si-B | 0.90 | 0.015 | 0.915 | 0.0016 | 67 |
| | 33 | G | Si-C | 0.81 | 0.072 | 0.882 | Equal to or smaller than 0.0001 | 58 |
| | 34 | H | Zr-A | 0.62 | 0.031 | 0.651 | Equal to or smaller than 0.0001 | 39 |
| | 35 | E | Zr-B | 0.85 | 0.093 | 0.943 | Equal to or smaller than 0.0001 | 44 |
| | 36 | F | Zr-C | 0.66 | 0.017 | 0.677 | Equal to or smaller than 0.0001 | 32 |
| | 37 | G | B-A | 0.73 | 0.084 | 0.814 | 0.0048 | 64 |
| | 38 | H | B-B | 0.94 | 0.008 | 0.948 | Equal to or smaller than 0.0001 | 47 |
| | 39 | E | B-C | 0.79 | 0.042 | 0.832 | Equal to or smaller than 0.0001 | 53 |
| | 40 | F | V-A | 0.60 | 0.097 | 0.697 | Equal to or smaller than 0.0001 | 49 |
| | 41 | G | V-B | 0.75 | 0.075 | 0.825 | 0.0008 | 55 |
| | 42 | H | V-C | 0.86 | 0.037 | 0.897 | Equal to or smaller than 0.0001 | 22 |
| | 43 | E | Cr-A | 0.89 | 0.019 | 0.909 | Equal to or smaller than 0.0001 | 60 |
| | 44 | F | Cr-B | 0.63 | 0.090 | 0.720 | 0.0039 | 57 |
| | 45 | G | Cr-C | 0.94 | 0.007 | 0.947 | Equal to or smaller than 0.0001 | 46 |

Hard coating layer

TiAlMe complex nitride layer $(Ti_{1-\alpha-\beta}Al_\alpha Me_\beta)(C_\gamma N_{1-\gamma})$

| Type | | Frequency distribution ratio $M_{deg}$ present in range of 0 to 12 degrees of inclined angle of normal line of {100} plane in region on tool body side | Frequency distribution ratio $N_{deg}$ present in range of 0 to 12 degrees of inclined angle of normal line of {100} plane in region on surface side | Inclined angle section showing highest peak in region on surface side (degree) | Area ratio of cubic crystal (%) | Average crystal grain width W of cubic crystal grains (μm) | Average aspect ratio A of cubic crystal grains | Target layer thickness (μm) | Upper layer (numerical value at the bottom indicates target average layer thickness (μm) of layer) | |
|---|---|---|---|---|---|---|---|---|---|---|
| | | | | | | | | | First layer | Second layer |
| Present invention coated tool | 31 | 18 | 34 | 11.5-11.75 | 93 | 0.8 | 6.0 | 5 | — | — |
| | 32 | 29 | 51 | 4.0-4.25 | 78 | 1.2 | 3.2 | 4 | — | — |
| | 33 | 14 | 33 | 10.5-10.75 | 94 | 0.4 | 5.4 | 3 | — | — |
| | 34 | 37 | 55 | 3.5-3.75 | 100 | 0.2 | 13.6 | 7 | — | — |

TABLE 22-continued

| | | | | | | | | | |
|---|---|---|---|---|---|---|---|---|---|
| 35 | 23 | 38 | 8.75-9.0 | 64 | 0.07 | 19.6 | 5 | — | — |
| 36 | 20 | 40 | 7.5-7.75 | 100 | 0.5 | 5.8 | 3 | — | — |
| 37 | 25 | 48 | 5.25-5.5 | 73 | 1.4 | 2.3 | 4 | — | — |
| 38 | 21 | 42 | 6.75-7.0 | 60 | 0.1 | 16.9 | 2 | — | — |
| 39 | 31 | 44 | 6.0-6.25 | 94 | 1.6 | 0.6 | 1 | — | — |
| 40 | 39 | 64 | 0.75-1.0 | 98 | 0.3 | 6.5 | 2 | TiCN (0.5) | $Al_2O_3$ (2) |
| 41 | 12 | 37 | 11.0-11.25 | 82 | 1.3 | 2.1 | 3 | TiCNO (0.3) | $Al_2O_3$ (1) |
| 42 | 22 | 45 | 5.75-6.0 | 85 | 0.7 | 1.3 | 1 | TiCO (0.5) | $Al_2O_3$ (2) |
| 43 | 15 | 44 | 7.5-7.75 | 70 | 0.9 | 2.1 | 2 | TiCNO (0.3) | $Al_2O_3$ (1) |
| 44 | 24 | 43 | 8.0-8.25 | 84 | 2.2 | 1.5 | 5 | — | — |
| 45 | 30 | 53 | 2.0-2.25 | 61 | 0.6 | 6.5 | 4 | — | — |

TABLE 23

| | | | Hard coating layer TiAlMe complex nitride layer $(Ti_{1-x_{\alpha-\beta}}Al_{x_\alpha}Me_\beta)(C_\gamma N_{1-\gamma})$ | | | | | |
|---|---|---|---|---|---|---|---|---|
| Type | Tool body symbol | TiAlMeCN film-forming process formation symbol (see Tables 19 and 20) | Average content ratio $\alpha_{avg}$ of Al | Average content ratio $\beta_{avg}$ of Me | Sum of average content ratios of Al and Me $\alpha_{avg} + \beta_{avg}$ | Average content ratio $\gamma_{avg}$ of C | Area ratio of crystal grain having average crystal grain misorientation equal to or greater than 2 degree (%) | |
| Comparative coated tool | 31 E | Si-a | 0.97 | 0.027 | 0.997 | Equal to or smaller than 0.0001 | — | |
| | 32 F | Si-b | 0.62 | 0.094 | 0.714 | 0.0063 | 8 | |
| | 33 G | Si-c | 0.87 | 0.128 | 0.998 | Equal to or smaller than 0.0001 | — | |
| | 34 H | Zr-a | 0.96 | 0.038 | 0.998 | Equal to or smaller than 0.0001 | — | |
| | 35 E | Zr-b | 0.53 | 0.062 | 0.592 | Equal to or smaller than 0.0001 | 2 | |
| | 36 F | Zr-c | 0.78 | 0.055 | 0.835 | 0.0014 | 6 | |
| | 37 G | B-a | 0.54 | 0.060 | 0.600 | Equal to or smaller than 0.0001 | 0 | |
| | 38 H | B-b | 0.86 | 0.111 | 0.971 | Equal to or smaller than 0.0001 | 0 | |
| | 39 E | B-c | 0.76 | 0.083 | 0.843 | Equal to or smaller than 0.0001 | 1 | |
| | 40 F | V-a | 0.51 | 0.049 | 0.559 | Equal to or smaller than 0.0001 | 3 | |
| | 41 G | V-b | 0.79 | 0.003 | 0.793 | Equal to or smaller than 0.0001 | 5 | |
| | 42 H | V-c | 0.84 | 0.047 | 0.887 | 0.0108 | 0 | |
| | 43 E | Cr-a | 0.98 | 0.019 | 0.999 | Equal to or smaller than 0.0001 | — | |
| | 44 F | Cr-b | 0.63 | 0.004 | 0.634 | Equal to or smaller than 0.0001 | 3 | |
| | 45 G | Cr-c | 0.96 | 0.038 | 0.998 | 0.0044 | — | |

TABLE 23-continued

Hard coating layer
TiAlMe complex nitride layer $(Ti_{1-x_{\alpha-\beta}}Al_{x_\alpha}Me_\beta)(C_yN1_{-y})$

| Type | | Frequency distribution ratio $M_{deg}$ present in range of 0 to 12 degrees of inclined angle of normal line of {100} plane in region on tool body side | Frequency distribution ratio $N_{deg}$ present in range of 0 to 12 degrees of inclined angle of normal line of {100} plane in region on surface side | Inclined angle section showing highest peak in region on surface side (degree) | Area ratio of cubic crystal (%) | Average crystal grain width W of cubic crystal grains (μm) | Average aspect ratio A of cubic crystal grains | Target layer thickness (μm) | First layer | Second layer |
|---|---|---|---|---|---|---|---|---|---|---|
| Comparative coated tool | 31 | — | — | — | 0 | — | — | 5 | — | — |
| | 32 | 58 | 60 | 2.5-2.75 | 88 | 1.5 | 2.5 | 4 | — | — |
| | 33 | — | — | — | 0 | — | — | 3 | — | — |
| | 34 | — | — | — | 0 | — | — | 7 | — | — |
| | 35 | 63 | 65 | 1.25-1.5 | 100 | 0.5 | 8.6 | 5 | — | — |
| | 36 | 31 | 40 | 9.25-9.5 | 72 | 1.2 | 2.0 | 3 | — | — |
| | 37 | 51 | 53 | 3.25-3.5 | 100 | 0.04 | 35.6 | 4 | — | — |
| | 38 | 21 | 21 | 15.5-15.75 | 24 | 0.3 | 1.1 | 2 | — | — |
| | 39 | 38 | 39 | 7.75-8.0 | 57 | 0.7 | 1.3 | 1 | — | — |
| | 40 | 13 | 11 | 37.25-37.5 | 100 | 1.8 | 1.1 | 2 | TiCN (0.5) | $Al_2O_3$ (2) |
| | 41 | 47 | 53 | 5.5-5.75 | 100 | 1.0 | 2.8 | 3 | TiCNO (0.3) | $Al_2O_3$ (1) |
| | 42 | 41 | 41 | 6.0-6.25 | 78 | 1.6 | 0.2 | 0.5 | TiCO (0.5) | $Al_2O_3$ (2) |
| | 43 | — | — | — | 0 | — | — | 2 | TiCNO (0.3) | $Al_2O_3$ (1) |
| | 44 | 34 | 32 | 17.0-17.25 | 82 | 0.5 | 9.5 | 5 | — | — |
| | 45 | — | — | — | 0 | — | — | 4 | — | — |

(Note 1)
In the comparative coated tools 31, 33, 34, 43, and 45, only hexagonal crystals are observed and cubic crystals are not observed.

Next, in a state in which each of the various coated tools was clamped to a cutter tip end portion made of tool steel having a cutter diameter of 125 mm by a fixing tool, the present invention coated tools 31 to 45 and the comparative coated tools 31 to 45 were subjected to dry high-speed face milling, which is a type of high-speed intermittent cutting of carbon steel, and a center-cut cutting test, and a wear width of a flank face of a cutting edge was measured. Results thereof are shown in Table 24.

Tool body: tungsten carbide-based cemented carbide, titanium carbonitride-based cermet Cutting test: dry high-speed face milling, center-cut cutting Work material: a block material of JIS S55C with a width of 100 mm and a length of 400 mm Rotational speed: 892 min$^{-1}$,
Cutting speed: 350 m/min
Depth of cut: 1.5 mm
Feed per tooth: 0.1 mm/tooth
Cutting time: 8 minutes

TABLE 24

| Type | | Wear width of a flank face (mm) | Type | | Cutting test results (min) |
|---|---|---|---|---|---|
| Present invention coated tool | 31 | 0.15 | Comparative coated tool | 31 | 1.5* |
| | 32 | 0.13 | | 32 | 3.7* |
| | 33 | 0.15 | | 33 | 1.9* |
| | 34 | 0.17 | | 34 | 1.6* |
| | 35 | 0.18 | | 35 | 4.2* |
| | 36 | 0.17 | | 36 | 5.5* |
| | 37 | 0.08 | | 37 | 4.7* |
| | 38 | 0.11 | | 38 | 3.2* |
| | 39 | 0.10 | | 39 | 6.9* |
| | 40 | 0.07 | | 40 | 5.1* |
| | 41 | 0.09 | | 41 | 6.0* |
| | 42 | 0.12 | | 42 | 3.8* |
| | 43 | 0.13 | | 43 | 1.3* |
| | 44 | 0.15 | | 44 | 4.0* |
| | 45 | 0.14 | | 45 | 1.8* |

Mark * in boxes of comparative coated tools indicates a cutting time (min) until the end of a service life caused by the occurrence of chipping.

EXAMPLE 4

As raw material powders, a WC powder, a TiC powder, a ZrC powder, a TaC powder, an NbC powder, a $Cr_3C_2$ powder, a TiN powder, and a Co powder, all of which had an average grain size of 1 to 3 μm, were prepared, and the raw material powders were mixed in mixing compositions shown in Table 25. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, a cutting edge portion was subjected to honing to have a radius R of 0.07 mm, thereby forming tool bodies ε to η made of WC-based cemented carbide with insert shapes according to ISO standard CNMG120412.

In addition, as raw material powders, a TiCN (TiC/TiN=50/50 in terms of mass ratio) powder, an NbC powder, a WC powder, a Co powder, and an Ni powder, all of which had an average grain size of 0.5 to 2 μm, were prepared, and the raw material powders were mixed in mixing compositions shown in Table 26, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a cutting edge portion was subjected to honing to have a radius R of 0.09 mm, thereby forming a tool body θ made of TiCN-based cermet with an insert shape according to ISO standard CNMG120412.

Subsequently, present invention coated tools 46 to 60 shown in Table 28 were produced by depositing hard coating layers including at least a $(Ti_{1-\alpha-\beta}Al_\alpha Me_\beta)(Cr_\gamma N_{1-\gamma})$ layer on the surfaces of the tool bodies ε to η and the tool body θ to have target layer thicknesses using a chemical vapor deposition apparatus under the conditions shown in Tables 19 and 20 by the same method as that in Example 3.

In addition, a lower layer shown in Table 27 and/or an upper layer shown in Table 28 were formed on the present invention coated tools 49 to 58 under the forming conditions shown in Table 18.

In addition, for the purpose of comparison, in the same manner as in the present invention coated tools, comparative coated tools 46 to 60 shown in Table 29 were produced by depositing hard coating layers on the surfaces of the same tool bodies ε to η and the tool body θ to have target layer thicknesses shown in Table 29 under the conditions shown in Tables 19 and 20 using a typical chemical vapor deposition apparatus.

In addition, in the same manner as in the present invention coated tools 49 to 58, a lower layer shown in Table 27 and/or an upper layer shown in Table 29 were formed on the comparative coated tools 49 to 58 under the forming conditions shown in Table 18.

The section of each of constituent layers of the present invention coated tools 46 to 60 and the comparative coated tools 46 to 60 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 27 to 29.

In addition, regarding the hard coating layers of the present invention coated tools 46 to 60 and the comparative coated tools 46 to 60, the average content ratio $\alpha_{avg}$ of Al, the average content ratio $\beta_{avg}$ of Me, the average content ratio $\gamma_{avg}$ of C, inclined angle frequency distribution $M_{deg}$ on tool body side, inclined angle frequency distribution $N_{deg}$ on surface side, range of angle where highest peak is present in the inclined angle section in the region on the surface side, the average crystal grain width W of the crystal grains, the average aspect ratio A, and the area ratio occupying the cubic crystal phase of the crystal grain were obtained by using the same methods as those shown in Example 3. The results thereof are shown in Tables 28 and 29.

In addition, crystal orientation of each crystal grain having a cubic structure configuring the layer of a complex nitride or complex carbonitride of Ti, Al, and Me was analyzed by using an electron beam backward scattering diffraction device, and mapping was performed by partitioning the ranges of the crystal grain misorientation which is 0 to 10 degrees by 1 degree, by partitioning the ranges into a range of crystal grain misorientation equal to or greater than 0 degrees and smaller than 1 degree, equal to or greater than 1 degree and smaller than 2 degrees, equal to or greater than 2 degrees and smaller than 3 degrees, equal to or greater than 3 degrees and smaller than 4 degrees, . . . . From this mapped diagram, the average crystal grain misorientation and the area ratio of the crystal grain having the crystal grain misorientation equal to or greater than 2 degrees occupying the total area of the layer of a complex nitride or complex carbonitride of Ti, Al, and Me were acquired. Results thereof are shown in Tables 28 and 29.

TABLE 25

| Type | | Mixing composition (% by mass) | | | | | | |
|---|---|---|---|---|---|---|---|---|
| | | Co | TiC | ZrC | TaC | NbC | $Cr_3C_2$ | TiN | WC |
| Tool body | ε | 6.5 | — | 1.5 | — | 2.9 | 0.1 | 1.5 | Remainder |
| | ζ | 7.6 | 2.6 | — | 4.0 | 0.5 | — | 1.1 | Remainder |
| | η | 6.0 | — | — | — | — | — | — | Remainder |

TABLE 26

| Type | | Mixing composition (% by mass) | | | | |
|---|---|---|---|---|---|---|
| | | Co | Ni | NbC | WC | TiCN |
| Tool body | θ | 11 | 4 | 6 | 15 | Remainder |

TABLE 27

| | Lower layer (numerical value at the bottom indicates target average layer thickness (μm) of layer) | | | |
|---|---|---|---|---|
| Type | First layer | Second layer | Third layer | Fourth layer |
| Present invention coated tool, comparative coated tool | 46 — | — | — | — |
| | 47 — | — | — | — |
| | 48 — | — | — | — |
| | 49 TiC (0.5) | — | — | — |
| | 50 TiN (0.3) | — | — | — |
| | 51 TiN (0.5) | TiCN (11) | — | — |
| | 52 TiN (0.3) | TiCN (9) | TiN (0.7) | — |
| | 53 TiN (0.5) | TiCN (10) | — | — |
| | 54 — | — | — | — |
| | 55 TiN (0.5) | TiCN (6) | — | — |
| | 56 TiC (1) | TiN (0.3) | — | — |
| | 57 TiN (0.3) | TiCN (8) | — | — |
| | 58 TiN (0.1) | TiCN (4) | — | — |
| | 59 — | — | — | — |
| | 60 — | — | — | — |

TABLE 28

| | | | Hard coating layer | | | | | |
|---|---|---|---|---|---|---|---|---|
| | | | TiAlMe complex nitride layer $(Ti_{1-\alpha-\beta}Al_\alpha Me_\beta)(C_\gamma N1_{-\gamma})$ | | | | | |
| Type | Tool body symbol | TiAlMeCN film-forming process formation symbol (see Tables 19 and 20) | Average content ratio $\alpha_{avg}$ of Al | Average content ratio $\beta_{avg}$ of Me | Sum of average content ratios of Al and Me $\alpha_{avg} + \beta_{avg}$ | Average content ratio $\gamma_{avg}$ of C | Area ratio of crystal grain having average crystal grain misorientation equal to or greater than 2 degrees (%) | Frequency distribution ratio $M_{deg}$ present in range of 0 to 12 degrees of inclined angle of normal line of {100} plane in region on tool body side |
| Present invention coated tool | 46 ε | Si-A | 0.77 | 0.040 | 0.810 | Equal to or smaller than 0.0001 | 23 | 21 |
| | 47 ι | Si-B | 0.88 | 0.013 | 0.893 | 0.0013 | 63 | 33 |
| | 48 η | Si-C | 0.79 | 0.076 | 0.866 | Equal to or smaller than 0.0001 | 55 | 10 |
| | 49 θ | Zr-A | 0.63 | 0.035 | 0.665 | Equal to or smaller than 0.0001 | 40 | 35 |
| | 50 ε | Zr-B | 0.84 | 0.089 | 0.929 | Equal to or smaller than 0.0001 | 48 | 26 |
| | 51 ι | Zr-C | 0.67 | 0.022 | 0.692 | Equal to or smaller than 0.0001 | 30 | 22 |
| | 52 η | B-A | 0.75 | 0.081 | 0.831 | 0.0043 | 66 | 28 |
| | 53 θ | B-B | 0.92 | 0.010 | 0.930 | Equal to or smaller than 0.0001 | 42 | 19 |
| | 54 ε | B-C | 0.76 | 0.044 | 0.804 | Equal to or smaller than 0.0001 | 51 | 27 |
| | 55 ι | V-A | 0.61 | 0.099 | 0.709 | Equal to or smaller than 0.0001 | 43 | 40 |
| | 56 η | V-B | 0.79 | 0.082 | 0.872 | 0.0012 | 59 | 15 |
| | 57 θ | V-C | 0.88 | 0.033 | 0.913 | Equal to or smaller than 0.0001 | 20 | 24 |
| | 58 ε | Cr-A | 0.90 | 0.015 | 0.915 | Equal to or smaller than 0.0001 | 64 | 17 |
| | 59 ι | Cr-B | 0.64 | 0.094 | 0.734 | 0.0045 | 53 | 24 |
| | 60 η | Cr-C | 0.93 | 0.005 | 0.935 | Equal to or smaller than 0.0001 | 42 | 28 |

| | | Hard coating layer | | | | | | | | |
|---|---|---|---|---|---|---|---|---|---|---|
| | | TiAlMe complex nitride layer $(Ti_{1-\alpha-\beta}Al_\alpha Me_\beta)(C_\gamma N1_{-\gamma})$ | | | | | | | | |
| Type | | Frequency distribution ratio $N_{avg}$ present in range of 0 to 12 degrees of inclined angle of normal line of {100} plane in region on surface side | Inclined angle section showing highest peak in region on surface side (degree) | Area ratio of cubic crystal (%) | Average crystal grain width W of cubic crystal grains (µm) | Average aspect ratio A of cubic crystal grains | Target layer thickness (µm) | Upper layer (numerical value at the bottom indicates target average layer thickness (µm) of layer) | | | |
| | | | | | | | | First layer | Second layer | Third layer | Fourth layer |
| Present invention coated tool | 46 | 38 | 11.0-11.25 | 91 | 0.9 | 8.7 | 12 | — | — | — | — |
| | 47 | 54 | 3.25-3.5 | 75 | 1.4 | 5.6 | 18 | — | — | — | — |
| | 48 | 34 | 11.0-11.25 | 96 | 0.3 | 5.9 | 20 | — | — | — | — |
| | 49 | 52 | 4.0-4.25 | 100 | 0.1 | 15.3 | 14 | — | — | — | — |
| | 50 | 41 | 9.25-9.5 | 67 | 0.06 | 22.5 | 13 | — | — | — | — |
| | 51 | 37 | 8.0-8.25 | 100 | 0.6 | 10.5 | 8 | — | — | — | — |
| | 52 | 50 | 4.75-5.0 | 70 | 1.5 | 5.3 | 10 | TiN (0.5) | — | — | — |
| | 53 | 45 | 6.5-6.75 | 63 | 0.2 | 11.9 | 9 | TiN (0.3) | TiCN (0.4) | TiN (0.3) | — |
| | 54 | 48 | 5.75-6.0 | 92 | 1.8 | 0.5 | 6 | TiCNO (0.3) | Al₂O₃ (5) | — | — |
| | 55 | 61 | 1.5-1.75 | 99 | 0.4 | 12.7 | 7 | TiCN (0.5) | Al₂O₃ (4) | — | — |
| | 56 | 35 | 11.75-12.0 | 84 | 1.2 | 7.1 | 9 | TiCO (0.5) | Al₂O₃ (3) | — | — |

TABLE 28-continued

| | | | | | | | | | | |
|---|---|---|---|---|---|---|---|---|---|---|
| 57 | 41 | 6.5-6.75 | 87 | 0.7 | 7.7 | 10 | TiCNO (0.3) | Al$_2$O$_3$ (4) | — | — |
| 58 | 46 | 7.0-7.25 | 69 | 1.0 | 6.6 | 8 | TiN (0.3) | TiCN (0.5) | TiCNO (0.3) | Al$_2$O$_3$ (5) |
| 59 | 40 | 7.75-8.0 | 81 | 2.3 | 1.8 | 15 | — | — | — | — |
| 60 | 55 | 2.5-2.75 | 65 | 0.7 | 14.0 | 12 | — | — | — | — |

TABLE 29

| | | | Hard coating layer | | | | | |
|---|---|---|---|---|---|---|---|---|
| | | | TiAlMe complex nitride layer (Ti$_{1-\alpha-\beta}$Al$_\alpha$Me$_\beta$)(C$_\gamma$N1$_{-\gamma}$) | | | | | |
| Type | Tool body symbol | TiAlMeCN film-forming process formation symbol (see Tables 19 and 20) | Average content ratio $\alpha_{avg}$ of Al | Average content ratio $\beta_{avg}$ of Me | Sum of average content ratios of Al and Me $\alpha_{avg} + \beta_{avg}$ | Average content ratio $\gamma_{avg}$ of C | Area ratio of crystal grain having average crystal grain misorientation equal to or greater than 2 degrees (%) | Frequency distribution ratio M$_{deg}$ present in range of 0 to 12 degrees of inclined angle of normal line of {100} plane in region on tool body side |
| Comparative coated tool | 46 ε | Si-a | 0.97 | 0.023 | 0.993 | Equal to or smaller than 0.0001 | — | — |
| | 47 ι | Si-b | 0.60 | 0.097 | 0.697 | 0.0058 | 6 | 56 |
| | 48 η | Si-c | 0.89 | 0.105 | 0.995 | Equal to or smaller than 0.0001 | — | — |
| | 49 ο | Zr-a | 0.95 | 0.047 | 0.997 | Equal to or smaller than 0.0001 | — | — |
| | 50 ε | Zr-b | 0.54 | 0.063 | 0.603 | Equal to or smaller than 0.0001 | 3 | 65 |
| | 51 ι | Zr-c | 0.77 | 0.058 | 0.828 | 0.0011 | 5 | 29 |
| | 52 η | B-a | 0.52 | 0.063 | 0.583 | Equal to or smaller than 0.0001 | 0 | 48 |
| | 53 θ | B-b | 0.84 | 0.128 | 0.968 | Equal to or smaller than 0.0001 | 1 | 20 |
| | 54 ε | B-c | 0.78 | 0.086 | 0.866 | Equal to or smaller than 0.0001 | 0 | 36 |
| | 55 ι | V-a | 0.53 | 0.044 | 0.574 | Equal to or smaller than 0.0001 | 2 | 10 |
| | 56 η | V-b | 0.76 | 0.002 | 0.762 | Equal to or smaller than 0.0001 | 3 | 49 |
| | 57 ο | V-c | 0.83 | 0.048 | 0.878 | 0.0115 | 0 | 44 |
| | 58 ε | Cr-a | 0.98 | 0.018 | 0.998 | Equal to or smaller than 0.0001 | — | — |
| | 59 ι | Cr-b | 0.61 | 0.004 | 0.614 | Equal to or smaller than 0.0001 | 2 | 33 |
| | 60 η | Cr-c | 0.96 | 0.039 | 0.999 | 0.0043 | — | — |

| | | Hard coating layer | | | | | | | | |
|---|---|---|---|---|---|---|---|---|---|---|
| | | TiAlMe complex nitride layer (Ti$_{1-\alpha-\beta}$Al$_\alpha$Me$_\beta$)(C$_\gamma$N1$_{-\gamma}$) | | | | | | | | |
| Type | | Frequency distribution ratio N$_{deg}$ present in range of 0 to 12 degrees of inclined angle of normal line of {100} plane in region on surface side | Inclined angle section showing highest peak in region on surface side (degree) | Area ratio of cubic crystal (%) | Average crystal grain width W of cubic crystal grains (μm) | Average aspect ratio A of cubic crystal grains | Target layer thickness (μm) | Upper layer (numerical value at the bottom indicates target average layer thickness (μm) of layer) | | |
| | | | | | | | | First layer | Second layer | Third layer | Fourth layer |
| Comparative coated tool | 46 | — | — | 0 | — | — | 12 | — | — | — | — |
| | 47 | 60 | 1.75-2.0 | 85 | 1.6 | 4.8 | 18 | — | — | — | — |
| | 48 | | | 0 | | | 21 | — | — | — | — |
| | 49 | | | 0 | | | 14 | — | — | — | — |

TABLE 29-continued

| | | | | | | | | | | |
|---|---|---|---|---|---|---|---|---|---|---|
| 50 | 67 | 1.0-1.25 | 100 | 0.4 | 9.7 | 13 | — | — | — | — |
| 51 | 37 | 10.5-10.75 | 69 | 1.1 | 1.9 | 8 | — | — | — | — |
| 52 | 49 | 3.75-4.0 | 100 | 0.03 | 39.2 | 10 | TiN (0.7) | — | — | — |
| 53 | 22 | 17.25-17.5 | 19 | 0.2 | 1.0 | 9 | TiCN (0.4) | TiN (0.3) | — | — |
| 54 | 36 | 10.5-10.75 | 59 | 0.8 | 3.9 | 6 | TiCNO (0.3) | Al$_2$O$_3$ (4) | — | — |
| 55 | 13 | 36.5-36.75 | 100 | 1.9 | 4.1 | 7 | TiCN (0.5) | Al$_2$O$_3$ (5) | — | — |
| 56 | 50 | 5.75-6.0 | 100 | 0.9 | 5.6 | 9 | TiCO (0.5) | Al$_2$O$_3$ (2) | — | — |
| 57 | 44 | 9.25-9.5 | 75 | 2.1 | 0.4 | 10 | TiCNO (0.3) | Al$_2$O$_3$ (3) | — | — |
| 58 | | | 0 | | | 8 | TiN (0.3) | TiCN (0.5) | TiCNO (0.3) | Al$_2$O$_3$ (5) |
| 59 | 35 | 14.5-14.75 | 84 | 0.4 | 10.4 | 15 | — | — | — | — |
| 60 | | | 0 | | | 12 | — | — | — | — |

(Note 1)
In the comparative coated tools 46, 48, 49, 58, and 60, only hexagonal crystals are observed and cubic crystals are not observed.

Next, in a state in which each of the various coated tools was screwed to a tip end portion of an insert holder of tool steel by a fixing tool, the present invention coated tools 46 to 60 and the comparative coated tools 46 to 60 were subjected to a dry high-speed intermittent cutting test for carbon steel and a wet high-speed intermittent cutting test for cast iron, which are described below, and a wear width of a flank face of a cutting edge was measured.

Cutting conditions 1:
Work material: a round bar of JIS S15C with four longitudinal grooves formed at equal intervals in the longitudinal direction
Cutting speed: 440 m/min
Depth of cut: 1.5 mm
Feed rate: 0.2 mm/rev
Cutting time: 5 minutes
(a typical cutting speed is 220 m/min)
Cutting conditions 2:
Work material: a round bar of JIS FCD450 with four longitudinal grooves
formed at equal intervals in the longitudinal direction
Cutting speed: 420 m/min
Depth of cut: 1.0 mm
Feed rate: 0.2 mm/rev
Cutting time: 5 minutes
(a typical cutting speed is 250 m/min)
The results of the cutting test are shown in Table 30.

TABLE 30

| | | Wear width of a flank face (mm) | | | | Cutting test results (min) | |
|---|---|---|---|---|---|---|---|
| Type | | Cutting conditions 1 | Cutting conditions 2 | Type | | Cutting conditions 1 | Cutting conditions 2 |
| Present invention coated tool | 46 | 0.14 | 0.13 | Comparative coated tool | 46 | 1.3* | 1.2* |
| | 47 | 0.12 | 0.11 | | 47 | 2.7* | 2.8* |
| | 48 | 0.13 | 0.13 | | 48 | 1.2* | 1.5* |
| | 49 | 0.16 | 0.17 | | 49 | 1.6* | 1.4* |
| | 50 | 0.15 | 0.16 | | 50 | 3.2* | 3.1* |
| | 51 | 0.17 | 0.16 | | 51 | 3.6* | 3.8* |
| | 52 | 0.08 | 0.07 | | 52 | 3.2* | 3.5* |
| | 53 | 0.11 | 0.10 | | 53 | 2.2* | 2.0* |
| | 54 | 0.10 | 0.09 | | 54 | 4.6* | 4.8* |
| | 55 | 0.06 | 0.07 | | 55 | 4.0* | 4.2* |
| | 56 | 0.07 | 0.06 | | 56 | 4.4* | 4.7* |
| | 57 | 0.09 | 0.08 | | 57 | 2.5* | 2.3* |
| | 58 | 0.12 | 0.11 | | 58 | 1.4* | 1.1* |
| | 59 | 0.13 | 0.13 | | 59 | 3.0* | 2.7* |
| | 60 | 0.14 | 0.14 | | 60 | 1.3* | 1.6* |

Mark * in boxes of comparative coated tools indicates a cutting time (min) until the end of a service life caused by the occurrence of chipping.

From the results shown in Tables 24 and 30, regarding the coated tools of the invention, the predetermined average crystal grain misorientation is present in the crystal rains having a cubic structure configuring the layer of a complex nitride or complex carbonitride of Al, Ti, and Me configuring the hard coating layer, and the ratio of {100} orientation on the surface side is increased to be higher than that on the tool body side. Accordingly, hardness is improved due to the strain of the crystal grain, and toughness is improved while maintaining high wear resistance. In addition, it is clear that, even in a case of being used for high-speed intermittent cutting during which intermittent and impact loads are exerted on a cutting edge, excellent chipping resistance and fracture resistance are exhibited, resulting in exhibiting excellent wear resistance for long-term usage.

Contrary to this, it is apparent that, regarding the comparative coated tools 31 to 45 and 46 to 60 in which the predetermined average crystal grain misorientation is not present in the crystal grains having a cubic structure configuring the layer of a complex nitride or complex carbonitride of Al, Ti, and Me configuring the hard coating layer, in a case of being used for high-speed intermittent cutting during which high-temperature heat is generated and intermittent and impact loads are exerted on a cutting edge, end of the service life occurs within a short cycle of time due to occurrence of chipping, fracture, and the like.

INDUSTRIAL APPLICABILITY

As described above, the coated tool of the present invention can be used as a coated tool for various work materials as well as for high-speed intermittent cutting of alloy steel and further exhibits excellent chipping resistance and wear resistance for long-term usage, thereby sufficiently satisfying an improvement in performance of a cutting device, power saving and energy saving during cutting, and a further reduction in costs.

REFERENCE SIGNS LIST

1: Tool body
2: Hard coating layer
3: Layer of complex nitride or complex carbonitride
P: Measurement Point (Pixel)
B: Boundary

The invention claimed is:

1. A surface-coated cutting tool comprising:
a hard coating layer; and
a tool body made of any of tungsten carbide-based cemented carbide, titanium carbonitride-based cermet, and a cubic boron nitride-based ultra-high pressure sintered body, wherein
the hard coating layer is formed on a surface of the tool body,
(a) the hard coating layer includes at least a layer of a complex nitride or complex carbonitride of Cr and Al, or a layer of a complex nitride or complex carbonitride of Ti, Al, and Me (here, Me is one kind of element selected from Si, Zr, B, V, and Cr), having an average layer thickness of 2 to 20 μm,
(b) the layer of a complex nitride or complex carbonitride includes at least a phase of a complex nitride or complex carbonitride having an NaCl type face-centered cubic structure, and
(c) in a case where crystal orientation of each crystal grain having an NaCl type face-centered cubic structure among crystal grains configuring the layer of a complex nitride or complex carbonitride is analyzed in a vertical cross-sectional direction by using an electron beam backward scattering diffraction device, and an average crystal grain misorientation of the individual crystal grains is acquired, 20% or more crystal grain having the average crystal grain misorientation equal to or greater than 2 degrees is present with respect to the entire area of the layer of a complex nitride or complex carbonitride at an area ratio,
(d) in a case where inclined angles formed by a normal line of a {100} plane as a crystal plane with respect to a normal line direction of the surface of the tool body of the crystal grain are respectively measured in a region on the tool body side and a region on the surface side which are obtained by dividing the layer of a complex nitride or complex carbonitride in half in a layer thickness direction, the measured inclined angles in a range of 0 to 45 degrees with respect to the normal line direction among the measured inclined angles are sectioned at a pitch of 0.25 degrees, and frequencies present in each section are added up,
in a case where a ratio of the sum of frequencies present in a range of 0 to 12 degrees in the region on the tool body side with respect to over all frequency in the inclined angle frequency distribution is set as $M_{deg}$, $M_{deg}$ is 10% to 40%, and
in a case where the highest peak is present in the inclined angle section in a range of 0 to 12 degrees in the region on the surface side, and a ratio of the sum of frequencies present in the range of 0 to 12 degrees with respect to over all frequency in the inclined angle frequency distribution is set as $N_{deg}$, $N_{deg}$ is $M_{deg}$+10% to $M_{deg}$+30%.

2. The surface-coated cutting tool according to claim 1, wherein, in a case where the layer of a complex nitride or complex carbonitride is a layer of a complex nitride or complex carbonitride of Cr and Al, and a composition of the layer is expressed by a composition formula: $(Cr_{1-x}Al_x)(C_yN_{1-y})$, an average content ratio $x_{avg}$ of Al of the layer of a complex nitride or complex carbonitride in the total amount of Cr and Al and an average content ratio $y_{avg}$ of C in the total amount of C and N (both $x_{avg}$ and $y_{avg}$ are atomic ratios) respectively satisfy $0.70 \leq x_{avg} \leq 0.95$ and $0 \leq y_{avg} \leq 0.005$.

3. The surface-coated cutting tool according to claim 1, wherein, in a case where the layer of a complex nitride or complex carbonitride is a layer of a complex nitride or complex carbonitride of Ti, Al, and Me (here, Me is one kind of element selected from Si, Zr, B, V, and Cr), and a composition of the layer is expressed by a composition formula: $(Ti_{1-\alpha-\beta}Al_\alpha Me_\beta)(C_\gamma N_{1-\gamma})$, an average content ratio $\alpha_{avg}$ of Al of the layer of a complex nitride or complex carbonitride in the total amount of Ti, Al, and Me, an average content ratio $\beta_{avg}$ of Me in the total amount of Ti, Al, and Me, and an average content ratio $\gamma_{avg}$ of C in the total amount of C and N ($\alpha_{avg}$, $\beta_{avg}$, and $\gamma_{avg}$ are all atomic ratios) respectively satisfy $0.60 \leq \alpha_{avg}$, $0.005 \leq \beta_{avg} \leq 0.10$, $0 \leq \gamma_{avg} \leq 0.005$, and $0.605 \leq \alpha_{avg}+\beta_{avg} \leq 0.95$.

4. The surface-coated cutting tool according to claim 1, wherein the layer of a complex nitride or complex carbonitride includes at least 70 area % or more of a phase of a complex nitride or complex carbonitride having an NaCl type face-centered cubic structure.

5. The surface-coated cutting tool according to claim 1, wherein, in a case where the layer of a complex nitride or complex carbonitride is observed in a vertical cross-sectional direction of the layer, the layer has a columnar structure in which an average crystal grain width W of each crystal grain having an NaCl type face-centered cubic structure in the layer of a complex nitride or complex carbonitride is 0.1 to 2 μm, and an average aspect ratio A is 2 to 10.

6. The surface-coated cutting tool according to claim 1, wherein, between the tool body and the layer of a complex nitride or complex carbonitride, a lower layer which is formed of a Ti compound layer that includes one layer or more layers of a Ti carbide layer, a Ti nitride layer, a Ti carbonitride layer, a Ti oxycarbide layer, and a Ti oxycarbonitride layer, and has an average total layer thickness of 0.1 to 20 μm is present.

7. The surface-coated cutting tool according to claim 1, wherein an upper layer which includes at least an aluminum oxide layer and has an average total layer thickness of 1 to 25 μm is formed on an upper portion of the layer of a complex nitride or complex carbonitride.

8. A method for manufacturing the surface-coated cutting tool according to claim 1, wherein the layer of a complex nitride or complex carbonitride is deposited by a chemical vapor deposition method including at least trimethylaluminum as a reaction gas component.

* * * * *